United States Patent [19]
Sharma

[11] Patent Number: 5,887,006
[45] Date of Patent: Mar. 23, 1999

[54] METHODS AND APPARATUS FOR ERROR CORRECTION

[75] Inventor: Alok Sharma, Mountain View, Calif.

[73] Assignee: Integrated Device Technology, Inc., Santa Clara, Calif.

[21] Appl. No.: 883,533

[22] Filed: Jun. 26, 1997

[51] Int. Cl.$^6$ .................................................. H03M 13/00
[52] U.S. Cl. .................................. 371/37.11; 364/725.01; 364/746.1
[58] Field of Search .................... 371/37.11; 364/725.01, 364/746.1

[56] References Cited

U.S. PATENT DOCUMENTS

| | | | |
|---|---|---|---|
| 4,868,828 | 9/1989 | Shao et al. | 371/5.1 |
| 5,323,402 | 6/1994 | Vaccaro et al. | 371/37.1 |

OTHER PUBLICATIONS

Shao et al., "A VLSI Design of a Pipeline Reed–Solomon Decoder", IEEE Transactions on Computers, vol. C–34, No. 5, May 1985, pp. 393–403.

*Primary Examiner*—Stephen M. Baker
*Attorney, Agent, or Firm*—Wilson, Sonsini, Goodrich & Rosati

[57] ABSTRACT

An error correction decoder which includes a syndrome calculator, an error locator polynomial calculator, a standard error locator polynomial calculator, an error transform calculator and an inverse error transform calculator. These error correction decoder calculators provide a pipelined architecture for performing Reed-Solomon error correction calculations quickly. The error transform calculator includes a plurality of error transform processing circuits. The error transform calculator uses multiplexors to provide an adaptive input mechanism that adapts to receive known error transforms in an appropriate one of the error transform processing circuits. The multiplexors are used to form appropriate shift and feedback paths that are adapted to calculate unknown error transforms from the received known error transforms. The calculations are performed using multipliers and adders. Memory elements that store coefficients of a standard error locator polynomial are also used. An AND gate path is formed by coupling a plurality of AND gates in series. The AND gate path is used to provide simple and efficient control of the error transform calculator using coefficients of the standard error locator polynomial. An adaptive trigger circuit is provided to coordinate triggering of the inverse error transform calculator with the particular configuration used by the error transform calculator to perform calculations.

34 Claims, 33 Drawing Sheets

Error Transform Calculator

R-Q Degree Calculator

Standard Error-Locator Polynomial Calculator

Error Transform Calculator

| Power of α | Normal Basis 0 bit → 7 bit | Dual Basis 0 bit → 7 bit | Power of α | Normal Basis 0 bit → 7 bit | Dual Basis 0 bit → 7 bit |
|---|---|---|---|---|---|
| 0 | 10000000 | 00000100 | 58 | 10010110 | 10110101 |
| 1 | 01000000 | 00001000 | 59 | 01001011 | 01101011 |
| 2 | 00100000 | 00010001 | 60 | 10011101 | 11010110 |
| 3 | 00010000 | 00100011 | 61 | 11110110 | 10101100 |
| 4 | 00001000 | 01000111 | 62 | 01111011 | 01011001 |
| 5 | 00000100 | 10001110 | 63 | 10000101 | 10110010 |
| 6 | 00000010 | 00011100 | 64 | 11111010 | 01100101 |
| 7 | 00000001 | 00111000 | 65 | 01111101 | 11001011 |
| 8 | 10111000 | 01110001 | 66 | 10000110 | 10010110 |
| 9 | 01011100 | 11100010 | 67 | 01000011 | 00101100 |
| 10 | 00101110 | 11000100 | 68 | 10011001 | 01011000 |
| 11 | 00010111 | 10001001 | 69 | 11110100 | 10110000 |
| 12 | 10110011 | 00010010 | 70 | 01111010 | 01100001 |
| 13 | 11100001 | 00100101 | 71 | 00111101 | 11000011 |
| 14 | 11001000 | 01001011 | 72 | 10100110 | 10000111 |
| 15 | 01100100 | 10010111 | 73 | 01010011 | 00001111 |
| 16 | 00110010 | 00101110 | 74 | 10010001 | 00011111 |
| 17 | 00011001 | 01011100 | 75 | 11110000 | 00111110 |
| 18 | 10110100 | 10111000 | 76 | 01111000 | 01111101 |
| 19 | 01011010 | 01110000 | 77 | 00111100 | 11111011 |
| 20 | 00101101 | 11100000 | 78 | 00011110 | 11110110 |
| 21 | 10101110 | 11000000 | 79 | 00001111 | 11101101 |
| 22 | 01010111 | 10000000 | 80 | 10111111 | 11011011 |
| 23 | 10010011 | 00000011 | 81 | 11100111 | 10110111 |
| 24 | 11110001 | 00000110 | 82 | 11001011 | 01101111 |
| 25 | 11000000 | 00001100 | 83 | 11011101 | 11011110 |
| 26 | 01100000 | 00011001 | 84 | 11010110 | 10111101 |
| 27 | 00110000 | 00110010 | 85 | 01101011 | 01111010 |
| 28 | 00011000 | 01100100 | 86 | 10001101 | 11110101 |
| 29 | 00001100 | 11001001 | 87 | 11111110 | 11101011 |
| 30 | 00000110 | 10010010 | 88 | 01111111 | 11010111 |
| 31 | 00000011 | 00100100 | 89 | 10000111 | 10101110 |
| 32 | 10111001 | 01001001 | 90 | 11111011 | 01011101 |
| 33 | 11100100 | 10010011 | 91 | 11000101 | 10111010 |
| 34 | 01110010 | 00100110 | 92 | 11011010 | 01110100 |
| 35 | 00111001 | 01001101 | 93 | 01101101 | 11101000 |
| 36 | 10100110 | 10011011 | 94 | 10001101 | 11010001 |
| 37 | 01010010 | 00110110 | 95 | 01000111 | 10100010 |
| 38 | 00101001 | 01101110 | 96 | 10011011 | 01000100 |
| 39 | 10101100 | 11011100 | 97 | 11110101 | 10001000 |
| 40 | 01010110 | 10111001 | 98 | 11000010 | 00010000 |
| 41 | 00101011 | 01110010 | 99 | 01100001 | 00100001 |
| 42 | 10101101 | 11100100 | 100 | 10001000 | 01000011 |
| 43 | 11101110 | 11001000 | 101 | 01000100 | 10000110 |
| 44 | 01110111 | 10010000 | 102 | 00100010 | 00001101 |
| 45 | 10000011 | 00100000 | 103 | 00010001 | 00011011 |
| 46 | 11111001 | 01000001 | 104 | 10110000 | 00110110 |
| 47 | 11000100 | 10000010 | 105 | 01011000 | 01101100 |
| 48 | 01100010 | 00000101 | 106 | 00101100 | 11011000 |
| 49 | 00110001 | 00001010 | 107 | 00010110 | 10110001 |
| 50 | 10100000 | 00010101 | 108 | 00001011 | 01100011 |
| 51 | 01010000 | 00101011 | 109 | 10111101 | 11000111 |
| 52 | 00101000 | 01010110 | 110 | 11100110 | 10001111 |
| 53 | 00010100 | 10101101 | 111 | 01110011 | 00011110 |
| 54 | 00001010 | 01011011 | 112 | 10000001 | 00111100 |
| 55 | 00000101 | 10110110 | 113 | 11111000 | 01111001 |
| 56 | 10111010 | 01101101 | 114 | 01111100 | 11110011 |
| 57 | 01011101 | 11011010 | 115 | 00111110 | 11100111 |
|  |  |  | 116 | 00011111 | 11001110 |
|  |  |  | 117 | 10110111 | 10011100 |
|  |  |  | 118 | 11100011 | 00111001 |

FIG. 15A

| Power of α | Normal Basis 0 bit → 7 bit | Dual Basis 0 bit → 7 bit | | Power of α | Normal Basis 0 bit → 7 bit | Dual Basis 0 bit → 7 bit |
|---|---|---|---|---|---|---|
| 119 | 11001001 | 01110011 | | 191 | 10000010 | 00011000 |
| 120 | 11011100 | 11100110 | | 192 | 01000001 | 00110000 |
| 121 | 01101110 | 11001100 | | 193 | 10011000 | 01100000 |
| 122 | 00110111 | 10011000 | | 194 | 01001100 | 11000001 |
| 123 | 10100011 | 00110001 | | 195 | 00100110 | 10000011 |
| 124 | 11101001 | 01100010 | | 196 | 00010011 | 00000111 |
| 125 | 11001100 | 11000101 | | 197 | 10110001 | 00001110 |
| 126 | 01100110 | 10001011 | | 198 | 11100000 | 00011101 |
| 127 | 00110011 | 00010110 | | 199 | 01110000 | 00111010 |
| 128 | 10100001 | 00101101 | | 200 | 00111000 | 01110100 |
| 129 | 11101000 | 01011010 | | 201 | 00011100 | 11101010 |
| 130 | 01110100 | 10110100 | | 202 | 00001110 | 11010101 |
| 131 | 00111010 | 01101001 | | 203 | 00000111 | 10101010 |
| 132 | 00011101 | 11010010 | | 204 | 10111101 | 01010101 |
| 133 | 10110110 | 10100100 | | 205 | 11100101 | 10101011 |
| 134 | 01011011 | 01001000 | | 206 | 11001010 | 01010111 |
| 135 | 10010101 | 10010001 | | 207 | 01100101 | 10101111 |
| 136 | 11110010 | 00100010 | | 208 | 10000011 | 01011111 |
| 137 | 01111001 | 01000101 | | 209 | 01000001 | 10111110 |
| 138 | 10000100 | 10001010 | | 210 | 10011010 | 01111100 |
| 139 | 01000010 | 00010100 | | 211 | 01001101 | 11111001 |
| 140 | 00100001 | 00101001 | | 212 | 10011110 | 11110010 |
| 141 | 10101000 | 01010010 | | 213 | 01001111 | 11100101 |
| 142 | 01010100 | 10100101 | | 214 | 10011101 | 11001011 |
| 143 | 00101010 | 01001010 | | 215 | 11110111 | 10010100 |
| 144 | 00010101 | 10010101 | | 216 | 11000011 | 00101000 |
| 145 | 10110010 | 00101010 | | 217 | 11011001 | 01010000 |
| 146 | 01011001 | 01010100 | | 218 | 11010100 | 10100001 |
| 147 | 10010100 | 10101001 | | 219 | 01101010 | 01000010 |
| 148 | 01001010 | 01010011 | | 220 | 00110101 | 10000100 |
| 149 | 00100101 | 10100111 | | 221 | 10100010 | 00001001 |
| 150 | 10101010 | 01001110 | | 222 | 01010001 | 00010011 |
| 151 | 01010101 | 10011101 | | 223 | 10101000 | 00100111 |
| 152 | 10010010 | 00111011 | | 224 | 01001000 | 01001111 |
| 153 | 01001001 | 01110111 | | 225 | 00100100 | 10011111 |
| 154 | 10011100 | 11101110 | | 226 | 00010010 | 00111111 |
| 155 | 01001110 | 11011101 | | 227 | 00001001 | 01111111 |
| 156 | 00100111 | 10111011 | | 228 | 10111100 | 11111111 |
| 157 | 10101011 | 01110110 | | 229 | 01011110 | 11111110 |
| 158 | 11101101 | 11101100 | | 230 | 00101111 | 11111100 |
| 159 | 11001110 | 11011001 | | 231 | 10101111 | 11111000 |
| 160 | 01100111 | 10110011 | | 232 | 11101111 | 11110000 |
| 161 | 10001011 | 01100111 | | 233 | 11001111 | 11100001 |
| 162 | 11111101 | 11001111 | | 234 | 11011111 | 11000010 |
| 163 | 11000110 | 10011110 | | 235 | 11010111 | 10000101 |
| 164 | 01100011 | 00111101 | | 236 | 11010011 | 00001011 |
| 165 | 10001001 | 01111011 | | 237 | 11010001 | 00010111 |
| 166 | 11111110 | 11110110 | | 238 | 11010000 | 00101111 |
| 167 | 01111111 | 11101101 | | 239 | 01101000 | 01011110 |
| 168 | 00111111 | 11011011 | | 240 | 00110100 | 10111100 |
| 169 | 10100111 | 10111111 | | 241 | 00011010 | 01111000 |
| 170 | 11101011 | 01111110 | | 242 | 00001101 | 11110001 |
| 171 | 11001101 | 11111101 | | 243 | 10111111 | 11100011 |
| 172 | 11011110 | 11111010 | | 244 | 01011111 | 11000110 |
| 173 | 01101111 | 11110100 | | 245 | 10010111 | 10001101 |
| 174 | 10001111 | 11101001 | | 246 | 11110011 | 00011010 |
| 175 | 11111111 | 11010011 | | 247 | 11000001 | 00110100 |
| 176 | 11000111 | 10100111 | | 248 | 11011100 | 01101000 |
| 177 | 11011011 | 01001100 | | 249 | 01101100 | 11010001 |
| 178 | 11010101 | 10011001 | | 250 | 00110110 | 10100000 |
| 179 | 11010010 | 00110011 | | 251 | 00011011 | 01000000 |
| 180 | 01101001 | 01100110 | | 252 | 10110101 | 10000000 |
| 181 | 10001100 | 11001101 | | 253 | 11101100 | 00000001 |
| 182 | 01000110 | 10011010 | | 254 | 01110001 | 00000010 |
| 183 | 00100011 | 00110101 | | 255 | 10000000 | 00000100 |
| 184 | 10101001 | 01101010 | | | | |
| 185 | 11010100 | 11010100 | | | | |
| 186 | 01110110 | 10101000 | | | | |
| 187 | 00111011 | 01010001 | | | | |
| 188 | 10100101 | 10100011 | | | | |
| 189 | 11101010 | 01000110 | | | | |
| 190 | 01110101 | 10001100 | | | | |

*FIG. 15B*

$$\text{Dual basis vector } 0 = \begin{bmatrix} Zd\ bit_0 \\ Zd\ bit_1 \\ \vdots \\ Zd\ bit_7 \end{bmatrix} \text{---} 1604_0$$

$$y = \alpha\ Zd \Big\} 1606$$

$$1608 \begin{cases} Ybit_0 = Tr(y\alpha^0) = Tr(\alpha Zd) = Zd\ bit_1 \\ Ybit_1 = Tr(y\alpha^1) = Tr(\alpha^2 Zd) = Zd\ bit_2 \\ Ybit^2 = Tr(y\alpha^3) = Tr(\alpha^4 Zd) = Zd\ bit_4 \\ \vdots \\ Ybit^7 = Tr(y\alpha^7) = Tr(\alpha^8 Zd) = Zd\ bit_8 \\ \qquad = Tr((\alpha^0 + \alpha^2 + \alpha^3 + \alpha^4)Zd) \\ \qquad = Zd\ bit_0 + Zd\ bit_2 + Zd\ bit_3 + Zd\ bit_4 \end{cases}$$

$$\text{Dual basis vector } 1 = \overset{1614_1}{\begin{bmatrix} Ybit_0 \\ Ybit_1 \\ \vdots \\ Ybit_8 \end{bmatrix}} = \overset{1616_1}{\begin{bmatrix} Zd\ bit_2 \\ Zd\ bit_3 \\ \vdots \\ Zd\ bit_8 \\ Zd\ bit_9 \end{bmatrix}} = \begin{bmatrix} Zd\ bit_1 \\ Zd\ bit_2 \\ \vdots \\ Zd\ bit_7 \\ Zd\ bit_0 + Zd\ bit_2 + Zd\ bit_3 + Zd\ bit_4 \end{bmatrix}$$

$$1610 \Big\{ y = \alpha^2 Zd$$

$$1604_1$$

$$1612 \begin{cases} Ybit_0 = Tr(y\alpha^0) = Tr(\alpha_2 Zd) = Zd\ bit_2 \\ Ybit_1 = Tr(y\alpha^1) = Tr(\alpha^3 Zd) = Zd\ bit_3 \\ Ybit_2 = Tr(y\alpha^2) = Tr(\alpha^4 Zd) = Zd\ bit_4 \\ \vdots \\ Ybit_6 = Tr(y\alpha^6) = Tr(\alpha^8 Zd) = Zd\ bit_8 = Zd\ bit_1 + Zd\ bit_2 + Zd\ bit_3 + Zd_4 \\ Ybit_7 = Tr(y\alpha^7) = Tr(\alpha^9 Zd) = Zd\ bit_9 \\ \qquad = Tr((\alpha^1 + \alpha^3 + \alpha^4 + \alpha^5)Zd) \\ \qquad = Zd\ bit_1 + Zd\ bit_3 + Zd\ bit_4 + Zd\ bit_5 \end{cases}$$

$$\text{Dual basis vector } 2 = \overset{1614_2}{\begin{bmatrix} Ybit_0 \\ Ybit_1 \\ \vdots \\ Ybit_7 \end{bmatrix}} = \overset{1616_2}{\begin{bmatrix} Zd\ bit_2 \\ Zd\ bit_3 \\ \vdots \\ Zd\ bit_8 \\ Zd\ bit_9 \end{bmatrix}} = \overset{1604_2}{\begin{bmatrix} Zd\ bit_2 \\ Zd\ bit_3 \\ \vdots \\ Zd\ bit_0 + Zd\ bit_2 + Zd\ bit_3 + Zd\ bit_4 \\ Zd\ bit_1 + Zd\ bit_3 + Zd\ bit_4 + Zd\ bit_5 \end{bmatrix}}$$

*FIG. 16A*

$$\text{Dual basis} \atop \text{vector 3} = \begin{bmatrix} Zd\ bit_3 \\ Zd\ bit_4 \\ \vdots \\ Zd\ bit_9 \\ Zd\ bit_{10} \end{bmatrix} = \begin{bmatrix} Zd\ bit_3 \\ Zd\ bit_4 \\ \vdots \\ Zd\ bit_1 + Zd\ bit_3 + Zd\ bit_4 + Zd\ bit_5 \\ Zd\ bit_2 + Zd\ bit_4 + Zd\ bit_5 + Zd\ bit_6 \end{bmatrix} \ 1604_3$$

$$\text{Dual basis} \atop \text{vector 4} = \begin{bmatrix} Zd\ bit_4 \\ Zd\ bit_5 \\ \vdots \\ Zd\ bit_{10} \\ Zd\ bit_{11} \end{bmatrix} = \begin{bmatrix} Zd\ bit_4 \\ Zd\ bit_5 \\ \vdots \\ Zd\ bit_2 + Zd\ bit_4 + Zd\ bit_5 + Zd\ bit_6 \\ Zd\ bit_3 + Zd\ bit_5 + Zd\ bit_6 + Zd\ bit_7 \end{bmatrix} \ 1604_5$$

$$\text{Dual basis} \atop \text{vector 5} = \begin{bmatrix} Zd\ bit_5 \\ Zd\ bit_6 \\ \vdots \\ Zd\ bit_{11} \\ Zd\ bit_{12} \end{bmatrix} = \begin{bmatrix} Zd\ bit_5 \\ Zd\ bit_6 \\ \vdots \\ Zd\ bit_3 + Zd\ bit_5 + Zd\ bit_6 + Zd\ bit_7 \\ Zd\ bit_0 + Zd\ bit_2 + Zd\ bit_3 + Zd\ bit_6 + Zd\ bit_7 \end{bmatrix} \ 1604_4$$

$$\text{Dual basis} \atop \text{vector 6} = \begin{bmatrix} Zd\ bit_6 \\ Zd\ bit_7 \\ \vdots \\ Zd\ bit_{12} \\ Zd\ bit_{13} \end{bmatrix} = \begin{bmatrix} Zd\ bit_6 \\ Zd\ bit_7 \\ \vdots \\ Zd\ bit_0 + Zd\ bit_2 + Zd\ bit_3 + Zd\ bit_6 + Zd\ bit_7 \\ Zd\ bit_0 + Zd\ bit_1 + Zd\ bit_2 + Zd\ bit_7 \end{bmatrix} \ 1604_6$$

$$\text{Dual basis} \atop \text{vector 7} = \begin{bmatrix} Zd\ bit_7 \\ Zd\ bit_8 \\ \vdots \\ Zd\ bit_{13} \\ Zd\ bit_{14} \end{bmatrix} = \begin{bmatrix} Zd\ bit_7 \\ Zd\ bit_0 + Zd\ bit_2 + Zd\ bit_3 + Zd\ bit_4 \\ \vdots \\ Zd\ bit_0 + Zd\ bit_1 + Zd\ bit_2 + Zd\ bit_7 \\ Zd\ bit_0 + Zd\ bit_1 + Zd\ bit_4 \end{bmatrix} \ 1604_7$$

*FIG. 16B*

METHODS AND APPARATUS FOR ERROR CORRECTION

BACKGROUND OF THE INVENTION

1. Field of the Invention

The field of the invention relates generally to error correction and more particularly to a pipeline decoder that can be used to decode Reed-Solomon codes, for example.

2. Background

Today's digital systems, such as data transmission and storage systems, typically need to be efficient and reliable. As large, high speed data networks become more widely used and integral with day to day activities, individuals likely will depend more upon the efficient and reliable reproduction of the data that these networks transmit. To achieve such an efficient and reliable operation, digital systems typically use techniques for controlling errors and to ensure reliable data reproduction. Reed Solomon ("RS") codes have been used in digital systems to provide error control, including both error detection and error correction. Such systems have included, for example, space telecommunication systems, compact disc systems and digital telecommunication systems.

A Reed Solomon code consists of a set of code words. Each code word contains data and error correcting information. A code word is characterized by a total number of symbols N which include data symbols and parity symbols. Each symbol is m bits of binary data where m might be 8, for example. In a Reed Solomon code that uses m bit symbols, N is often chosen such that $N=2^m-1$. Of the total number of symbols N, K of the symbols are data symbols. Accordingly, N–K of the symbols are parity symbols. Reed Solomon codes are typically designed to detect or detect and correct a predetermined number of errors. A code designed to detect and correct up to t errors in each N symbol code word, for example, typically requires K=2t parity bits. Reed Solomon codes are commonly described as (N,K) Reed Solomon codes to communicate the values N and K of the particular code.

Reed Solomon codes work by encoding data according to certain predetermined rules to produce encoded data having a known format. The encoded data might then be transmitted to a receiver, for example. The data that is transmitted shall be referred to as the transmitted data. The receiver, knowing the predetermined rules and the known format, often can detect errors in the received data by comparing it to the known format. If any differences exist, an error has occurred. Using certain rules, the receiver often can correct errors detected in this manner. After such correction, the corrected data can then be converted back from its encoded format to obtain the original data. The process of detecting or detecting and correcting errors and converting the encoded data back to its original form is called decoding. See Lin, S. and Costello, D. Jr., *Error Control Coding; Fundamentals and Applications*, Prentice Hall (1983) for a discussion of Reed Solomon error correction and its related principles.

Numerous calculations can be required to perform the encoding and decoding processes associated with RS codes. In addition, these calculation often must be performed in real time. Accordingly, RS encoders and decoders often must meet certain minimum performance levels. With respect to RS decoders, efforts have been made to produce algorithms and/or techniques that enable the calculations to be performed quickly. Unfortunately, increasing the speed of RS decoders can also increase the cost.

For example, the speed of a decoder might be enhanced by using parallel architectures or large memory arrays. A parallel architecture may involve implementing the same functions in multiple areas of a chip. These multiple areas may be used, for example, when the same function, such as a calculation, needs to be performed repeatedly. Often, the repeated functions can be accomplished simultaneously in the multiple areas saving time. Unfortunately, implementing the same function in multiple areas typically requires more chip area than simply using a single chip area repeatedly to perform the single function. This latter approach, while possibly saving chip area, can result in delay because the one chip area typically will have to perform the function multiple times. A batch of data that is to be processed by the chip area may have to wait until the chip area is done performing the function on a previous batch of data. Additionally, such repeated use might require additional control circuitry to handle timing or feedback issues, for example, and as a result additional chip space. Such a design might also require additional clock cycles and possibly additional buffers to store interim calculations.

Memory arrays might be used by an RS decoder to store data or look up tables that might eliminate some of the needed calculations, for example. Memory arrays, however, can increase the amount of chip area used by a decoder, resulting in a more expensive decoder. The chip area required by an RS decoder might be reduced by avoiding such parallel architectures or memory arrays. Such a decoder might be less expensive, but it may not provide the desired speed.

Accordingly, there has been a need for a Reed-Solomon decoder that obtains the desired processing speed without unacceptably increasing the chip area used by or the cost of the decoder.

SUMMARY OF THE INVENTION

An aspect of the present invention provides an error transform calculator that has a pipelined structure for performing Reed Solomon error correction calculations quickly. Another aspect of the invention provides an error transform calculator cell that affords flexibility in designing an error transform calculator. In particular, an aspect of the invention provides an error transform calculator cell that can, but need not, be used in duplicate to construct error transform calculators for a wide variety of Reed Solomon codes that have varying numbers of data and parity bytes. An aspect of the present invention provides an error transform calculator cell that can be used to minimize the need for memory arrays and look-up tables. An aspect of the present invention provides an error transform calculator that efficiently uses the area of a semiconductor die. An aspect of the present invention provides an error transform calculator cell that can be used to minimize wait time associated with using a single area of a chip to perform repeated error correction calculations.

In an embodiment of the invention, an error transform calculator has a first mode of operation and a second mode of operation. In the first mode of operation, the error transform calculator receives known error transforms. In the second mode of operation, the error transform calculator uses a feedback path to calculate additional error transforms from known error transforms.

This error transform calculator embodiment includes a syndrome input for receiving syndromes, an error transform output and a plurality of error transform processing circuits. Each error transform processing circuit is coupled to the syndrome input and at least one of the error transform processing circuits is coupled to the error transform output. The error transform processing circuits are coupled together to form a series of error transform processing circuits and the error transform processing circuits together are adapted to produce error transforms using coefficients of a standard error locator polynomial.

Each error transform processing circuit in an embodiment of the invention includes a multiplexor that has a plurality of multiplexor inputs, a control input (e.g. which may comprise two inputs) and a multiplexor output. Each multiplexor is adapted to couple its multiplexor inputs to its multiplexor output. The control input of each multiplexor controls which of the multiplexor inputs the multiplexor couples to its multiplexor output. A first of the multiplexor inputs of each multiplexor is coupled to the syndrome input such that an input syndrome present at the syndrome input will be applied to the first multiplexor input of each of the multiplexors.

Each error transform processing circuit in an embodiment of the invention also includes an input memory element having an input. The input of the input memory element in each error transform processing circuit is coupled to the multiplexor output of the error transform processing circuit. Accordingly, each multiplexor is adapted to couple one of its inputs to the input memory element in the same error transform processing circuit.

In an embodiment of the invention, the error transform calculator includes a control circuit coupled to the control input of each multiplexor wherein the control circuit is adapted to change the error transform calculator between the first mode of operation and the second mode of operation. The control circuit is adapted to configure the plurality of multiplexors when the error transform calculator is in the first mode of operation such that in a selected one of the error transform processing circuits the first multiplexor input is coupled to the multiplexor output and such that in any error transform processing circuit succeeding the selected error transform processing circuit in the series of error transform processing circuits the first multiplexor input is isolated from the multiplexor output. The selected error transform processing circuit is selected with reference to a leading non-zero coefficient of the standard error locator polynomial. In an embodiment of the invention, the selection of the selected error transform calculator from among the plurality of error transform circuits is based upon the location of the leading non-zero coefficient of the standard error polynomial from among a plurality of coefficients of the standard error locator polynomial.

In an embodiment of the invention, the control circuit includes a shift control line coupled to the control input of each multiplexor. The shift control line is adapted to change the error transform calculator between the first mode of operation and the second mode of operation. In this embodiment, the control circuit also includes a plurality of AND gates coupled in series wherein each AND gate is also coupled to the control input of the multiplexor of one of the error transform processing circuits. The plurality of AND gate enable simple and efficient control of the error transform processing circuits.

In an embodiment of the invention the control circuit further includes a zero detector coupled to the AND gates wherein the zero detector is adapted to determine which coefficients of the standard error locator polynomial are zero and which coefficients of the standard error locator polynomial are non-zero. The zero detector is adapted to provide a zero detector signal to the AND gates in response to this determination.

In an embodiment of the invention, the error transform calculator includes an AND gate in addition to the plurality of AND gates that are coupled to the control input of one of the plurality of multiplexors. This additional AND gate is coupled to the plurality of AND gates as part of the control circuit.

In an embodiment of the invention, the error transform cells and/or the error transform processing circuits are coupled in series by coupling a second of the multiplexor inputs in each error transform processing circuit succeeding the first error transform processing circuit to an output of the input memory element of an immediately preceding error transform processing circuit. When the error transform calculator is in the first mode of operation, the control circuit is adapted to configure the multiplexors such that for any error transform processing circuit succeeding the selected error transform processing circuit the second multiplexor input is coupled to the multiplexor output. In an embodiment of the invention, the error transform cell uses a multiplier and an adder in each error transform processing circuit to provide a feedback path coupled to a third multiplexor input of the multiplexors. The multipliers and adders are used to calculate unknown error transforms from known error transforms. When the error transform calculator is in the second mode of operation, the multiplexor in the selected error transform processing circuit couples its third information input to its output and in any error transform processing circuit succeeding the selected error transform processing circuit, the multiplexor isolates its third information input from its output.

An alternate embodiment of the invention provides an error transform calculator having a first mode of operation and a second mode of operation, wherein the error transform calculator includes a syndrome input, an error transform output and a plurality of error transform processing circuits. In this embodiment, each error transform processing circuit includes a memory element, each error transform processing circuit is coupled to the syndrome input, and at least one of the error transform processing circuits is coupled to the error transform output. The error transform processing circuits are coupled in series such that the memory elements are adapted to form a shift path from the syndrome input to the error transform output. The error transform processing circuits together are adapted to produce error transforms using coefficients of a standard error locator polynomial.

In an embodiment of the invention, a control circuit is coupled to the error transform processing circuits wherein the control circuit is adapted to change the error transform calculator between the first mode of operation and the second mode of operation, wherein the control circuit is adapted to configure the error transform processing circuits when the error transform calculator is in the first mode of operation such that the shift path is formed from a selected one of the error transform processing circuits to the error transform output, such that the selected error transform processing circuit couples the syndrome input to the shift path, such that in any error transform processing circuit that precedes and in any error transform processing circuit that succeeds the selected error transform processing circuit the syndrome input is isolated from the shift path and wherein the selected error transform processing circuit is selected with reference to a leading non-zero coefficient of the standard error locator polynomial.

In an embodiment of the invention, a control line that is included in the control circuit is coupled to the error transform processing circuits. This control line is adapted to configure the error transform processing circuits to change the error transform calculator between the first mode of operation and the second mode of operation. In an embodiment of the invention, a novel AND gate circuit is included in the control circuit to accomplish the control of the error transform processing circuits and formation of the shift path. In an embodiment of the invention, when the error transform calculator is in the first mode of operation the control line is adapted to configure the selected error transform processing circuit to couple the syndrome input to the shift path and when the error transform calculator is in the second mode of operation the control line is adapted to configure the selected error transform processing circuit to couple a feedback input of the selected error transform processing circuit to the shift path.

BRIEF DESCRIPTION OF THE DRAWINGS

FIGS. 15A–15B illustrate a mapping between a normal basis and a dual basis of the Galois field GF($2^8$);

FIG. 16A the derivation of dual basis vectors used by an embodiment of the invention;

FIG. 16B illustrates additional dual basis vectors generated as described an illustrated with reference to FIG. 16A;

DETAILED DESCRIPTION

Embodiments of the invention provide a novel Reed Solomon decoder. The following description is presented to enable a person skilled in the art to make and use the invention. Descriptions of specific embodiments are provided only as examples. Various modifications to the described embodiments may be apparent to those skilled in the art, and the generic principles defined herein may be applied to other embodiments and applications without departing from the spirit and scope of the invention. Thus, the present invention is not intended to be limited to the described or illustrated embodiments, but is to be accorded the widest scope consistent with the principles and features disclosed herein.

Figure 1:
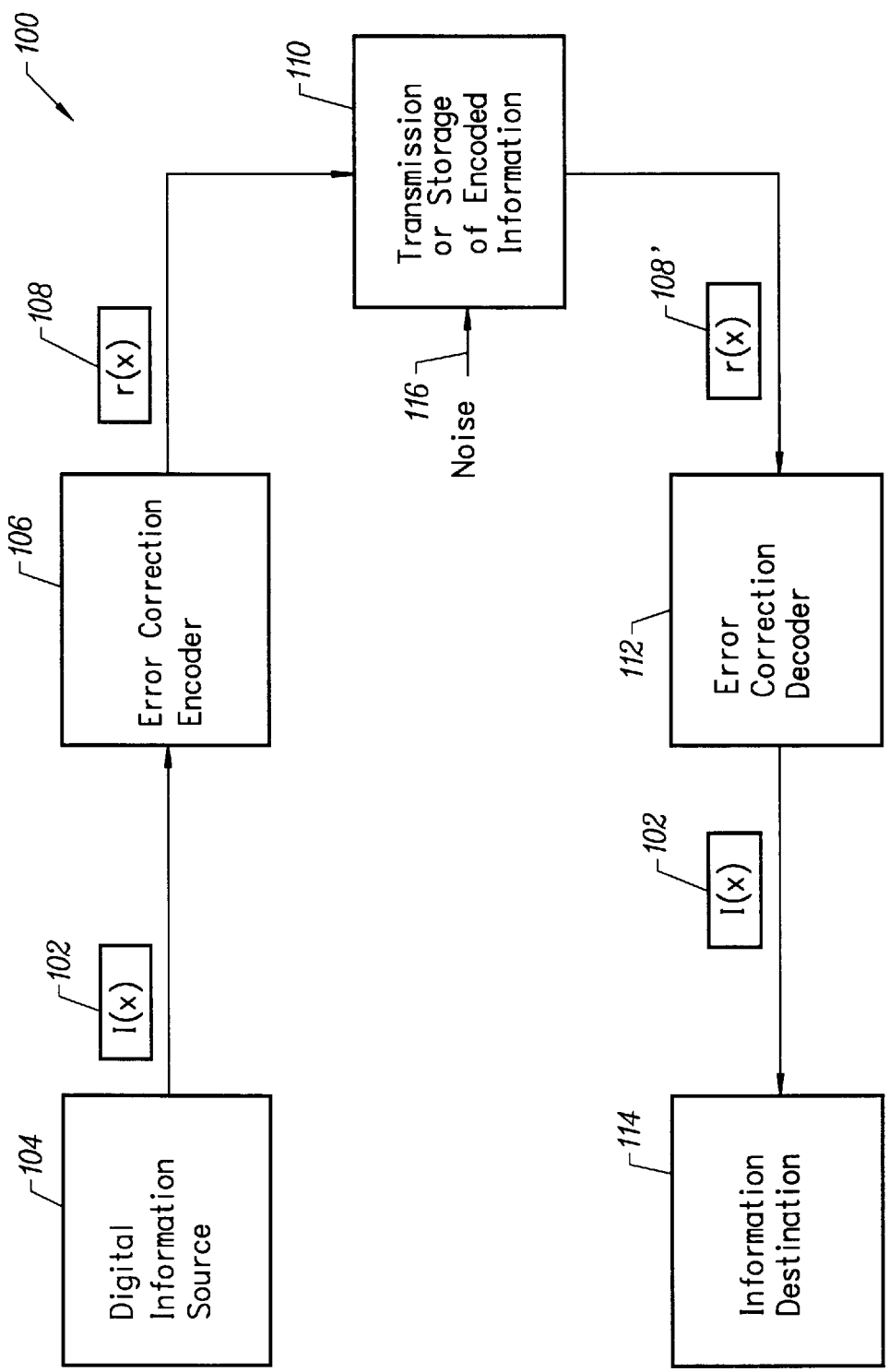
FIG. 1 is a block diagram of a generalized system 100 in which an embodiment of the invention is used to detect and correct errors.

FIG. 1 illustrates a generalized block diagram of a typical system 100 that uses an embodiment of the present invention. In system 100, digital information 102 originates from a digital information source 104. In this description, information from an information source shall be referred to generally as I(x). The source 104 might be a file stored on a network server, an application program, an A/D converter processing an analog signal or any other source generating digital information. The digital information 102 is fed into the error correction encoder 106 which puts the digital information into an encoded format. The encoded digital information 108 is then transmitted or stored, for example, as represented schematically by channel 110. In this description, the transmitted or stored information that comes out of an error correction encoder shall be referred to generally as t(x) where $t(x)=t_0 x^{N-1}+t_1 x^{N-2}+ \ldots +t_{N-1} x^0$. Channel 110 schematically represents any of a number of functions or operations that might be performed on the data after it comes out of the encoder 106 and before it is passed into the decoder 112. Channel 110 might represent, for example, modulating the information t(x), passing it over a transmission medium and demodulating it. In the alternative or in addition, it might represent encapsulating and de-encapsulating the information t(x) using a variety of networking protocols, for example. It might include writing to a disk and access from a disk, for example. Noise 116 represents any noise that might affect the information 108 in channel 110.

After passing through channel 110, the encoded digital information 108' passes to the error correction decoder 112. The digital information 108' will be the same as digital information 108 unless noise 116 has caused an error. In this description, the information received from a channel such as channel 110 at the input of an error correction decoder shall be referred to generally as the received information r(x) where $r(x)=r_0 x^{N-1}+r_1 x^{N-2}+ \ldots +r_{N-1} x^0$. Error correction decoder 112, which is an embodiment of the present invention, detects and corrects errors, if possible, recreating the information stream t(x). Decoder 112 then converts this encoded information stream t(x) back to the digital information 102. Digital information 102 can then be provided to the information destination 114, which might be a client on a network, for example, or any other destination to which the information I(x) is being communicated.

Figure 2:
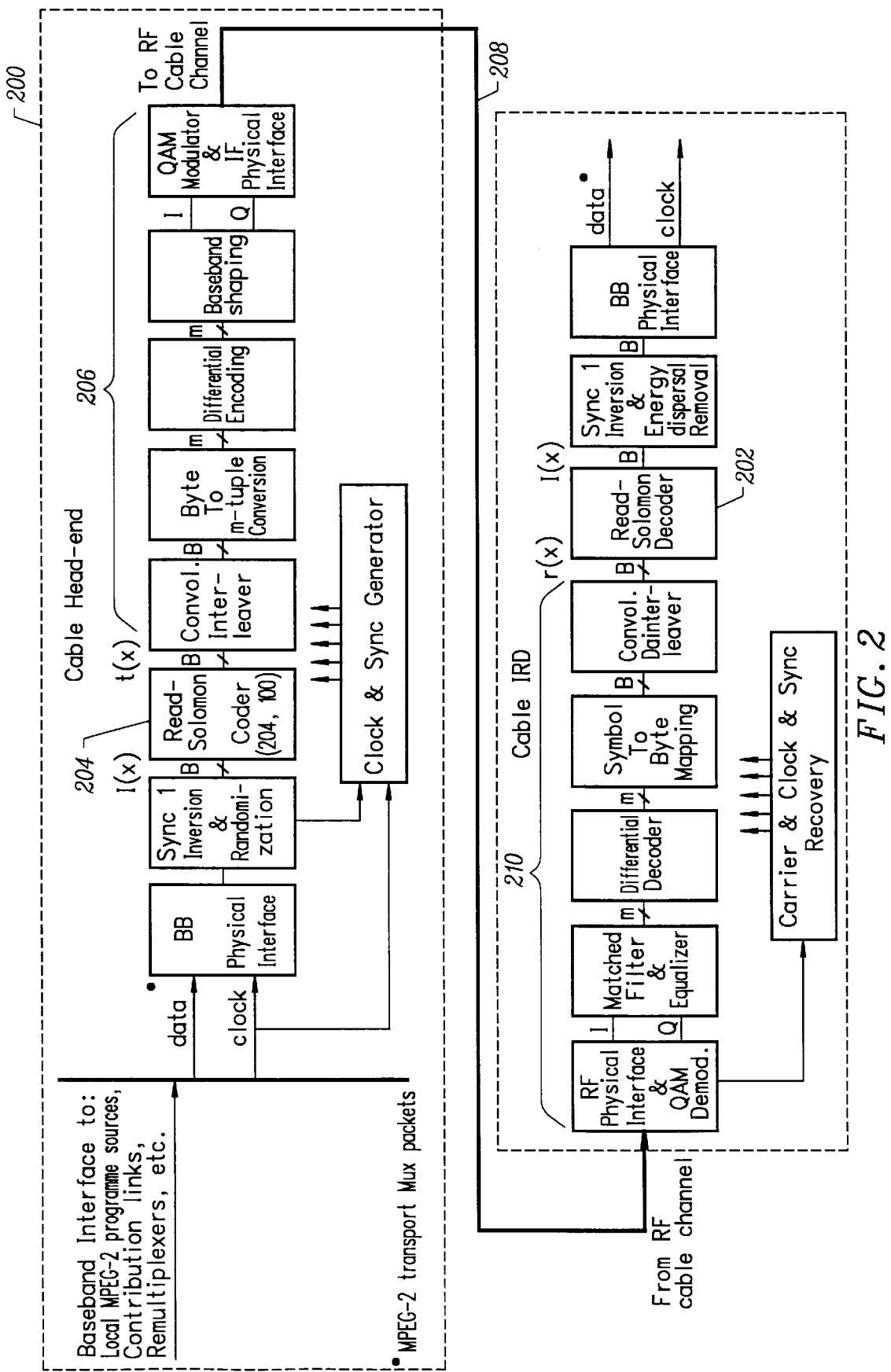
FIG. 2 is a block diagram of a more specific system 200 in which an embodiment of the present invention is used to detect and correct errors.

FIG. 2 is a conceptual block diagram of a more specific system 200 that uses a decoder 202. Decoder 202 is an embodiment of the present invention. System 200 is generally disclosed in European Telecommunication Standard (ETS) 300 429. Because the system 200 is intended to error correct a 204 byte MPEG packet (which includes parity bytes), it uses a (204, 188) Reed Solomon code. In particular, system 200 is designed to correct up to 8(t)

erroneous symbols of information in every 204 symbols. Accordingly, 16(2t) parity symbols are used. Each symbol is a byte of information or an 8 bit word (m). The (204, 188) Reed Solomon code used by the system 200 is a shortened version of the (255, 239) Reed Solomon Code and has the code generator polynomial $g(x)=(x+\alpha^0)(x+\alpha^1)(x+\alpha^2)(x+\alpha^3)\ldots(x+\alpha^{15})$ where $\alpha$ is 02hex and the field generator polynomial $p(x)=x^8+x^4+x^3+x^2+1$.

Because these polynomials are associated with a (255, 239) Reed Solomon code, the Reed Solomon hardware used could be easily modified to handle up to 239 data bytes. Because the system 200 only uses 188 data bytes, however, the system 200 simply does not use the additional 51 data words (i.e. 239–188 unused data words). Other embodiments of the invention can use other Reed Solomon codes or even other non-Reed Solomon error correcting codes. To do so, the present embodiment will have to be adapted to provide the appropriate calculations for the particular code being used.

In the system 200, the 188 bytes of pre-encoded information are converted to 204 bytes of coded information by encoder 204 to produce the transmitted data t(x), which is a (204, 188) RS code word. In the present embodiment, however, N=204 and K=16 because this code is a shortened version of the (255, 239) Reed Solomon code. As illustrated in FIG. 2, the transmitted data t(x) is passed through blocks 206, over channel 208 and through blocks 210 to the input of Reed-Solomon decoder 202. Blocks 206, channel 208 and blocks 210 are a specific example of the channel 110 described in FIG. 1.

Decoder 202, which is an embodiment of the present invention, is a (204, 188) RS decoder. The data r(x) received at the input of decoder 202 is a (204, 188) RS code word that may or may not contain errors. This information is decoded by decoder 202 to reproduce the information I(x) that was input to the RS encoder 204. Decoder 202 could easily be adapted to operate on (255, 239) Reed Solomon code words.

Figure 3:
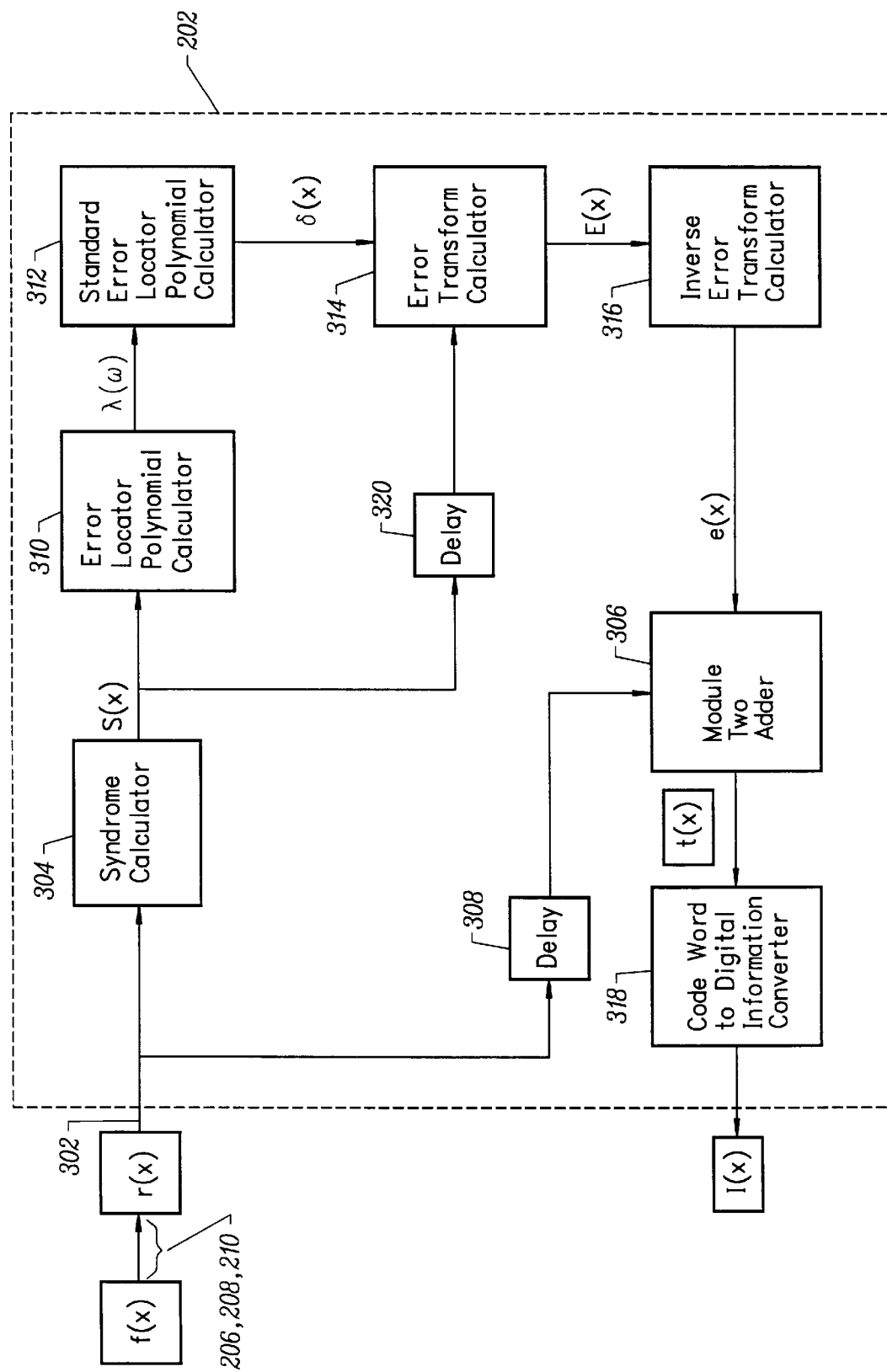
FIG. 3 is a block diagram of the decoder 202 used in system 200.

FIG. 3 is an expanded view of the decoder 202 that is used in the system 200. Again t(x) represents the information transmitted by encoder 204 and r(x) represents the information received at the input of decoder 202. Elements 206, 208 and 210 of FIG. 2 are represented schematically in FIG. 3. The decoder 202 receives the received information r(x) through input 302. In the present embodiment $r(x)=r_{203}x^{203}+r_{202}x^{202}+r_{201}x^{201}+\ldots+r_0$. This received information r(x) passes to the modulo two adder 306 through delay 308 and passes to the syndrome calculator 304. The delay 308 is chosen so that the coefficients of the received polynomial r(x) are provided to the modulo two adder 306 to be modulo two added to the corresponding coefficients of the inverse error transform polynomial e(x). Accordingly, the delay 308 provides a delay equal to the time it takes the error locator polynomial calculator 310, the standard error locator polynomial calculator 312, the error transform calculator 314 and the inverse error transform calculator 3 16 to calculate the coefficients of the inverse error transform polynomial e(x) that correspond to the coefficients of r(x). In particular, delay 308 is designed such that $r_n$ and $e_n$ are applied to the inputs of the modulo two adder 306 to produce the output rn+en. This output is clocked into the converter 318 where it is converted back to I(x). When dealing with systemic codes such as Reed Solomon codes, the process of converting the error corrected data back to the information I(x) is simply a matter of dropping parity bytes which are in known locations. Accordingly, converter 318 in the present embodiment is simply a device that drops the parity bytes.

The decoder 202 detects and corrects errors in the received data stream r(x) in the following manner. In particular, syndrome calculator 304 calculates the syndrome polynomial S(x) from the received polynomial r(x) using the relation $$S_k = \sum_{n=0}^{N-1} r_n \alpha^{nk}$$

$0 \leq k \leq (2t-1)$ where $S_k$ is the coefficient of the degree k term of the polynomial S(x), $r_n$ is the coefficient of the degree n term of the received polynomial r(x) and $\alpha$ is a root of the field generator polynomial p(x). Again, in the present embodiment $\alpha=02_{hex}$. In the present embodiment, $$S_k = \sum_{n=0}^{203} r_n \alpha^{nk}$$

$0 \leq k \leq 15$ due to the shortened RS code. Accordingly, $S(x)=S_0x^{15}+S_1x^{14}+S_2x^{13}+\ldots+S_{15}$. The syndrome polynomial S(x) is passed to the error locator polynomial calculator 310 and is passed through a delay 320 to the error transform calculator 314. The delay 320 corresponds to the time it takes the error locator polynomial calculator 310 and the standard error locator polynomial calculator 312 to calculate the coefficients of the standard error locator polynomial $\sigma(x)$. In particular, the coefficients of the syndrome polynomial S(x) and the coefficients of the standard error locator polynomial $\sigma(x)$ are timed to arrive at the error transform calculator 314 as appropriate to calculate the error transform polynomial E(x).

The error locator polynomial calculator uses the iterative modified Euclid's algorithm to calculate the error locator polynomial $\lambda(x)$ from the syndrome polynomial S(x) The polynomial $\lambda(x)$ can have a maximum degree of t, which in the present embodiment is 8. Accordingly, $$\lambda(x)=\lambda_0x^8+\lambda_1x^7+\lambda_2x^6+\ldots\lambda_8.$$

The standard error locator polynomial calculator 312 calculates $\sigma(x)$ from $\lambda(x)$. Thus, $$\sigma(x)=\sigma_0x^8+\sigma_1x^7+\sigma_2x^6+\ldots\sigma_8$$

where $\sigma_k=\lambda_k/\lambda_{lnz}$ $0 \leq k \leq 8$ where $\sigma_k$ represents the coefficients of $\sigma(x)$, $\lambda_k$ represents the same degree coefficient of $\lambda(x)$, $\lambda_{lnz}$ is the leading (i.e., highest degree) non-zero coefficient of $\lambda(x)$ and "lnz" (the subscript of $\lambda_{lnz}$) is the position of this leading non-zero coefficient. Thus, if $\lambda_2$ is the leading non-zero coefficient of the error locator polynomial, then lnz=2.

The error transform calculator 314 calculates the error transform polynomial E(x) from the syndrome polynomial S(x) and from the standard error locator polynomial $\sigma(x)$ using the relation $$E_{2t+j} = \sum_{k=lnz+1}^{t} \sigma_k E_{2t+j-k+lnz}$$

for $0 \leq j \leq N-1-2t$ where $\sigma_k$ is the coefficient of the degree 8-k (i.e. t-k) term of the standard error locator polynomial $\sigma(x)$ and $E_{2t+j-k+lnz}$ is a known coefficient of the polynomial E(x). In the present embodiment, $$E_{16+j} = \sum_{k=lnz+1}^{8} \sigma_k E_{16+j-k+lnz}$$

for $0 \leq j \leq 238$. The syndromes $S_0$ through $S_{15}$ are the error transforms $E_0$ through $E_{15}$, respectively. Accordingly, the error transform calculator starts with these known error transforms, $E_0$ through $EB_{15}$, and calculates the remaining error transforms $E_{16}$ to $E_{254}$.

The inverse error transform calculator 316 then calculates the inverse error transform polynomial e(x) from the error transform polynomial E(x) using the relation $$e_n = \alpha^n \sum_{k=0}^{N-1} E_k \alpha^{n(N-k-1)}$$

for $0 \leq n \leq N-1$ where $E_k$ is the coefficient of the degree k term of the error transform polynomial E(x). In the present embodiment, $$e_n = \alpha^n \sum_{k=0}^{254} E_k \alpha^{n(N-k-1)}$$

for $0 \leq n \leq 203$ even though N−1=254 because of the use of the shortened Reed Solomon code. Inverse error transforms $e_{204}$ to $e_{254}$ need not be calculated because they relate to errors in the 51 unused data bytes. Other embodiments might calculate these inverse error transforms. The output of the inverse error transform calculator 316 is coupled to an input of the modulo two adder 306.

The modulo two adder 306 adds the coefficients of the received data stream r(x) to the corresponding coefficients of the inverse error transform polynomial e(x). Assuming there are t errors or less in r(x), this addition typically corrects errors in r(x) to reproduce the information stream t(x) at the output of the modulo two adder 306. This information stream t(x) is then converted by converter 318 from the (204, 188) RS encoded code words back into the actual information stream I(x) that was present at the input of the Reed Solomon encoder 204 by removing the parity bytes from the data bytes.

All of the bus lines illustrated in FIG. 3 are 8 bit wide bus lines. In this specification, "bus" or "bus line" shall generally refer to any path for coupling a signal, such as a data signal or a control signal, between hardware elements such as the hardware elements of the decoder 202. The hardware elements of decoder 202 include the components illustrated in FIG. 3 and the elements that make up these components such as memory elements, multiplexors, adders, multipliers, switches, delays, cells or control circuits, for example. Bus lines include, for example, control lines, inputs, outputs and lines coupling hardware elements to each other.

Syndrome Calculator

Figure 4:
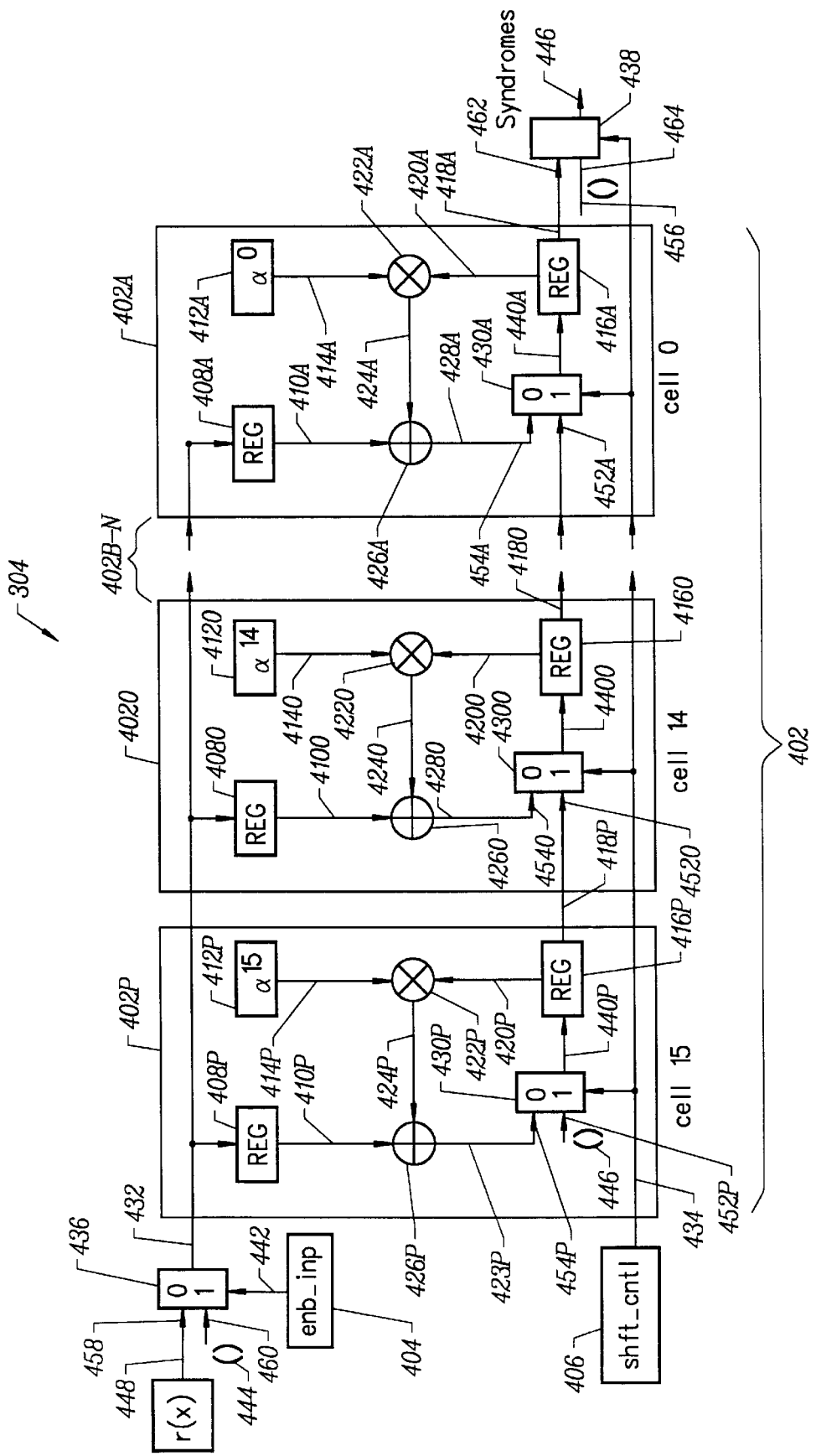
FIG. 4 illustrates a syndrome calculator 304 used by the decoder of FIG. 3.

FIG. 4 illustrates the syndrome calculator 304 used by decoder 202. Other embodiments of the invention can use other syndrome calculators. This syndrome calculator uses 16 (2t) syndrome cells 402A to 402P to calculate the equation $$S_k = \sum_{n=0}^{203} r_n \alpha^{nk}$$

$0 \leq k \leq 15$. Each cell calculates one coefficient $S_k$ of S(x). Embodiments of the invention that deal with syndrome polynomials having more or less terms can vary the number of cells to correspond to different number of terms. Other embodiments might use a single cell repeatedly or various combinations of parallel cells and repeated cells. Cells 402B to 402N have been illustrated symbolically for convenience. In this specification, features of the present embodiment that are described with an appended letter, such as cells 402A to 402P, shall be collectively and generically referred to by the number without the appended letter. For example, "cells 402" shall refer to all of the cells 402A to 402P collectively. "Cell 402" shall generically refer to any of the cells 402A to 402P. The term cell, as used herein, is not intended to require that the elements "within" a cell be located in a common physical area of a chip, for example. Rather, the term cell is intended to describe a group of hardware elements that have functional and/or physical relationships between them that are similar to the functional and/or physical relationships between the hardware elements in another group (i.e., in another cell). Calculator 304 includes a received data input 448, a multiplexor 436, logic zero inputs 444, 446 and 456, a multiplexor 438 and an output 446. All of the bus lines in the calculator 304 except for control lines 442 and 434 are 8 bits wide. Controls lines 442 and 434 are one bit lines.

Each of the cells 402 includes an input memory element 408 (i.e. 408A to 408P). In the present embodiment, the memory elements 408 are 8 bit registers that provide the data that they are storing to their output buses 410. When each memory element 408 is clocked by a clock signal (not shown), it stores the data that is present at its input. The clock signals that clock the memory elements in this specification may be provided in any manner consistent with the operation of the decoder 202 described herein.

Each of the cells 402 includes a power of a memory element 412 (i.e. 412A to 412P) and a sum memory element 416 (i.e. 416A to 416P). Similar to memory elements 408, memory elements 412 and 416 are 8 bit registers that provide the data that they are storing to their outputs. The memory element 412 has one output 414. The memory element 416 has two outputs 418 and 420. When each element 416 is clocked by a clock signal (not shown), it stores the data that is present at its input. Memory elements 412 store increasing powers of $\alpha$, the powers ranging from 0 to 15 (2t−1). In particular, $\alpha^0$ is stored in memory element 412A, $\alpha^1$ is stored in memory element 412B and $\alpha^2$ is stored in memory element 412C. $\alpha^3$ to $\alpha^{15}$ are stored in memory elements 412D to 412P, respectively. In the present embodiment, the memory elements have the powers of $\alpha$ burned into their registers to provide a fast, parallel design. In alternate embodiments, these memory elements could clock in the powers of $\alpha$ in from an input or they could use some form of ROM.

Each of the cells 402 includes a multiplier 422 (i.e. 422A to 422P). These multipliers 422 are Galois field multipliers. These Galois field multipliers could be of a conventional design. In the alternative, they could use the multiplier discussed with reference to FIGS. 13–17G. The output of each multiplier 422 is provided on multiplier output 424 (i.e. 424A to 424P) and is the product of the data stored in the memory element 412 (i.e. 412A to 412P) and the data stored in memory element 416 (i.e. 416A to 416P). This stored data is provided to the multiplier 422 by buses 414 (i.e. 414A to 414P) and 420 (i.e. 420A to 420P), respectively.

Each of the cells 402 includes a modulo two adder 426 (i.e. 426A to 426P). The output of each adder 426 is provided on adder output 428 (i.e. 428A to 428P) and is the sum of the data stored in memory element 408 (i.e. 408A to 408P) and the data from multiplier output 424. Each of the cells includes a multiplexor 430 (i.e. 430A to 430P). Adder output 428 is coupled to multiplexor input 454. The multiplexor 430 alternately couples its input 452 to its output 440 or its input 454 to its output 440. The multiplexors described in this specification couple only one input at a time to their output. The multiplexor 430 is controlled by the control circuit 406. This circuit 406 broadcasts first and second control signals to each of the multiplexors 430 using control line 434. In response to the first control signal, the multiplexor 430 couples its input 452 to its output 440. In response to the second control signal, the multiplexor 430 couples its input 454 to its output 440. In the present embodiment, the first control signal is a logic one and the second control signal is a logic zero. The input 452P of the multiplexor 430P in the first cell 402P is coupled to the logic zero input 446. The input 452 in cells succeeding the first cell 402P (i.e. cells 402O to 402A) is coupled to the output 418 of the memory element 416 in the immediately preceding cell. In this specification, "preceding cell" shall refer to a cell that shifts data into another cell. "Succeeding cell" shall refer to a cell that receives data that has been shifted from another cell. The output 440 of multiplexor 430 is coupled to the input of memory element 416. The output of memory element 416 in each preceding cell 402 is coupled to the input 452 of the multiplexor 430 in the immediately succeeding cell 402.

Received data input 448 is coupled to input 458 of multiplexor 436. Logic zero input 444 is coupled to input 460 of multiplexor 436. Multiplexor 436 is controlled by control circuit 404. In particular, control circuit 404 provides first and second control signals on control line 442. In the present embodiment, the first control signal is a logic one, and the second control signal is a logic zero. In response to the first control signal, multiplexor 436 couples its input 460 to its output 432. In response to the second control signal, multiplexor 436 couples its input 458 to its output 432. The output 418A of the memory element 416A in the last cell 402A is coupled to the input 462 of the multiplexor 438. The input 464 of multiplexor 438 is coupled to the logic zero input 456. Multiplexor 438 is controlled by control circuit 406 and the first and second control signals on control line 434. In response to the first control signal, multiplexor 438 couples its input 462 to its output 446. In response to the second control signal, multiplexor 438 couples its input 464 to its output 446.

In operation, prior to receiving the received information stream r(x) on input 448, the first control signals are applied to multiplexors 436, 430 and 438. In this state, multiplexor 436 broadcasts a zero byte to the input of each of memory elements 408. Memory elements 408 are clocked once to store this zero byte. Similarly, multiplexors 430 are used in a similar manner to latch zero bytes from the input 446 into memory elements 416. In the present embodiment, memory elements 416 are clocked 16 times so that zero bytes are latched from input 446 into all of the memory elements 416. The input 462 of multiplexor 438 is coupled to its output.

After initializing syndrome calculator 304 in this manner, control circuits 404 and 406 provide the second control signal to multiplexors 436, 430 and 438 to couple their inputs 458, 454 and 464 to their outputs 432, 440 and 446, respectively. In this state, calculator 304 is prepared to receive the information stream r(x).

The coefficients of r(x) are received at input 448 one byte at a time, starting with the highest degree coefficient $r_{203}$. The control circuit 404 detects the presence of this coefficient and configures multiplexor 436 to couple its input 458 to its output 432. Coefficient $r_{203}$ is broadcast from input 448 onto bus 432 so that it is applied to the input of each of the memory elements 408. At this point $r_{203}$ is clocked into memory elements 408 by a first clock signal and the next coefficient of r(x), $r_{202}$, is applied at the inputs of memory elements 408. At this point, because memory element 416 contains a zero byte, the output of multiplier 422 is zero. Accordingly, the output of adder 426 is $r_{203}$. This output is applied to the input of memory element 416 through multiplexor 430. The next clock cycle stores the coefficient $r_{202}$ in memory elements 408 and stores $r_{203}$ in memory elements 416. After this second clock cycle, $r_{201}$ will be applied to the inputs of memory elements 408. The output of multiplier 422 is $r_{203}\alpha^k$ where k is the power of $\alpha$ stored in the memory element 412 in the particular cell. The output of the adder 426 is $r_{202}+r_{203}\alpha^k$. This output is applied through multiplexor 430 to the input of memory element 416. The next clock cycle stores $r_{201}$ in memory elements 408 and $r_{202}+r_{203}\alpha^k$ in memory elements 416. The input to memory element 416, at this point is $r_{201}+r_{202}\alpha^k+r_{203}\alpha^{2k}$. The next clock cycle produces $r_{200}+r_{201}\alpha^k+r_{202}\alpha^{2k}+r_{203}\alpha^{3k}$ at the input of memory elements 416. This process continues until all of the coefficients of r(x) have been clocked into the syndrome calculator in this manner to provide in the memory elements 416 the coefficients $$S_k = \sum_{n=0}^{203} r_n \alpha^{nk}$$

$0 \leq k \leq 15$. Thus, upon completion of this process, memory element 416A will contain syndrome $S_0$, memory element 416B will contain syndrome $S_1$ and memory elements 416C to 416P will contain the syndromes $S_2$ to $S_{15}$, respectively. At this point, control circuit 406 signals multiplexors 430 and 438 to create a serial path of buses 418 and 440. The syndromes $S_0$ to $S_{15}$ are then shifted out of the syndrome calculator 304 in order through the output 446 of multiplexor 438. As described with respect to FIG. 3, these syndromes are passed to the error locator polynomial calculator 310 and to the error transform calculator through the delay 320.

Error Locator Polynomial Calculator

Figure 5:
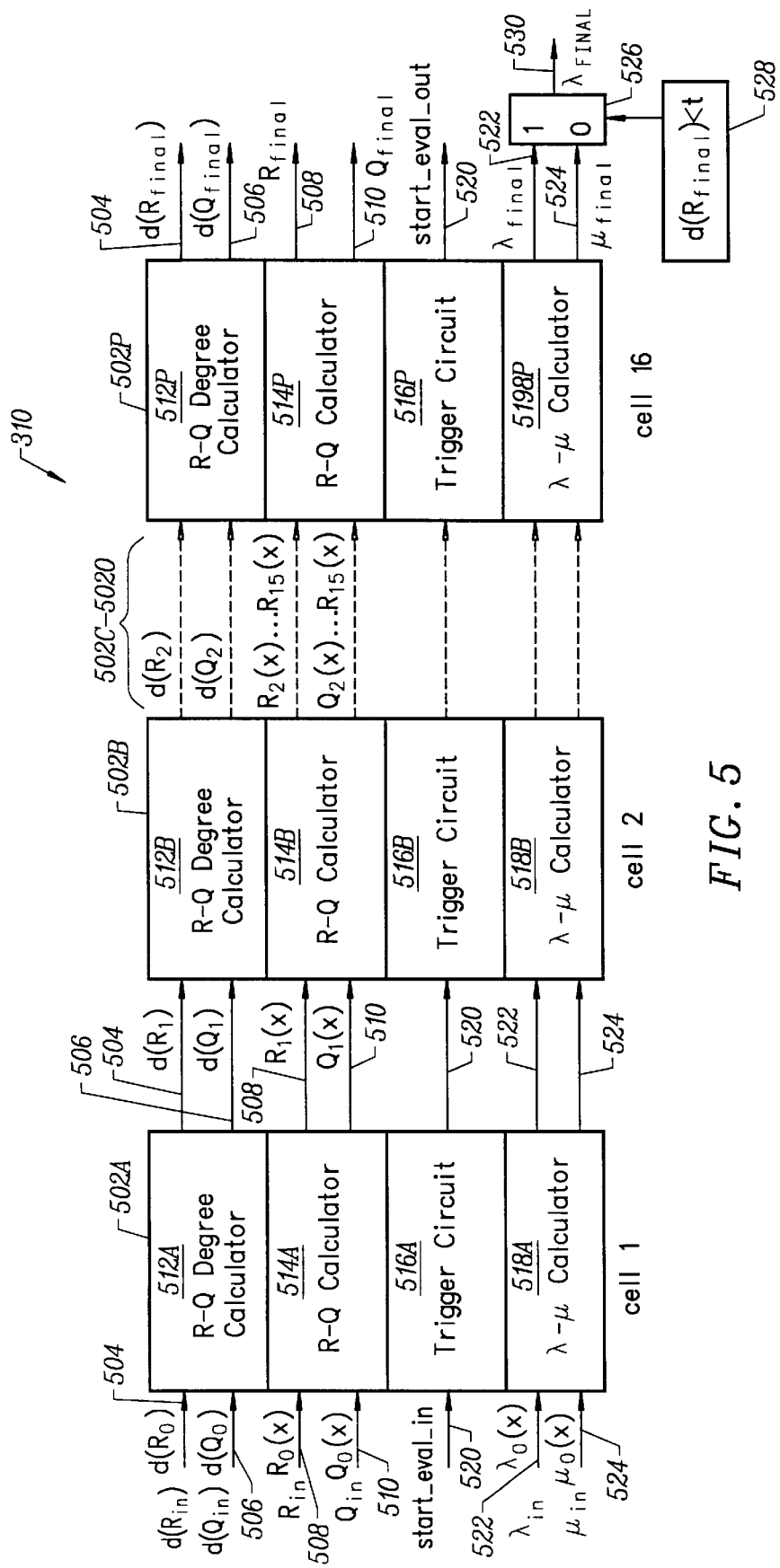
FIG. 5 illustrates a functional block diagram of an error locator polynomial calculator 310 used by the decoder of FIG. 3.

FIG. 5 is a functional block diagram of the error locator polynomial calculator 310. Other embodiments of the invention could use other error locator polynomial calculators. As shown in FIG. 5, this calculator includes 16 (2t) cells. Again, the number of cells can be varied to handle RS codes that handle more or less errors, or if the embodiment uses cells to perform repeated calculations, for example. For ease of illustration, cells 502C to 502O are shown symbolically. The cells 502A to 502P perform the modified Euclid's algorithm to calculate the error locator polynomial. Each cell includes an R-Q degree calculator cell 512 (i.e. cells 512A to 512P), an R-Q calculator cell 514 (i.e. cells 514A to 514P), a trigger circuit cell 516 (i.e. cells 516A to 516P) and a $\lambda$-$\mu$ calculator cell 518 (i.e. cells 518A to 518P). Depending on the results of the calculation, the error locator polynomial will be output as $\lambda_{final}$ or $\mu_{final}$ on bus lines 522 or 524, respectively. The control circuit 528 configures the multiplexor 526 to couple the appropriate bus line 522 or 524 to the output 530. The error locator polynomial $\lambda(x)$ will be output at output 530 based upon this configuration of multiplexor 526.

The following initial conditions are used by the present embodiment to implement Euclid's iterative algorithm.

$$A(x) = x^{2t} \tag{1}$$

$$S(x) = \sum_{k=0}^{2t-1} S_k x^{2t-k-1} \tag{2}$$

$$R_0(x) = A(x) \tag{3}$$

$$Q_0(x) = S(x) \tag{4}$$

$$\lambda_0(x) = 0 \tag{5}$$

$$\mu_0(x) = 1 \tag{6}$$

In the present embodiment, the coefficients of each polynomial are 8 bit symbols. Thus, the coefficient of the highest power of x in A(x) (i.e. $x^{2t}$) is 00000001. The coefficient of the lowest power of x $\mu_0(x)$ (i.e. $x^0$) is 00000001. These coefficients are generated by the syndrome calculator 304 at its output 446. The one bit can be provided in any convenient manner such by using a hardwired logic one or by generating the logic one using control circuitry. The coefficients of $\lambda_0(x)$ are provided using a hardwired zero word. The deg $(R_0(x))$ is hardwired to be 16 (i.e. 2t) and the deg $(Q_0(x))$ is hardwired to be 15 (i.e. 2t-1). Leading zero coefficients of S(x) are not dropped when determining deg $(Q_0(x))$.

The cells 502 of the error locator polynomial calculator 310 operate to calculate $R_i(x)$ from $R_{i-1}(x)$ and $Q_{i-1}(x)$, $Q_i(x)$ from $R_{i-1}(x)$ or $Q_{i-1}(x)$, $\lambda_i(x)$ from $\lambda_{i-1}(x)$ and $\mu_{i-1}(x)$, $\mu_i(x)$ from $\lambda_{i-1}(x)$ or $\mu_{i-1}(x)$, deg$(R_i(x))$ from deg$(R_{i-1}(x))$ or deg $(Q_{i-1}(x))$ and deg$(Q_i(x))$ from deg$(R_{i-1}(x))$ or deg $(Q_{i-1}(x))$. The calculations performed on $R_{i-1}(x)$ and $Q_{i-1}(x)$ produce polynomials having lower degrees. Calculations are performed by cells 502 as long as the degree of one of the polynomials $R_{i-1}(x)$ and $Q_{i-1}(x)$ is greater than t. Initially, the degree of $R_{i-1}(x)$ and $Q_{i-1}(x)$ are greater than t. The same calculations that are performed on $R_{i-1}(x)$ to obtain $R_i(x)$ are performed on $\lambda_{i-1}(x)$ to obtain $\lambda_i(x)$. Similarly, the same calculations that are performed on $Q_{i-1}(x)$ to obtain $Q_i(x)$ are performed on $\mu_{i-1}(x)$ to obtain $\mu_i(x)$. Once the degree of either $R_{i-1}(x)$ or $Q_{i-1}(x)$ is less than t, however, then the error locator polynomial has been determined. In particular, if the degree of $R_{i-1}(x)$ is less than t, then the calculated $\lambda_{i-1}(x)$ is the error locator polynomial. If the degree of $Q_{i-1}(x)$ is less than t and the degree of $R_{i-1}(x)$ is not less than t, then the calculated $\mu_{i-1}(x)$ is the error locator polynomial. Once the error locator polynomial has been calculated in this manner, no further calculations are performed on $\lambda_{i-1}(x)$ and $\mu_{i-1}(x)$. These final polynomials, which we shall label $\lambda_{final}(x)$ and $\mu_{final}(x)$, are passed unmodified to the outputs 522 and 524, respectively. Similarly, the final values calculated by the degree calculator of deg$(R_{final}(x))$ and deg$(Q_{final}(x))$ are passed out of the last cell of the calculator 310. The values deg$(R_{final}(x))$ and deg$(Q_{final}(x))$ are the values of deg$(R_i(x))$ and deg$(Q_i(x))$ output from the cell 502 that also first output the final polynomials $\lambda_{final}(x)$ and $\mu_{final}(X)$. Once $\lambda_{final}(x)$ and $\mu_{final}(X)$ are output from the last $\lambda$-$\mu$ calculator cell 518P, the control circuit 528 sends control signals to the multiplexor 526 to configure it to pass one of these polynomials out of output 530 as $\lambda_{FINAL}(x)$. The control circuit 528 sends a first control signal to the multiplexor 526 to configure it to pass $\lambda_{final}(x)$ out of output 530 as $\lambda_{FINAL}(x)$ if deg$(R_{final}(x))$ is less than t. Otherwise, the control circuit 528 sends a second control signal to the multiplexor 526 to configure it to pass $\mu_{final}(x)$ out of output 530 as $\lambda_{FINAL}(x)$ if deg$(R_{final}(x))$ is not less than t. The coefficients of the error locator polynomial $\lambda_{FINAL}(x)$ passed out of output 530 are passed to the input 1044 (FIG. 10) of the standard error locator polynomial calculator 312.

Error Locator Polynomial Calculator—R-Q Calculator

Figure 6:
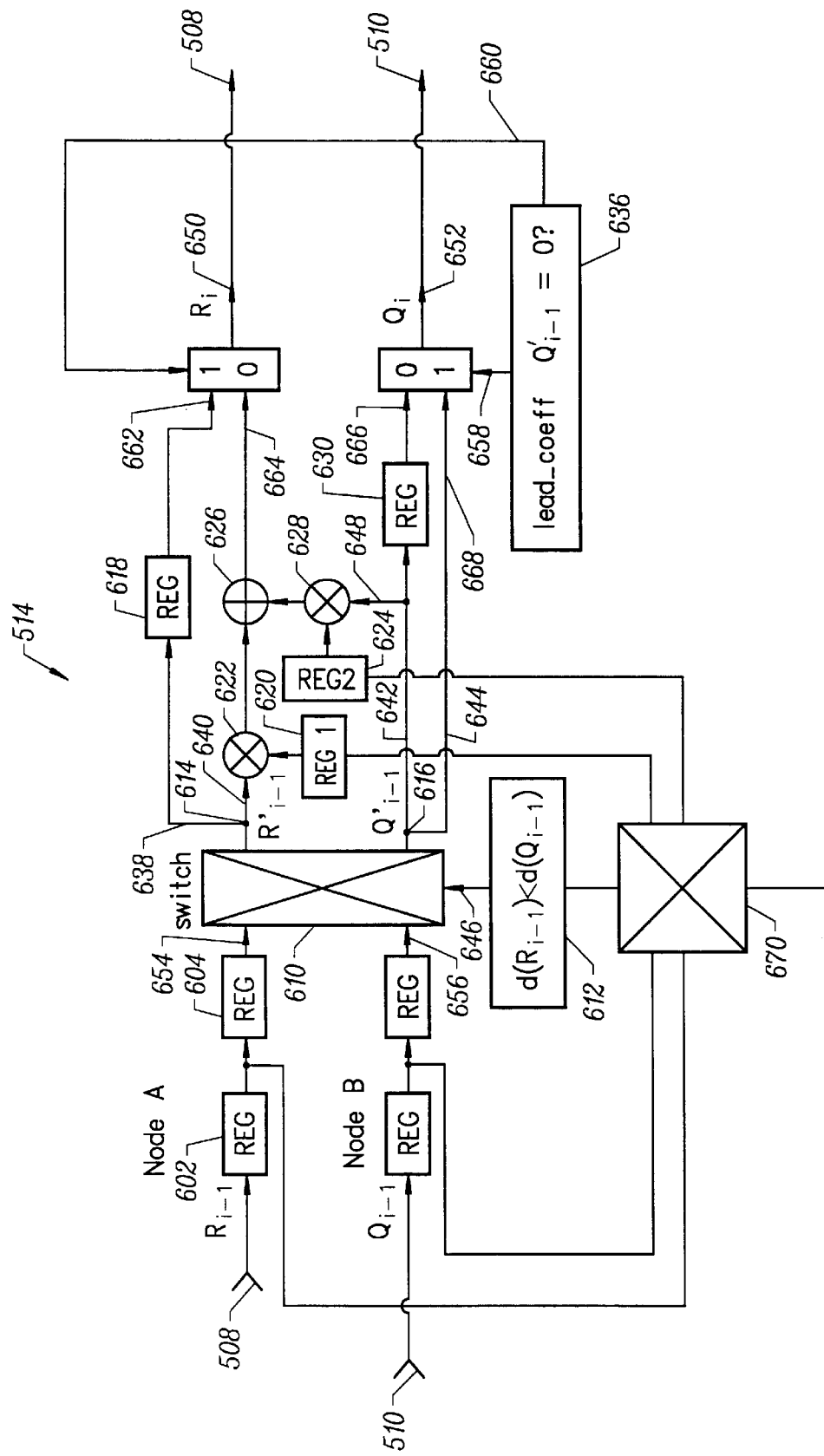
FIG. 6 illustrates an R-Q calculator cell 514 used in the error locator polynomial calculator of FIG. 5.

FIG. 6 illustrates the R-Q calculator cell 514 which is used in the error locator polynomial calculator 310. The R-Q calculator cell 514 in each cell 502 calculates polynomials $R_i(x)$ and $Q_i(x)$ from the polynomials $R_{i-1}(x)$ and $Q_{i-1}(x)$ using the following equations.

$$R_i(x)=[\sigma_{i-1}b_{i-1}R_{i-1}(x)+\bar{\sigma}_{i-1}a_{i-1}Q_{i-1}(x)]-x^{|1_{i-1}|}[\sigma_{i-1}Q_{i-1}(x)+\bar{\sigma}_{i-1}b_{i-1}R_{i-1}(x)] \quad (7)$$

$$Q_i(x)=\sigma_{i-1}Q_{i-1}(x)+\bar{\sigma}_{i-1}R_{i-1}(x) \quad (8)$$

where $$1_{i-1}=\deg(R_{i-1}(x))-\deg(Q_{i-1}(x)) \quad (9)$$

$$\sigma_{i-1}=1 \text{ if } 1_{i-1}\geq 0 \quad (10)$$

$$\sigma_{i-1}=0 \text{ if } 1_{i-1}<0 \quad (11)$$

and where $a_{i-1}$ is the leading (highest degree) coefficient of $R_{i-1}$ (x), and $b_{i-1}$ is the leading coefficient of $Q_{i-1}$ (x). The terms deg$(R_{i-1}(x))$ and deg$(Q_{i-1}(x))$ represent the degree of these polynomials as calculated by the degree calculator cells 512. As we will describe, the degree calculated by cells 512 may not be the same as the "actual" degree of $R_i(x)$ and $Q_i(x)$. For example, the "actual" degree of $0x^2+x+1$ is typically considered to be 1. Under certain circumstances, however, the degree calculator might treat the degree of a polynomial such as $0x^2+x+1$ as 2.

When deg$(R_{i-1}$ (x)) is greater than or equal to deg$(Q_{i-1}$ (x)), these equations reduce to $$R_i(x)=b_{i-1}R_{i-1}(x)-x^{|1_{i-1}|}a_{i-1}Q_{i-1}(x) \quad (12)$$

$$Q_i(x)=Q_{i-1}(x) \quad (13)$$

When deg$(R_{i-1}$ (x)) is less than deg$(Q_{i-1}$ (x)), these equations reduce to $$R_i(x)=a_{i-1}Q_{i-1}(x)-x^{|1_{i-1}|}b_{i-1}R_{i-1}(x) \quad (14)$$

$$Q_i(x)=R_{i-1}(x) \quad (15)$$

Thus, the R-Q calculator cells 514 of the present embodiment implement equations (12) and (13) or equations (14) and (15) depending on the relative values of deg$(R_{i-1}(x))$ and deg$(Q_{i-1}(x))$ as calculated by the degree calculator cells 512. The $x^{|1_{i-1}|}$ in equations (12) and (14) simply represents the difference between deg$(R_{i-1}(x))$ and deg$(Q_{i-1}(x))$. By multiplying the lower degree polynomial by $x^{|1_{i-1}|}$, the equations indicate that the subtrahend and minuend of equations (12) and (14) have the same degree. By also cross multiplying $R_{i-1}(x)$ by the leading coefficient of $Q_{i-1}(x)$ and $Q_{i-1}(x)$ by the leading coefficient of $R_{i-1}(x)$ and then subtracting in this manner, the coefficient of the term in $R_i(x)$ having the same degree as the highest degree term of the subtrahend and minuend will always be zero. As we will describe, this zero coefficient of $R_i(x)$ is dropped after the calculation of equation (12) or (14) is performed. Dropping this zero coefficient reduces the degree of $R_i(x)$ by one from $R_{i-1}(x)$ (when equation (12) is used) or reduces the degree of $R_i(x)$ by one from $Q_{i-1}(x)$ (when equation (14) is used).

In operation, $R_{i-1}(x)$ and $Q_{i-1}(x)$ are input into each of the respective R-Q calculator cells 514A to 514P and $R_i(x)$ and $Q_i(x)$ are output from the R-Q calculator cell into which $R_{i-1}(x)$ and $Q_{i-1}(x)$ were input. Thus, looking at FIG. 5, for example, $R_0(x)$ and $Q_0(x)$ are input into calculator cell 514A on buses 508 and 510, respectively, and $R_1(x)$ and $Q_1(x)$ are output on these respective buses. Similarly, $R_1(x)$ and $Q_1(x)$ are input into calculator cell 514B on buses 508 and 510, respectively, and $R_2(x)$ and $Q_2(x)$ are output. Calculators cells 514C to 514P operate similarly to produce $R_3(x)$ through $R_{16}(x)$ and $Q_3(x)$ through $Q_{16}(x)$.

The design of R-Q calculator cell 514 as shown in FIG. 6 enables repetitions of this same cell design to be used to implement calculator cells 514A through 514P. Such a cell design makes the R-Q calculator of the present embodiment relatively easily scalable. In particular, the present R-Q calculator implemented by cells 514A through 514P can be adapted to provide the R-Q calculations for other Reed Solomon codes, for example, by simply increasing or decreasing the number of these R-Q calculator cells 514 that are coupled in series.

Calculator cell 514 includes memory elements 602, 604, 606, 608, 618, 620, 624 and 630 each having an input and an output. These memory elements are all implemented as 8 bit registers, similar to registers 408 and 416 of FIG. 4, which each provide the data that they are storing to their respective output. When each memory element is clocked by a clock signal (not shown), it stores the data that is present at its input. Calculator 514 also includes switch 610, R' multiplexor 632, Q' multiplexor 634, Galois field multipliers 622 and 628 and modulo two adder 626. Control circuits 612 and 636 provide control signals to control the switch 610 and the multiplexors 632 and 634 in calculator 514. All of the bus lines in the calculator 514 are 8 bit wide buses, except control lines 646, 658 and 660. Control lines 646, 658 and 660 are one bit lines.

The input of memory element 602 receives the coefficients of the polynomial $R_{i-1}(x)$, and the input of memory element 606 receives the coefficients of the polynomial $Q_{i-1}(x)$. The output of memory elements 602 and 606 are coupled to the inputs of memory elements 604 and 608, respectively. The outputs of memory elements 604 and 608 are coupled to an R switch input 654 and a Q switch input 656, respectively, of switch 610. Control circuit 612 is coupled to switch 610 through control line 646.

Switch 610 has an R' switch output 614 and a Q' switch output 616. The output 614 is coupled to an R'(x) calculation path 640 and an R'(x) bypass path 638. The R'(x) bypass path 638 and the R'(x) calculation path 640 are each coupled at their opposite ends to an input 662 and input 664, respectively, of R' multiplexor 632. The output 616 of switch 610 is coupled to a Q'(x) delay path 642 and a Q'(x) bypass path 644. The Q'(x) bypass path 644 and the Q'(x) delay path 642 are coupled at their opposite ends to an input 668 and input 666, respectively, of Q' multiplexor 634. The output 650 of multiplexor 632 provides $R_i(x)$ which might become, for example, the $R_{i-1}(x)$ input of a succeeding R-Q calculator cell 514. Similarly, the output 652 of multiplexor 634 provides $Q_i(x)$ which might become, for example, the $Q_{i-1}(x)$ input of a succeeding R-Q calculator cell 514. Control circuit 636 is coupled to multiplexor 632 through control line 660 and to multiplexor 634 through control line 658.

The R'(x) calculation path 640 includes the multiplier 622 coupled to the adder 626. The R' switch output 614 provides a first input to the multiplier 622, and the output of memory element 620 provides a second input. The output of the multiplier 622 provides a first input to the modulo two adder 626. The second input to the adder 626 is provided by a cross couple path 648. Cross couple path 648 couples the output 616 of switch 610 to the input of the adder 626 through a multiplier 628. The second input to the multiplier 628 is provided by the output of memory element 624. The output of multiplier 628 provides the second input to adder 626. The output of adder 626 is coupled to the input 664 of multiplexor 632.

The R'(x) bypass path 638 couples the R' output 614 of switch 610 to the input 662 of multiplexor 632 through a memory element 618. The memory element 618 functions as a delay in this path 638.

The Q'(x) delay path 642 couples the output 616 of switch 610 to the input 666 of multiplexor 634 through memory element 630. Similar to memory element 618 in R'(x) bypass path 638, memory element 630 functions as a delay in path 642. The Q'(x) bypass path couples the output 616 of switch 610 directly to the input 668 of multiplexor 634 without a delay.

The control circuit 612 tests to determine if $\deg(R_{i-1}(x))$ is less than $\deg(Q_{i-1}(x))$ where deg $(R_{i-1}(x))$ and deg $(Q_{i-1}(x))$ are the inputs to the degree calculator 512 in the same cell 502. If so, circuit 612 provides a first control signal to switch 610. If not, it provides a second control signal to switch 610. In response to the first control signal, switch 610 passes the data present at its input 654 to its output 616 and passes the data present at its input 656 to its output 614. In response to the second control signal, switch 610 passes the data present at its input 654 to its output 614 and passes the data present at its input 656 to its output 616. We shall refer to the data output from output 614 as $R_{i-1}(x)'$ and the data output from output 616 as $Q_{i-1}(x)'$. As this description illustrates $R_{i-1}(x)'$ will either be $R_{i-1}(x)$ or $Q_{i-1}(x)$, depending on whether or not $\deg(R_{i-1}(x))$ is less than $\deg(Q_{i-1}(x))$. Similarly, $Q_{i-1}(x)'$ will either be $R_{i-1}(x)$ or $Q_{i-1}(x)$, depending on whether or not $\deg(R_{i-1}(x))$ is less than $\deg(Q_{i-1}(x))$.

The data stored in memory element 620 will either be $a_{i-1}$, the leading coefficient of $R_{i-1}(x)$, or $b_{i-1}$, the leading coefficient of $Q_{i-1}(x)$. This data is loaded into the memory element 620 will be $a_{i-1}$ when $\deg(R_{i-1}(x))$ is less than $\deg(Q_{i-1}(x))$ and will be $b_{i-1}$ when $\deg(R_{i-1}(x))$ is not less than $\deg(Q_{i-1}(x))$. The data stored in memory element 624 will also be either $a_{i-1}$ or $b_{i-1}$. This data will be $b_{i-1}$ when $\deg(R_{i-1}(x))$ is less than $\deg(Q_{i-1}(x))$ and will be $a_{i-1}$ when $\deg(R_{i-1}(x))$ is not less than $\deg(Q_{i-1}(x))$. Another way of describing the data stored in memory elements 620 and 624 is that the data in memory element 620 is $b_{i-1}'$, the leading coefficient of $Q_{i-1}(x)'$, and the data in memory element 624 is $a_{i-1}'$, the leading coefficient of $R_{i-1}(x)'$. Under certain circumstances the decoder 202 might treat zero rather than one as the leading coefficient of a polynomial such as $0x^2+x+1$. Unless otherwise specified, "leading coefficient" shall refer to the coefficient of a polynomial that the decoder 202 treats as the leading coefficient, whether or not that coefficient is zero.

If $\deg(R_{i-1}(x))$ is greater than or equal to $\deg(Q_{i-1}(x))$, then $R_{i-1}(x)'=R_{i-1}(x)$, $Q_{i-1}(x)'=Q_{i-1}(x)$. As a result, the calculator cell 514 implements equations (12) and (13). Memory element 620 contains $b_{i-1}'$ (which in this case is $b_{i-1}$) and memory element 624 contains $a_{i-1}'$ (which in this case is $a_{i-1}$). These values provide the cross multiplication shown in equations (12) and (13). Because adder 626 is a modulo two adder, addition is the same as subtraction. Accordingly, adder 626 provides the subtraction shown in equations (12) and (13). In the present embodiment, the appropriate values of $a_{i-1}$ and $b_{i-1}$ are loaded into the memory elements 620 and 624 by control circuit 670 which reads $a_{i-1}$ and $b_{i-1}$ from the output of memory elements 602 and 606 at nodes A and B. Control circuit 670 is triggered by the start_eval_out signal from FIG. 5. It uses a signal from control circuit 612 to determine the appropriate one of memory elements 620 and 624 to which each of the coefficients is supplied.

If $\deg(R_{i-1}(x))$ is less than $\deg(Q_{i-1}(x))$, then $R_{i-1}(x)'=Q_{i-1}(x)$, $Q_{i-1}(x)'=R_{i-1}(x)$. As a result, the calculator cell 514 implements equations (14) and (15). In that situation, memory element 620 is loaded with $b_{i-1}'$ (which in this case is $a_{i-1}$) and memory element 624 is loaded with $a_{i-1}'$ (which in this case is $b_{i-1}$). This loading occurs during the delays introduced by elements 604 and 608 and again is accomplished using control circuit 670. Once control circuit 612 completes it's test, the appropriate coefficients are routed to and clocked into memory elements 620 and 624.

In operation, after the syndrome polynomial S(x) is calculated, the leading coefficients of $R_{i-1}(x)$ and $Q_{i-1}(x)$ are clocked into memory elements 602 and 606 at the same time. $R_{i-1}(x)$ and $Q_{i-1}(x)$ input into cell 514A are defined by the initial conditions (1) to (6). $R_{i-1}(x)$ and $Q_{i-1}(x)$ input into cells 514B to 514P are defined by the output of the respective preceding cells. Clocking the leading coefficients in at the same time inherently performs the multiplication by $x^{[1_{i-1}]}$ in equation (7). In particular, the leading coefficients are clocked in at the same time and operated on by calculator 514 even if $R_{i-1}(x)$ and $Q_{i-1}(x)$ are of different degrees. This operation corresponds to multiplying the lower degree polynomial by $x^{[1_{i-1}]}$. During this first clock cycle, memory elements 620 and 624 are also being loaded with $b_{i-1}'$ and $a_{i-1}'$ as appropriate. Also during this first clock cycle, the control circuit 612 determines which polynomial is of higher degree, and it provides the appropriate control signal to switch 610. Similarly, control circuit 636 determines whether or not the leading coefficient of $Q_{i-1}(x)'$ is zero, and it provides the appropriate control signals to multiplexors 632 and 634. To do so, control circuit 636 must first determine if $Q_{i-1}(x)'$ will equal $R_{i-1}(x)$ or $Q_{i-1}(x)$ by determining if the degree of $R_{i-1}(x)$ is less than the degree of $Q_{i-1}(x)$. Control circuit 636 relies upon control circuit 612 to make this determination. Upon making this initial evaluation, control circuit 636 determines if the leading coefficient of $Q_{i-1}(x)'$ is zero.

The second clock cycle clocks the leading coefficients of $R_{i-1}(x)$ and $Q_{i-1}(x)$ into memory elements 604 and 608, respectively, and the coefficients of $R_{i-1}(x)$ and $Q_{i-1}(x)$ that are one degree below these lead coefficients into memory elements 602 and 606, respectively. Assuming the leading coefficient of $Q_{i-1}(x)'$ is not zero, multiplexors 632 and 634 couple to their respective outputs 650 and 652 the $R'(x)$ calculation path 640 and the $Q'(x)$ delay path 642. The $R'(x)$ calculation path performs the calculation of equation (12) or (14), depending on the configuration of switch 610. The leading coefficient output from path 640 is provided out of output 650. The delay introduced by memory element 630, however, causes the leading coefficient of $Q_{i-1}(x)'$ to be output out of output 652 one clock cycle after the leading coefficient from path 640 is output out of output 650. In particular, the lead coefficient of $Q_{i-1}(x)'$ is provided at output 652 at the same time as the second highest degree coefficient from path 640 is provided at output 650. The lead coefficient out of output 650 is dropped because it is ignored by the succeeding R-Q calculator cell 514. It is ignored because it only took two clock cycles to pass this lead coefficient to output 650. The trigger circuit 516, discussed below, does not trigger the succeeding cell 502 until 3 clock cycles have passed. Accordingly, in this circumstance the trigger circuit 516 causes the succeeding cell 502 to clock in the second coefficient out of path 640 and the lead coefficient of $Q_{i-1}(x)'$.

If the leading coefficient of $Q_{i-1}(x)'$ is zero, multiplexors 632 and 634 will pass to their respective outputs 650 and 652 the data from the $R(x)$ bypass path 638 and the data from the $Q(x)$ bypass path 644. By doing so, $R_i(x)$ will be $R_{i-1}(x)'$. In this case, the leading zero coefficient of $Q_{i-1}(x)'$ is being dropped. By bypassing delay 630, the lead coefficient of $Q_{i-1}(x)'$ is passed out of output 652 in two clock cycles. Accordingly, it is dropped in the same manner as the lead coefficient of $R_{i-1}(x)'$ when the lead coefficient of $Q_{i-1}(x)'$ is not zero. When the lead coefficient of $Q_{i-1}(x)'$ is zero, equations (12)–(15) are not implemented. Rather, the coefficients are passed without calculation as shown in FIG. 6.

R-Q calculator 512 only drops at most one zero coefficient of $R_i(x)$ or $Q_i(x)$ as appropriate. Accordingly, zero coefficients of $R_i(x)$, and $Q_{i(x)}$ having a degree below the dropped zero coefficient of each of these polynomials are not dropped. Such zero coefficients must be clocked into the memory elements of the calculation circuits to maintain proper timing to provide the proper calculations. As we will describe, this feature has enabled the R-Q degree calculators to be designed so that they reduce the degree of deg $(R_{i-1}(x))$ or deg $(Q_{i-1}(x))$ by at most one.

Error Locator Polynomial Calculator—Trigger Circuit

Figure 7:
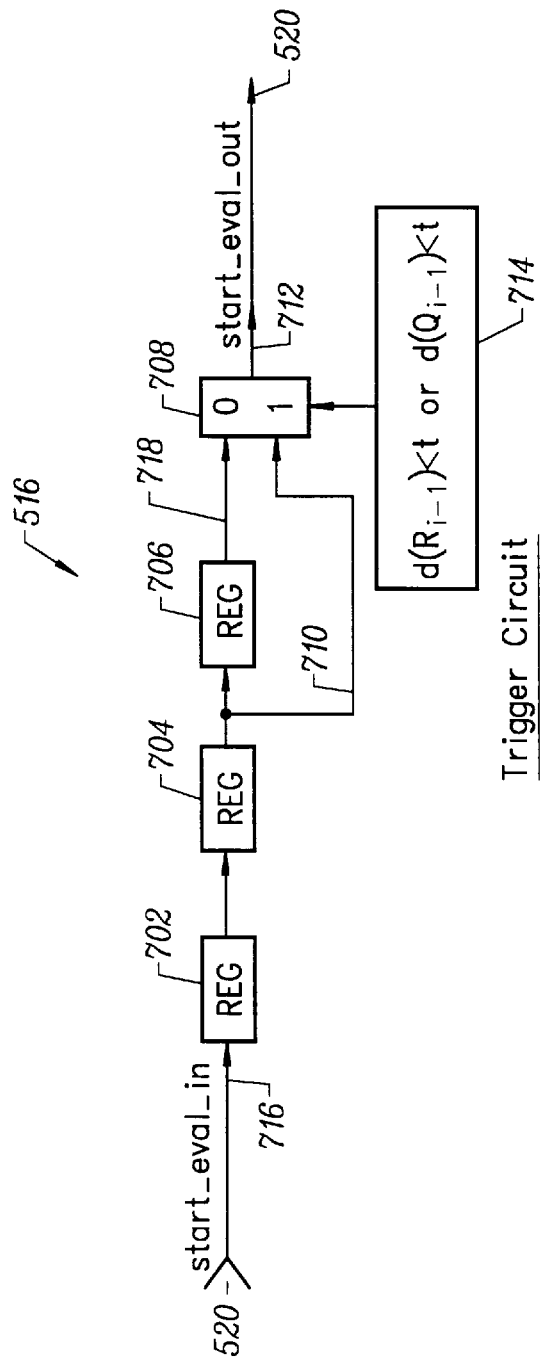
FIG. 7 illustrates a trigger circuit 516 used in the error locator polynomial calculator of FIG. 5.

FIG. 7 illustrates the trigger circuit cell 516 used by the present embodiment. The trigger circuit cell 516 of each preceding cell 502 signals each succeeding cell 502 to indicate that valid data is present at the inputs of the succeeding cell and that the succeeding cell should start the calculations using that data. Accordingly, for example, the trigger circuit cell 516A signals cell 502B to begin calculations; trigger circuit cell 516B signals cell 502C to begin calculations and so on. The trigger signal is applied to each cell 502 using a one bit trigger line 520. The trigger circuit 516A of the first cell 502A is triggered by a controller of the syndrome calculator (not shown) after the syndrome polynomial has been calculated by calculator 304. The trigger circuit output "start_eval_out" of the last cell 502P signals the standard error locator polynomial calculator 312 to start calculating the standard error locator polynomial from the coefficients provided out of output 530 (FIG. 5). Start_eval_out of FIG. 7 is coupled to "start_calc_in" of FIG. 10.

As illustrated in FIG. 7, the cell 516 provides an adaptable delay of two clocks cycles or three clock cycles. In particular, this cell includes memory elements 702, 704 and 706. These memory elements are similar to the memory elements described previously in that they provide to their outputs the data they store. When these memory elements are clocked by a clock signal (not shown), they store the data present at their respective inputs. Rather than being 8 bit registers, however, these memory elements are single bit registers.

The input of memory element 702 provides the input of trigger circuit cell 516. The output of memory element 702 is coupled to the input of memory element 704. The output of memory element 704 is coupled to multiplexor 708 either through bypass path 710 or through delay path 718. Bypass path 710 couples the output of memory element 704 to a first input of multiplexor 708 without delay. Delay path 718 couples the output of memory element 704 to the input of memory element 706 and the output of memory element 706 to a second input of multiplexor 708. The output 712 of the multiplexor 708 provides the output of the trigger circuit cell 516. The trigger circuit cell requires two cycles to clock a trigger signal (e.g. a high logic level) from the input 716 to the output 712 when the bypass path 710 is activated. The trigger circuit cell requires three cycles to clock a trigger signal from the input 716 to the output 712 when the delay path 718 is activated. In particular, the delay path 718 introduces a delay of one additional clock cycle.

The control circuit 714 determines if deg $(R_{i-1}(x))$ or deg $(Q_{i-1}(x))$ coming into a particular cell 502 is less than t. If the degree of neither of these polynomials is less than t, the delay produced by trigger circuit 516 will be three clock cycles. This three clock cycle delay is the delay that drops coefficients in the manner we have described. When the leading zero coefficient of $R(x)$ is dropped, the degree of $R_i(x)$ is reduced by one from the polynomial $R_{i-1}(x)'$. When the leading zero coefficient of $Q(x)$ is dropped, the degree of $Q_i(x)$ is reduced by one from $Q_{i-1}(x)'$.

If the degree of either of these polynomials is less than t, the delay produced by trigger circuit 516 will be two clock cycles. As we have explained above, in the initial R-Q calculator cells of the calculator 310 illustrated in FIG. 5, such as cell 502A, the degree of both $R_{i-1}(x)$ and $Q_{i-1}(x)$ will be greater than t. A three clock cycle delay in the trigger circuit is necessary for proper operation of the R-Q calculators under these circumstances. As we will explain below, however, when the degree of either $R_{i-1}(x)$ or $Q_{i-1}(x)$ drops below t, the $\lambda$-$\mu$ calculator cells 518 pass the $\lambda(x)$ polynomial and the $\mu(x)$ polynomial without subjecting them to further calculations. Accordingly, the delay of the trigger circuit cells 516 is shortened to match the delay of the $\lambda$-$\mu$ calculator cells when they are in this mode of operation. The trigger circuit cells 516 must trigger the standard error locator polynomial calculator 312 at the appropriate time to clock in the coefficients of the error locator polynomial $\lambda(x)$.

This timing between the trigger circuit and the R-Q calculator cells ensures that the degree of $R_{i-1}(x)$ or $Q_{i-1}(x)$ will be reduced by one, but by no more than one in each cell 502. For example, if the calculation of equations (12) and (13) produces the polynomial $0x^3+0x^2+x+1$, the degree will only be reduced by one, and the polynomial $0x^2+x+1$ will be passed to the subsequent cell. In particular, the trigger circuit timing is such that the $0x^3$ term is dropped. The 0 coefficient of the $x^2$ term would be clocked into the subsequent R-Q calculator, however, just as a non-zero coefficient of $x^2$ would be. This feature of the present embodiment simplifies the design of the degree calculator cells 512.

The correspondence between the timing of the trigger circuit of FIG. 7 and of the R-Q calculator of FIG. 6 can be illustrated as follows. Assume $Q_{i-1}(x)'$ is not zero. In this situation, the leading coefficients of $R_{i-1}(x)$ and $Q_{i-1}(x)$ are clocked into the memory elements 602 and 606, respectively, by a first clock cycle. This clock cycle corresponds to the trigger bit being clocked into memory element 702 of the FIG. 7 trigger circuit cell. The leading coefficients of $R_{i-1}(x)$ and $Q_{i-1}(x)$ are clocked into the memory element 604 and 608, respectively, by a second clock cycle. This clock cycle corresponds to the trigger bit being clocked into memory element 704 of the FIG. 7 trigger circuit cell. Once the leading coefficients of $R_{i-1}(x)$ and $Q_{i-1}(x)$ are clocked into memory elements 604 and 608, the leading zero coefficient produced by calculation path 640 is applied out of output 650 to the input of the R-Q calculator in the succeeding cell 502. The memory element 630 prevents the leading coefficient of $Q_{i-1}(x)'$ from being applied out of output 652 to the input of the R-Q calculator in the succeeding cell 502 by this second clock cycle. A third clock cycle, however, will pass the leading coefficient of $Q_{i-1}(x)'$ out of output 652 to the input of the memory element 606 of the R-Q calculator in the succeeding cell 502. This same third clock cycle will clock the second coefficient of $R_{i-1}(x)$ and $Q_{i-1}(x)$ into memory elements 604 and 608 so that the appropriate second coefficient is applied out of output 650 to the input of memory element 602 of the R-Q calculator in the succeeding cell 502. This third clock cycle will also cause the trigger bit to be clocked into the memory element 706 of the trigger circuit cell of FIG. 7 and out of output 712. The trigger bit passed out of the output 712 triggers the succeeding cell 502. Accordingly, the leading coefficient of $Q_{i-1}(x)'$ and the second coefficient produced by calculation path 640 will be latched into the memory elements 606 and 602, respectively, of the succeeding R-Q calculator cell 514. The leading zero coefficient produced by calculation path 640 was dropped because it was not latched into the succeeding cell 514.

Error Locator Polynomial Calculator—R-Q Degree Calculator

Figure 8:
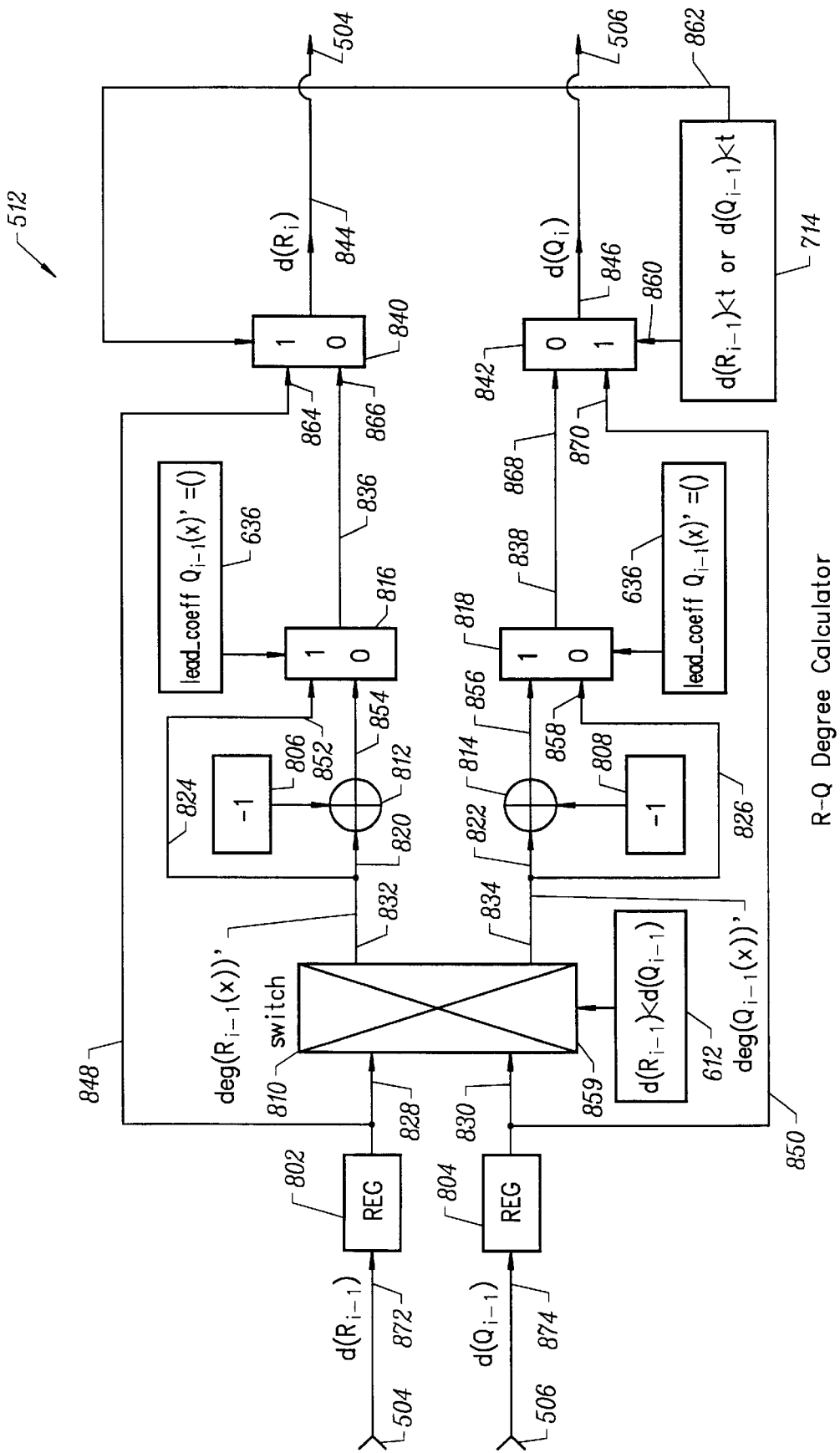
FIG. 8 illustrates an R-Q degree calculator cell 512 used in the error locator polynomial calculator of FIG. 5.

FIG. 8 illustrates an R-Q degree calculator cell 512. The R-Q degree calculator cells 512 calculate the degree of the polynomials $R_i(x)$ and $Q_i(x)$ from the degree of the polynomials $R_{i-1}(x)$ and $Q_{i-1}(x)$. Accordingly, the degree of $R_0(x)$ is input into the degree calculator cell 512A on bus 504 and the degree of $R_1(x)$ is output. Similarly, the degree of $Q_0(x)$ is input into the degree calculator cell 512A on bus 506 and the degree of $Q_1(x)$ is output. The degree of $R_i(x)$ and $Q_i(x)$ will be less than or equal to the degree of $R_{i-1}(x)$ and $Q_{i-1}(x)$, respectively. The degree calculator cells 512B to 512P in cells 502B to 502P operate similarly. As demonstrated by the initial conditions, (1) to (6), in the present embodiment the degree of $R_0(x)$ is 16 (2t), and the degree of $Q_0(x)$ is 15 (2t-1). Because the maximum degree is 16, the bus lines 504 and 506 in FIG. 5 are five bit buses.

Cell 512 includes memory elements 802 and 804, switch 810, multiplexors 816, 818, 840 and 842, R(x) reduction path 820, R(x) reduction bypass path 824, Q(x) reduction path 822 and Q(x) reduction bypass path 826. The R(x) reduction path 820 and the R(x) reduction bypass path 824 shall collectively be referred to as the R(x) degree processing path, and the Q(x) reduction path 822 and the Q(x) reduction bypass path 826 shall collectively be referred to as the Q(x) degree processing path. The cell 512 also includes the R(x) degree processing bypass path 848 and the Q(x) degree processing bypass path 850. The memory elements 802 and 804 are implemented as 5 bit registers each of which provide the data that they are storing to their respective output. When these memory elements are clocked by a clock signal (not shown), they store the data present at their respective inputs. Control circuits 612, 636 and 714 provide control signals to control the switch 810 and the multiplexors 816, 818, 840 and 842. All of the buses of degree calculator cell 512 except control lines 859, 860 and 862 are 5 bit paths. Control lines 859, 860 and 862 are single bit lines. Other embodiments can use other bus widths, as appropriate.

The input of memory elements 802 and 804 provide the inputs 872 and 874, respectively. The output of memory element 802 is coupled to an input 828 of switch 810 and to degree processing bypass path 848. Degree processing bypass path 848 is coupled to an input 864 of multiplexor 840. The output of memory element 804 is coupled to an input 830 of switch 810 and to degree processing bypass path 850. Degree processing bypass path 850 is coupled to an input 870 of multiplexor 842.

Switch 810 operates in the same manner as switch 610 in FIG. 6. In particular, degree calculator 512 uses the same control circuit 612 that was used by R-Q calculator 514 to determine if the deg $(R_{i-1}(x))$ is less than deg $(Q_{i-1}(x))$. If so, the control circuit 612 provides a first control signal to switch 810. If not, it provides a second control signal to switch 810. In response to the first control signal, switch 810 couples its input 828 to its output 834 and couples its input 830 to its output 832. In response to the second control signal, switch 810 couples its input 828 to its output 832 and couples its input 830 to its output 834.

The output 832 of switch 810 is coupled to the R(x) degree processing path. In particular, output 832 is coupled to the R(x) reduction path 820 and to the R(x) reduction bypass path 824. The R(x) reduction bypass path 824 is coupled to an input 852 of multiplexor 816, and the R(x) reduction path 820 is coupled to an input 854 of multiplexor 816. Similarly, the output 834 of switch 810 is coupled to the Q(x) degree processing path. In particular, output 834 is coupled to the Q(x) reduction path 822 and to the Q(x) reduction bypass path 826. The Q(x) reduction path 822 is coupled to an input 856 of multiplexor 818, and the Q(x) reduction bypass path 826 is coupled to an input 858 of multiplexor 818. Multiplexors 816 and 818 are controlled by the same control circuit 636 that was used by the R-Q calculator cell 514 of FIG. 6. This control circuit 636 provides a first control signal to these multiplexors if the lead coefficient of $Q_{i-1}(x)'$ is zero and a second control signal to these multiplexors if the lead coefficient of $Q_{i-1}(x)'$ is not zero. In response to the first control signal, multiplexors 816 and 818 couple their inputs 852 and 856 to their outputs 836 and 838, respectively. In response to the second control signal, multiplexors 816 and 818 couple their inputs 854 and 858 to their outputs 836 and 838, respectively. The output 836 of the multiplexor 816 is coupled to the input 866 of multiplexor 840. The output 838 of the multiplexor 818 is coupled to the input 868 of the multiplexor 842.

Control circuit 714 provides to multiplexors 840 and 842 a first control signal if either of deg $(R_{i-1}(x))$ or deg $(Q_{i-1}(x))$ is less than t. Control circuit 714 provides to multiplexors 840 and 842 a second control signal if neither of deg $(R_{i-1}(x))$ or deg $(Q_{i-1}(x))$ is less than t. In response to the first control signal, multiplexors 840 and 842 couple their inputs 864 and 870 to their outputs 844 and 846, respectively. In response to the second control signal, multiplexors 840 and 842 couple their inputs 866 and 868 to their outputs 844 and 846, respectively.

As we have noted, the deg $(R_{i-1}(x))$ and deg $(Q_{i-1}(x))$ can be reduced by at most one in the R-Q calculator cell 514. Accordingly, the degree calculator need only reduce the degree of the appropriate polynomial by one. While the R(x) degree reduction path is shown to include an adder 812 and a stored value of −1, a decrementer may be used to accomplish this operation. Alternatively, embodiments of the invention may use a binary adder (rather than a modulo 2 adder) to implement this function. In such an embodiment, the −1 value can be stored in a 5 bit register similar to those used elsewhere in this invention. Other storage techniques, such as some kind of ROM could be used. The output 832 of switch 810 provides a first input to the adder and the stored −1 data provides the second input to the adder. The output of the adder will provide the degree applied to the first adder input reduced by one. The Q(x) degree reduction path operates similarly.

In operation, deg $(R_{i-1}(x))$ is applied at input 872, and deg $(Q_{i-1}(x))$ is applied at input 874. Deg $(R_{i-1}(x))$ and deg $(Q_{i-1}(x))$, each a 5 bit word, are known from the output of a preceding degree calculator cell 512 or from the initial conditions. When clocking this data into memory elements 802 and 804, switch 810 and multiplexors 816, 818, 840 and 842 are configured.

Control circuit 612 compares deg $(R_{i-1}(x))$ and deg $(Q_{i-1}(x))$. If deg $(R_{i-1}(x))$<deg $(Q_{i-1}(x))$ then the first control signal is applied to switch 810, coupling input 828 to output 834 and input 830 to output 832. If deg $(R_{i-1}(x))$ is not less than deg $(Q_{i-1}(x))$, then the second control signal is applied to switch 810, coupling input 828 to output 832 and input 830 to output 834. The data output at output 832 shall be called deg $(R_{i-1}(x))'$. The data output at output 834 shall be called deg $(Q_{i-1}(x))'$.

Control circuit 636 determines if the lead coefficient of $Q_{i-1}(x)'$ in the same cell 502 is equal to 0. If this lead coefficient is zero, the first control signals are applied to multiplexors 816 and 818, coupling the input 852 to the output 836 and the input 856 to the output 838. If the lead coefficient is not zero, the second control signals are applied to multiplexors 816 and 818, coupling the input 854 to the output 836 and the input 858 to the output 838.

Control circuit 714 determines if deg $(R_{i-1}(x))$<t or if deg $(Q_{i-1}(x))$<t. If so, then the first control signals from circuit 714 are applied to multiplexors 840 and 842, configuring them as we have described. If neither of deg $(R_{i-1}(x))$<t and deg $(Q_{i-1}(x))$<t, then the second control signals from circuit 714 are applied to multiplexors 840 and 842, configuring them as we have described.

The calculator 512 is configured in this manner during a first clock cycle. Also, the first clock cycle clocks deg $(R_{i-1}(x))$ into memory element 802 and clocks deg $(Q_{i-1}(x))$ into memory element 804. Deg $(R_i(x))$ is output from output 844 and deg $(Q_i(x))$ is output from output 846. Calculator 512 passes the data according to the configurations of switch 810 and multiplexors 816, 818, 840 and 842.

Multiplexors 816 and 818 cause the degree reduction accomplished by cell 512 to track the degree reduction accomplished by the R-Q calculator cell 514 in the same cell 502. Thus, for example, if the leading coefficient of $Q_{i-1}(x)'$ is not zero, then the R-Q degree calculator uses path 820 to reduce the deg $(R_{i-1}(x))'$ by one and uses bypass path 826 to not reduce the deg $(Q_{i-1}(x))'$. If the leading coefficient of $Q_{i-1}(x)'$ is zero, on the other hand, then the R-Q calculator uses the path 822 to reduce deg $(Q_{i-1}(x))'$ by one and uses bypass path 826 to not reduce deg $(R_{i-1}(x))'$. The degree reduction calculator cell 512 accomplishes its calculations and provides the results to its outputs 844 and 846 in one clock cycle. The results are provided at these outputs to be clocked into the subsequent cell 502.

Processing bypass paths 848 and 850 paths are used when deg $(R_{i-1}(x))$ or deg $(Q_{i-1}(x))$ is less than t. Under such circumstances, the degree calculator does not further reduce deg $(R_{i-1}(x))$ and deg $(Q_{i-1}(x))$, but passes them unchanged to the outputs of the last degree calculator cell 512P as deg $(R_{final})$ and deg $(Q_{final})$ The value of deg $(R_{final})$ is used by control circuit 528 in FIG. 5 to configure multiplexor 526 as we have described.

Error Locator Polynomial Calculator—$\lambda$-$\mu$ Calculator

Figure 9:
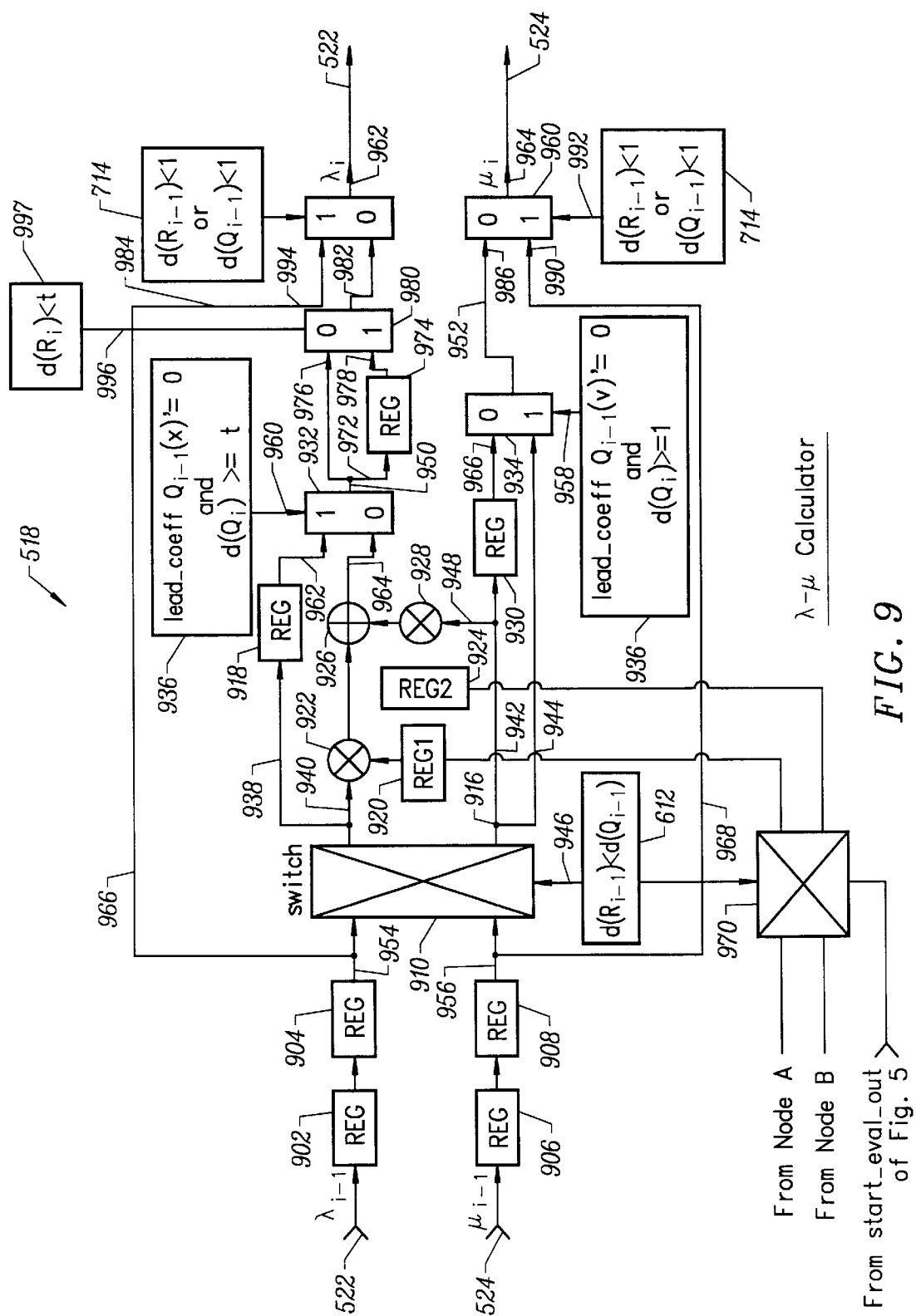
FIG. 9 illustrates the $\lambda$-$\mu$ calculator cell 518 used in the error locator polynomial calculator of FIG. 5.

FIG. 9 illustrates $\lambda$-$\mu$ calculator cell 518. The $\lambda$-$\mu$ calculator cell 518 in each cell 502 calculates the polynomials $\lambda_i(x)$ and $\mu_i(x)$ from the polynomials $\lambda_{i-1}(x)$ and $\mu_{i-1}(x)$ using the following equations.

$$\lambda_i(x)=[\sigma_{i-1}b_{i-1}\lambda_{i-1}(x)+\overline{\sigma}_{i-1}a_{i-1}\mu_{i-1}(x)]-x^{|1_{i-1}|}[\sigma_{i-1}a_{i-1}\mu_{i-1}(x)+\overline{\sigma}_{i-1}b_{i-1}\lambda_{i-1}(x)] \quad (16)$$

$$\mu_i(x)=\sigma_{i-1}\mu_{i-1}(x)+\overline{\sigma}_{i-1}\lambda_{i-1}(x) \quad (17)$$

where $a_{i-1}$ and $b_{i-1}$ are still the leading non-zero coefficients of $R_{i-1}(x)$ and $Q_{i-1}(x)$, respectively. As these equations demonstrate, $\lambda_i(x)$ is calculated in the same manner as $R_i(x)$, and $\mu_i(x)$ is calculated in the same manner as $Q_i(x)$. Accordingly, when the degree of $R_{i-1}$ (x) is greater than or equal to the degree of $Q_{i-1}$ (x), these equations reduce to $$\lambda_i(x)=b_{i-1}\lambda_{i-1}(x)-x^{|1_{i-1}|}a_{i-1}\mu_{i-1}(x) \quad (18)$$

$$\mu_i(x)=\mu_{i-1}(x) \quad (19)$$

When the degree of $R_{i-1}$ (x) is less than the degree of $Q_{i-1}$ (x), these equations reduce to $$\lambda_i(x)=a_{i-1}\mu_{i-1}(x)-x^{|1_{i-1}|}b_{i-1}\lambda_{i-1}(x) \quad (20)$$

$$\mu_i(x)=\lambda_{i-1}(x) \quad (21)$$

Cells 518 implement the reduced equations (18) and (19) or (20) and (21), again, depending on the relative values of deg$(R_{i-1}(x))$ and deg$(Q_{i-1}(x))$. With reference to FIG. 5, $\lambda_{i-1}(x)$ and $\mu_{i-1}(x)$ are input into each of the respective $\lambda$-$\mu$ calculator cells 518A to 518P on bus lines 522 and 524, respectively, and $\lambda_i(x)$ and $\mu_i(x)$ are output on bus lines 522 and 524, respectively, from the $\lambda$-$\mu$ calculator cell into which $\lambda_{i-1}(x)$ and $\mu_{i-1}(x)$ were input. Thus, for example, $\lambda_0(x)$ and $\mu_0(x)$ are input into calculator cell 518A on buses 522 and 524, respectively, calculations are performed and $\lambda_1(x)$ and $\mu_1(x)$ are output on the respective buses 522 and 524. Similarly, $\lambda_1(x)$ and $\mu_1(x)$ are input into calculator cell 518B on buses 522 and 524, respectively, calculations are performed and $\lambda_2(x)$ and $\mu_2(x)$ are output on the buses 522 and 524. Cells 518C to 518P operate similarly to produce $\lambda_3(x)$ through $\lambda_{15}(x)$ and $\mu_3(X)$ to $\mu_{15}(x)$.

With reference to FIG. 9, cell 518 operates in basically the same manner as the R-Q calculator cell 514. Accordingly, the description of cell 518 focuses on the differences. Elements numbered in FIG. 9 with a 900 series number operate in a similar manner to the corresponding 600 series element of FIG. 6.

Similar to calculator 514, $\lambda_{-1}(x)$ is clocked through memory elements 902 and 904, and $\mu_{-1}(x)$ is clocked through memory elements 906 and 908. Switch 910 operates in the same manner as switch 610 and is controlled by the same control circuit 612. The $\lambda'(x)$ calculation path 940 and the $\lambda'(x)$ bypass path 938 (collectively referred to as the $\lambda(x)$ processing path) operate in a similar manner to the R'(x) calculation path 640 and the R'(x) bypass path 638. The $\mu'(x)$ delay path 942 and the $\mu'(x)$ bypass path 944 (collectively referred to as the $\mu(x)$ processing path) operate in a similar manner to the Q'(x) delay path 642 and the Q'(x) bypass path 644, respectively. The control circuit 936 provides control signals to the $\lambda'$ multiplexor 932 and to the $\mu'$ multiplexor 934. Control circuit 936 operates differently than control circuit 636. In particular, control circuit 936, in addition to testing to determine if the leading coefficient of $Q_{i-1}(x)'$ is zero, also tests to determine if deg $(Q_i(x))$ is greater than or equal to t. Deg $(Q_i(x))$ is the degree of $Q_i(x)$ as output from output 652 of the degree calculator 512 in the same cell 502 as the present $\lambda$-$\mu$ calculator (e.g., the $\lambda$-$\mu$ calculator in cell 502A uses the output deg $(Q_i(x))$ from the degree calculator in cell 502A). Due to the lower number of clock cycles required by the degree calculator cell 512, the cell 512 will have calculated deg $(Q_i(x))$ in time for control circuit 936 to test it and to configure the multiplexors 932 and 934. This additional condition tested by control circuit 936 operates such that if either the lead coefficient of $Q_{i-1}(x)'$ is not zero or deg $(Q_i(x))<t$, then the lead coefficient of $\lambda_{i-1}(x)'$ will be dropped rather than the lead coefficient of $\mu_{i-1}(x)'$. In particular, $\lambda'$ multiplexor 932 will pass the data from $\lambda(x)$ processing path 940, and $\mu'$ multiplexor 934 will pass the data from $\mu'(x)$ delay path 942. The delays 918 and 930 create timing in conjunction with trigger circuit 516 in the same manner as was done in R-Q calculator 514, except the delay adjustment circuit, which includes delay element 974, delay bypass path 971 and delay adjustment multiplexor 980 prevent the lead coefficient of $\lambda_{i-1}(x)'$ from being dropped under some circumstances. In particular, the delay element 974 operates to prevent the lead coefficient of $\lambda_{i-1}(x)'$ from being dropped when deg $(R_i(x))<t$. When deg$(R_i(x))$ (i.e. the degree just calculated in an R-Q degree calculator cell of a particular cell 502) is less than t, then the lead coefficient of $\lambda_{i-1}(x)'$ should not be dropped in the $\lambda$-$\mu$ calculator of that same cell 502. Accordingly, control circuit 997 provides a control signal based upon the comparison of deg $(R_i(x))$ and t to cause the data to travel through delay element 974. As a result of the insertion of this delay element, the lead coefficients of the polynomials calculated by the $\lambda$-$\mu$ calculator will be provided out of outputs 962 and 964 during the same clock cycle. Accordingly, no coefficients of either polynomial will be dropped.

The $\lambda$ processing bypass path 966 is coupled between the $\lambda$ switch input 954 of switch 910 and input 984 to $\lambda$ bypass multiplexor 958. The g processing bypass path 968 is coupled between the $\mu$ switch input 956 of switch 910 and input 990 to the $\mu$ bypass multiplexor 960. The input 982 of $\lambda$ bypass multiplexor 958 is coupled to the output of delay adjustment multiplexor 980. The input 986 of $\mu$ bypass multiplexor 960 is coupled to the output 952 of $\mu'$ multiplexor 934. $\lambda$ and $\mu$ processing bypass paths 966 and 968 are used when deg $(R_{i-1}(x))$ or deg $(Q_{i-1}(x))$ is less than t. Under such circumstances, the $\lambda$-$\mu$ calculator cell 518 does not perform any additional calculations on $\lambda_{i-1}(x)$ and $\mu_{i-1}(x)$. Under such circumstances, $\lambda_{i-1}(x)$ and $\mu_{i-1}(x)$ are $\lambda_{final}(x)$ and $\mu_{final}(x)$. Accordingly, they are passed to the inputs of multiplexor 526 (of FIG. 5) by the $\lambda$ and $\mu$ bypass paths 966 and 968 in any cells 502 succeeding the calculation of $\lambda_{final}(x)$ and $\mu_{final}(x)$. As described, either $\lambda_{final}(x)$ or $\mu_{final}(x)$ is the error locator polynomial $\lambda_{FINAL}(x)$. Accordingly, no additional calculations are performed on them because any additional calculations would corrupt the calculated error locator polynomial. Bypass paths such as paths 966 and 968 were not needed in the R-Q calculator 514 because once the error locator polynomial has been determined, the present embodiment no longer uses the polynomials calculated by the R-Q calculator. Accordingly, it does not matter if the R-Q calculator continues to perform calculations. The $\lambda$ and $\mu$ bypass paths 966 and 968 are activated by control signals provided to the $\lambda$ and $\mu$ bypass multiplexor's 958 and 960 by the control circuit 714. This control circuit provides a first control signal to each of multiplexor's 958 and 960 when one of deg $(R_{i-1}(x))$ and deg $(Q_{i-1}(x))$ is less than t. It provides a second control signal to each of multiplexor's 958 and 960 when neither of deg $(R_{i-1}(x))$ and deg $(Q_{i-1}(x))$ is less than t. When the first control signal is provided, the inputs 984 and 990 of multiplexors 958 and 960 are coupled to their respective outputs 962 and 964. When the second control signal is provided, the inputs 982 and 986 of multiplexors 958 and 960 are coupled to their respective outputs 962 and 964. All of the buses in calculator 518 are 8 bits wide except control lines 946, 958, 960, 992, 994 and 996. These control lines are one bit lines.

Similar to the R-Q calculator, the data stored in memory element 920 will either be $a_{i-1}$, the leading coefficient of $R_{i-1}1(x)$, or $b_{i-1}$, the leading coefficient of $Q_{i-1}(x)$. This data will be $a_{i-1}$ when deg$(R_{i-1}(x))$ is less than deg$(Q_{i-1}(x))$ and will be $b_{i-1}$, when deg$(R_{i-1}(x))$ is not less than deg$(Q_{i-1}(x))$. The data stored in memory element 924 will also be either $a_{i-1}$ or $b_{i-1}$. This data will be $b_{i-1}$ when deg$(R_{i-1}(x))$ is less than deg$(Q_{i-1}(x))$ and will be $a_{i-1}$ when deg$(R_{i-1}(x))$ is not less than deg$(Q_{i-1}(x))$. Another way of describing the data stored in memory elements 920 and 924 is that the data in memory element 920 is $b_{i-1}'$, the leading coefficient of $Q_{i-1}(x)'$, and the data in memory element 924 is $a_{i-1}'$, the leading coefficient of $R_{i-1}(x)'$.

If deg$(R_{i-1}(x))$ is greater than or equal to deg$(Q_{i-1}(x))$, then $\lambda_{i-1}(x)'=\lambda_{i-1}(x)$, $\mu_{i-1}(x)'=\mu_{i-1}(x)$. As a result, the calculator cell 518 implements equations (18) and (19). Memory element 920 contains $b_{i-1}'$ (which in the case of is $b_{i-1}$) and memory element 924 contains $a_{i-1}'$ (which in this case is $a_{i-1}$). These values provide the cross multiplication shown in equations (18) and (19). Because adder 926 is a modulo two adder, addition is the same as subtraction. Accordingly, adder 926 provides the subtraction shown in equations (18) and (19). In the present embodiment, the appropriate values of $a_{i-1}$ and $b_{i-1}$ are loaded into the memory elements 920 and 924 by control circuit 970 which reads $a_{i-1}$ and $b_{i-1}$ from the output of memory elements 602 and 606 at nodes A and B. Control circuit 970 is triggered by the start_eval_out signal from FIG. 5. It uses a signal from control circuit 612 to determine the appropriate one of memory elements 920 and 924 to which each of the coefficients is supplied.

If deg($R_{i-1}(x)$) is less than deg($Q_{i-1}(x)$), then $\lambda_{i-1}(x)'=\mu_{i-1}(x)$, $\mu_{i-1}(x)'=\lambda_{i-1}(x)$. As a result, the calculator cell 518 implements equations (20) and (21). In that situation, memory element 920 is loaded with $b_{i-1}'$ (which in this case is $a_{i-1}$) and memory element 924 is loaded with $a_{i-1}'$ (which in this case is $b_{i-1}$). This loading occurs during the delays introduced by elements 904 and 908 and again is accomplished by control circuit 970. Once control circuit 612 completes it's test, the appropriate coefficients are routed to and clocked into memory elements 920 and 924. The data loaded into memory elements 920 and 924 is obtained by the control circuit 970 from the R-Q calculator circuit 514 shown in FIG. 6. In particular, this data is obtained from nodes A and B shown in FIG. 6.

Standard Error Locator Polynomial Calculator

Figure 10:
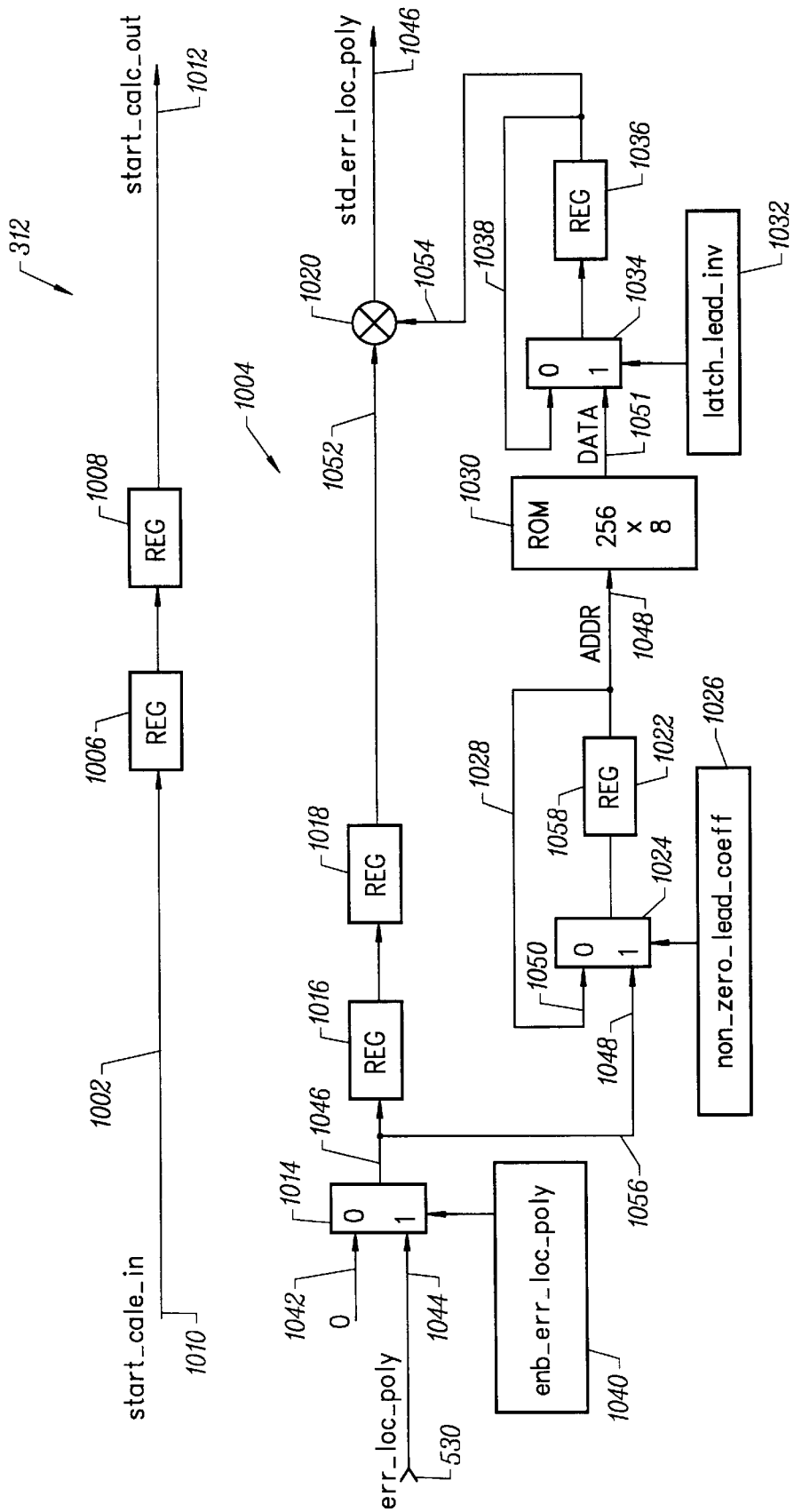
FIG. 10 illustrates the standard error-locator polynomial calculator circuit 312 used by the decoder of FIG. 3.

FIG. 10 illustrates a standard error locator polynomial calculator circuit 312 that is used by the present embodiment. This calculator circuit 312 includes a trigger circuit 1002 and a standard polynomial calculator 1004. As we have noted, the standard error locator polynomial calculator 312 calculates σ(x) from λ(x).

$$\sigma(x)=\sigma_0 x^8+\sigma_1 x^7+\sigma_2 x^6+\ldots \sigma_8$$

where $\sigma_k=\lambda_k/\lambda_{lnz}$ $0 \leq k \leq t$ where $\sigma_k$ represents the coefficients of σ(x), $\lambda_{lnz}$ is the highest order non-zero coefficient of λ(x) and λ(x) is the error locator polynomial calculated by the calculator 310 and output on output 530 in FIG. 5. Accordingly, the circuit 312 divides the error locator polynomial λ(x) by its leading (highest degree) non-zero coefficient.

The trigger circuit 1002 includes a memory element 1006 and a memory element 1008. These memory elements are single bit registers that provide to their output the data that they store. When these memory elements are clocked by a clock signal (not shown), they store the data present at their respective inputs. These memory elements are operating as delays. The input 1010 of the memory element 1006 provides the input of the trigger circuit 1002. This input 1010 is coupled to the "start_eval_out" output shown in FIG. 5. The output of the memory element 1006 is coupled to the input of the memory element 1008. The output 1012 of the memory element 1008 provides the output of the trigger circuit. The trigger circuit 1002 does not affect the operation of the standard polynomial calculator. It passes the trigger signal to the error transform calculator 314. The bus lines in the trigger circuit 1002 are single bit lines.

The standard polynomial calculator 1004 includes a multiplexor 1014 having an input 1044 and an input 1042. The input 1044 is coupled to the output 530 of the error locator polynomial calculator 310 of FIG. 5. This input 1044 receives the coefficients of the error locator polynomial as they are provided at the output 530 of the error locator polynomial calculator 310. The input 1042 is coupled to a zero logic level. The multiplexor 1014 is controlled by the control circuit 1040. This circuit 1040 provides first and second control signals to the multiplexor 1014 in response to a trigger signal applied at the input 1010. In response to the first control signal, the multiplexor 1014 couples its input 1044 to its output 1046 and isolates its input 1042 from its output 1046. In response to the second control signal, the multiplexor 1014 couples its input 1042 to its output 1046. The second control signal is applied to the multiplexor 1014 until the trigger signal is received from start_eval_out line of the error locator polynomial calculator 310. At this point, the control circuit 1040 applies the first control signal to the multiplexor 1014.

The output 1046 of the multiplexor 1014 is coupled to the input of a memory element 1016. The output of memory element 1016 is coupled to the input of memory element 1018. The output of memory element 1018 is coupled to an input 1052 of multiplier 1020. Multiplier 1020 is a Galois field multiplier.

Inverter path 1056 is coupled between the output 1046 of multiplexor 1014 and the input 1054 of multiplier 1020. Inverter path 1056 is formed as follows. The output 1046 is coupled to an input 1048 of multiplexor 1024. The output of the multiplexor 1024 is coupled to an input of a memory element 1022. The memory elements 1016, 1018 and 1022 are 8 bit registers that provide at their outputs the data that they are storing. When each of these memory elements is clocked by a clock signal (not shown), they store the data present at their respective inputs. The output of the memory element 1022 is coupled to an input of a memory element 1030. The output of memory element 1022 is also coupled by feedback path 1028 to the input 1050 of multiplexor 1024.

Memory element 1030 is a 256 byte ROM. This ROM receives at its address input 1048 an 8 bit binary word. The 8 bits of data stored in the ROM at the address represented by this 8 bit word are the reciprocal (using Galois field arithmetic) of the 8 bit word. Accordingly, the data provided at the output 1051 is the reciprocal of the data provided at the input 1048. In the present embodiment, when a zero byte is present at the input of ROM 1030, ROM 1030 outputs a zero byte. This ROM is used to divide the coefficients of the error locator polynomial $\lambda_{FINAL}(x)$ by the leading non-zero coefficient. ROM 1030 is a fast ROM. In particular, it receives a read address at its input 1048 and provides the data from that address to its output 1050 in the same clock cycle. This timing synchronizes passage of coefficients through memory elements 1016 and 1018 with the parallel passage of data through inverter path 1056.

The coefficients of $\lambda_{FINAL}(x)$ are received at input 1044 from the output 530 of FIG. 5. The trigger signal applied to input 1010 is also used to inform the control circuit 1026 in which cycle the leading coefficient of $\lambda_{FINAL}(x)$ is present at the input 1044. After being signalled that the coefficients of $\lambda_{FINAL}(x)$ are being received, the control circuit 1026 tests to determine when the leading non-zero coefficient of $\lambda_{FINAL}(x)$ is received. The control circuit 1026 provides a first control signal to the multiplexor 1024 during the clock cycle in which the circuit 1026 detects on input 1044 the highest degree non-zero coefficient of $\lambda_{FINAL}(x)$. The second control signal to the multiplexor 1024 is provided during all other clock cycles. In response to the first control signal, multiplexor 1024 passes the data from its input 1048 to its output. In response to the second control signal, multiplexor 1024 passes the data from its input 1050 to its output. Accordingly, multiplexor 1024 transmits the data from its input 1048 to its output only during the clock cycle in which the leading non-zero coefficient of $\lambda_{FINAL}(x)$ is present at its input 1048. In subsequent clock cycles, after this leading non-zero coefficient is stored in memory element 1022, multiplexor 1024 couples the output of memory element 1022 to its input 1050 and the input 1050 to the input of memory element 1022 so that memory element 1022 maintains the leading non-zero coefficient.

The output of the memory element (ROM)1030 is coupled to a first input of a multiplexor 1034. The output of the memory element 1036 is coupled to the input 1054 of the multiplier 1020. The output of the multiplexor 1034 is coupled to an input of the memory element 1036. The output of the memory element 1036 is also coupled by feedback path 1038 to the second input of multiplexor 1034. The control circuit 1032 provides the first control signal to the multiplexor 1034 during the clock cycle in which the reciprocal of the leading non-zero coefficient of the error locator polynomial becomes available at output 1050. Control circuit 1032 provides a second control signal to the multiplexor 1034 after this non-zero coefficient has been stored memory element 1036 (i.e. in the clock cycle after the clock cycle in which the inverse becomes available at output 1051). In response to the first control signal, multiplexor 1034 passes the data from its first input to its output. In response to the second control signal, multiplexor 1034 passes the data from its second input to its output. Accordingly, feedback path 1038 is operating to maintain the inverse coefficient in memory element 1036 in the same manner as was done by feedback path 1028. The output 1046 of the multiplier 1020 is the output of the standard error locator polynomial calculator.

In operation, prior to being triggered by a trigger signal applied to input 1010, control circuit 1040 configures multiplexor 1014 to couple the input 1042 to the output 1046. Upon receiving the trigger signal at input 1010, control circuit 1040 reconfigures multiplexor 1014 to couple its input 1044 to its output 1046. When the first coefficient of error locator polynomial from calculator 310 is present at input 1044, it is applied to the input of memory element 1016 and to input 1048. The first clock cycle after this coefficient is provided at input 1044 this coefficient is clocked into memory element 1016. It will also be clocked into memory element 1022 if it is non-zero. The control circuit 1026 configures the multiplexor 1024 to couple the input 1050 to the output 1058 until non-zero data is detected at input 1044. Next, the second coefficient of the error locator polynomial will be provided at input 1044. Subsequent coefficients of the error locator polynomial are provided at input 1044 with each clock cycle. Control circuit 1026 tests each of the coefficients on input 1044 to determine if it is non-zero. If it is zero, the control circuit 1026 continues to couple the input 1050 to its output 1058. When the leading non-zero data is detected at input 1044, input 1048 is coupled to output 1058 by control circuit 1026 and the leading non-zero coefficient is latched into memory element 1022. After this latching occurs, the control circuit 1026 again configures the multiplexor 1024 to couple its input 1050 to its output 1058. Accordingly, memory element 1022 maintains storage of the first non-zero coefficient it receives even as subsequent coefficients arrive at input 1044. In particular, the data stored in memory element 1022 will be unaffected by subsequent coefficients passed to input 1048 of multiplexor 1024 whether they are zero or non-zero.

Memory element 1030 receives this leading non-zero coefficient that is stored in memory element 1022 at its address input 1048. As we have indicated, ROM 1030 provides at its output 1051 the reciprocal of this non-zero coefficient. This reciprocal output is latched into memory element 1036. After this latching, control circuit 1032 signals multiplexor 1034 to couple the output of memory element 1036 to its input using feedback path 1038. Accordingly, the reciprocal of the leading non-zero coefficient of the error locator polynomial is maintained in memory element 1036. Memory element 1036 provides this reciprocal coefficient to the input 1054 of multiplier 1020. Memory elements 1016 and 1018 ensure that the coefficients of the error locator polynomial arriving at input 1052 of multiplier 1020 are properly timed with the reciprocal data being latched into memory element 1036. Multiplier 1020 multiplies the error locator polynomial coefficients received at the input 1052 by the reciprocal of the leading non-zero coefficient of the error locator polynomial received at the input 1054. The coefficients of the standard error locator polynomial are output from multiplier 1020 at output 1046.

Error Transform Calculator And Trigger Circuit

Figure 11A:
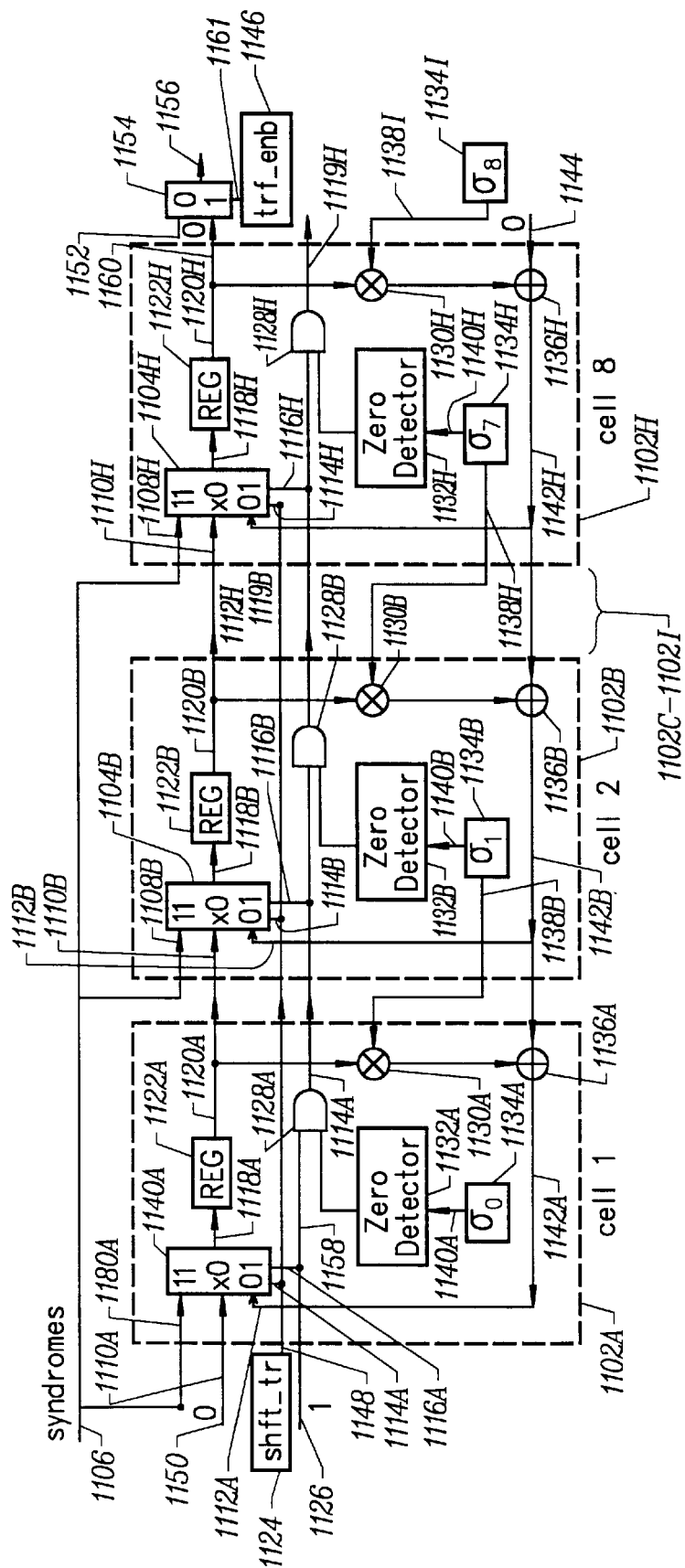
FIG. 11A illustrates the error transform calculator 314 used by the decoder of FIG. 3.

FIG. 11A illustrates the error transform calculator 314 used by the present embodiment. As discussed, the error transform calculator 314 calculates the coefficients of the error transform polynomial E(x) from the coefficients of the syndrome polynomial S(x) and the coefficients of the standard error locator polynomial σ(x). It uses the relation $$E_{16+j} = \sum_{k=1}^{t} \sigma_k E_{16+j-k}$$

for $0 \leq j \leq 238$ where $\sigma_k$ is the coefficient of the degree k term of the standard error locator polynomial σ(x) and $E_{16+j-k}$ is a known coefficient of the polynomial E(x). The coefficients $E_0$ through $E_{15}$ (also called error transforms) of the polynomial E(x) are the coefficients $S_0$ through $S_{15}$, respectively, of the syndrome polynomial. Accordingly, the error transform calculator starts with these known error transforms, $E_0$ through $E_{15}$, and calculates the remaining error transforms $E_{16}$ to $E_{254}$.

This calculator includes eight error transform cells 1102 (i.e., 1102A to 1102H). With respect to error transform calculators, the terms preceding cell and succeeding cell shall be defined according to the direction of flow of the known error transforms through the cells. Each cell includes a multiplexor 1104 (i.e. 1104A to 1104H), a memory element 1122 (i.e. 1122A to 1122H), a standard error memory element 1134 (i.e. 1134A to 1134H), a Galois field multiplier 1130 (i.e. 1130A to 1130H), a modulo two adder 1136 (i.e. 1136A to 1136H), a zero detector circuit 1132 (i.e. 1132A to 1132H), and an AND gate 1128 (i.e. 1128A to 1128H). A syndrome input 1106 broadcasts the coefficients of the syndrome polynomial to all of the cells 1102. A logic zero input 1150 provides zero data to the first cell 1102A. A shift control line 1148 provides a shift control signal from the shift control circuit 1124 to all of the cells 1102. A logic one input 1126 provides logic one data to the first cell 1102A. A logic zero input 1144 provides zero data to the last cell 1102H. The output of the multiplexor 1154 provides the output 1156 of the error transform calculator 314. A control circuit 1146 controls the multiplexor 1154. A standard error memory element 1134I provides an input to the last cell 1102H. All of the bus lines in the error transform calculator are 8 bit lines except for the shift control line 1148, the inputs and outputs of the AND gates 1128 and the control line 1161. Line 1148, the inputs and outputs of the AND gates 1128 and lines 1161 are one bit lines.

Within each cell, the multiplexor 1104 selects one of the three inputs 1108, 1110, and 1112 to couple to its output 1118. The output 1118 of multiplexor 1104 is coupled to the input of memory element 1122. Memory elements 1122 are 8 bit registers that provide to their outputs 1120 the data stored in the memory element. When these memory elements are clocked by a clock signal (not shown), they store the data present at their respective inputs. The input 1108 of multiplexor 1104 receives data from the syndrome input 1106. This input 1106 provides to each of the inputs 1108 the coefficients of the syndrome polynomial S(x). In the first cell 1102A, the input 1110A of multiplexor 1104 receives 8 bits of zero data from the logic zero input 1150. In the cells 1102B through 1102H, the input 1110 of the multiplexor 1104 is coupled to the output 1120 of the memory element 1122 in the preceding cell 1102. Accordingly, the inputs 1110B to 1110H receive data from the outputs 1120A to 1120G, respectively. The output 1120H of the memory element 1122H in the last cell 1102H is coupled to an input 1160 of the multiplexor 1154. The input 1112 of multiplexor 1104 receives data from the output 1142 of the adder 1136 in the same cell. For example, the input 1112A receives data from the output 1142A of adder 1136A.

The output 1120 of memory element 1122 is also coupled to a first input of the multiplier 1130 in the same cell. For example, the output 1120A is coupled to an input of the multiplier 1130A. The output of the multiplier 1130 is coupled to an input of the adder 1136 in the same cell. As we have noted the output of adder 1136 is coupled to the input 1112 of the multiplexor 1104 in the same cell.

Control inputs 1114 and 1116 of multiplexor 1104 control which of the inputs 1108, 1110 and 1112 is coupled to the output 1118. Embodiments of the invention are not limited to multiplexors with two control inputs. Other embodiments other control input configurations to control the operation of these multiplexors. Control inputs 1114 and 1116 are each adapted to respond to first and second control signals. In the present embodiment, the first control signal at input 1114 is a logic one level and the second control signal is a logic zero level. Control input 1116 is the same. The AND gate path 1158 could be modified to use other control signals.

In the present embodiment, when both of the control inputs 1114 and 1116 are at a logic one level, the multiplexor couples its input 1108 to its output 1118. When the control input 1114 is at a logic zero level and the control input 1116 is at a logic one level, the multiplexor 1104 couples its input 1112 to its output 1118. When the input 1116 is at a logic zero level, the multiplexor 1104 couples its input 1110 to its output 1118 regardless of the level on the 1114 input. The input 1114 in each cell is coupled to the shift control line 1124. The input 1116 in each cell is coupled to the AND gate path 1158. The AND gate path 1158 includes AND gates 1128A to 1128H coupled in series. Each AND gate 1128 has two inputs and an output. A first input of each AND gate 1128 is provided by the output of a zero detector circuit 1132 in the same cell. The zero detector circuit 1132 is coupled to standard error memory element 1134 in the same cell. The zero detector circuit 1132 provides a single bit logic 1 output if the data in the same cell standard error memory element 1134 is zero and a single bit logic 0 output if the data in the same cell standard error memory element 1134 is not zero. The standard error memory elements 1134 store the coefficients of the standard error locator polynomial. In the first cell 1102A, the second input of the AND gate 1128A is provided by the logic one input 1126. In cells 1102B to 1102H, the second input of the AND gate 1128 is provided by the output of the AND gate 1128 in the preceding cell. Thus, for example, the second input of the AND gate 1128B is provided by the output of the AND gate 1128A. The AND gate 1128H and the zero detector circuit 1132H in the last cell 1102H are not used to drive a subsequent cell 1102. They have been included in the present embodiment, however, to maintain a "generic" cell design that is repeatedly reused, simplifying hardware design. This AND gate 1128H and the zero detector circuit 1132H might be removed in alternate embodiments. In the present embodiment, the output of AND gate 1128 and the zero detector circuit 1132H are used to properly configure the trigger circuit of FIG. 11B.

In the first cell, the control input 1116A of the multiplexor 1104A is coupled to the logic one input 1126. In the cells 1102B to 1102H, the inputs 1116 are coupled to the output of the AND gate 1128 from the preceding cell. Thus, the input 1116B is coupled to the output of the AND gate 1128A.

As a result of this configuration, the input 1116A always receives a logic one data bit. The logic level of the data bit received at the inputs 1116B to 1116H of the cells 1102B to 1102H, however, will depend on whether or not the data stored in the standard error memory elements 1134A to 1134G, respectively, is zero as indicated by the output of the zero detector circuits 1132. In particular, starting with cell 1102A and moving to each cell in the order in which they are coupled in series (e.g. 1102A to 1102B to 1102C . . . to 1102H), if the output of the zero detector in the first cell is one, indicating that standard error memory element 1134 contains zero data, the output of the AND gate in that cell will also be one. The output of AND gate 1128 will be one along the series path until the standard error memory element 1134 in a cell contains non-zero data.

When a standard error memory element 1134 contains non-zero data, the output of zero detector circuit 1132 in the same cell will be zero, making the output of the AND gate 1128 in the same cell zero. As a result, the data received at the inputs 1116 in all of the succeeding cells 1102 will be zero regardless of the values stored in standard error memory elements 1134 of these succeeding cells. In particular, zero data in the standard error memory elements 1134 in cells succeeding the leading non-zero data cell will not cause an improper configuration of the multiplexors 1104. Any such zero coefficients shall be referred to as intermediate zero coefficients. Improper operation could result, for example, if an intermediate zero coefficient caused a high logic level to be applied to the control input 1116 of a cell succeeding the cell that contains the leading non-zero coefficient of σ(x). As the foregoing description illustrates, the control input 1116 of such succeeding cells should remain at a low logic level whether or not the standard error memory element 1134 in these succeeding cells is zero.

The multiplexor 1104 in the cell that contains the non-zero data in standard error memory element 1134 and any preceding cells have a logic one applied to their control inputs 1116. This configuration by AND gate path 1158 means that the multiplexors in all of the cells succeeding the first non-zero data cell will couple their input 1110 to their output 1118. In particular, they will pass to their 1118 output data from a preceding cell that is provided at their 1110 input. The multiplexors 1104 in the cell that contains the non-zero data and any preceding cells will couple either their input 1108 or 1112 to their output 1118 depending on the control signal present at input 1114. The multiplexor 1104 in the cell that contains the non-zero data will not receive data from the preceding cells on the input 1110.

The standard error memory elements 1134B to 1134H are coupled back to the preceding cell using lines 1138B to 1138H to provide a second input to the multiplier 1130 of the preceding cell. The standard error memory element 1134B, for example, provides a second input to the multiplier 1130A. An additional memory element 1134I is coupled using line 1138I to the last cell 1102H to provide a second input to the multiplier 1130H in that cell.

The control circuit 1146 controls whether the multiplexor 1154 provides data from the logic zero input 1152 to the output 1156 or data from the input 1160 to the output 1156. The control circuit provides a first control signal and a second control signal to the multiplexor. In response to the first control signal, the multiplexor provides the data from the input 1160 to its output 1156. In response to the second control signal, the multiplexor provides the data from the logic zero input 1152 to the output 1156. The control circuit provides the first control signal to the multiplexor 1154 when the first error transform coefficient becomes available at the input 1160 of the multiplexor 1154. The control circuit provides the second control signal to the multiplexor in the clock cycle following the one in which the last error transform coefficient $E_{254}$ is available in memory element 1122H.

The error transform calculator 314 can be viewed as a plurality of error transform processing circuits coupled in series. In the present embodiment, a single error transform processing circuit includes the multiplexor 1104, memory element 1122, multiplier 1130, adder 1136 and information inputs 1108, 1110 and 1112 of a particular cell 1102. In the present embodiment, a single error transform processing circuit also includes a standard error memory element 1134 of a cell immediately succeeding the particular cell. In other words, a particular error transform processing circuit need not be completely within one cell. Embodiments of the invention are not limited to the particular error transform processing circuits in the present embodiment. The control operations of the error transform calculator 314 can be viewed collectively as a control circuit. In the present embodiment, this control circuit includes the AND gates 1128, the zero detector circuits 1132, the standard error memory elements 1134 and the shift control line 1148. In the present embodiment, the standard error memory elements 1134 are included in both the control circuit and the error transform processing circuits. Alternate embodiments need not have this configuration. For example, alternate embodiments could use a first set of standard error memory elements in the error transform processing circuit and a different set of standard error memory elements in the control circuit. Alternate embodiments of the invention need not have the same relationship between cells and components as the present embodiment. In particular, alternate embodiments need not have components grouped in a particular cell in the same manner as the present embodiment. The zero detector circuits 1132 and the standard error memory elements 1134 can be viewed collectively as a zero detector. Alternate embodiments of the invention can use other zero detectors to accomplish the functions of the disclosed zero detector.

In operation, the coefficients of the standard error locator polynomial σ(x) are loaded into the memory elements 1134. The inputs to the memory elements 1134 are not shown for convenience, but these coefficients are received from the output 1046 of the standard error locator polynomial calculator 312. The memory element 1134A to 1134I store the coefficients in order of descending degree. Accordingly, the memory element 1134A stores the highest degree coefficient, and the memory element 1134I stores the lowest degree coefficient. Thus, the AND gate path 1158 in combination with the zero detectors 1132 determine which memory element 1134 contains the leading (highest degree) non-zero coefficient of the standard error locator polynomial σ(x). This path 1158 configures the multiplexors 1104 of the cells 1102 in the manner described. Thus, the multiplexor in the leading non-zero coefficient cell 1102 will receive its input either from the syndrome input 1106 or from the feedback path provided by the output 1142 of the adder 1136 in that same cell. The shift line 1148 will control which input is received. The multiplexors 1104 in the succeeding cells 1102 will receive their input from the output 1120 of the memory element 1122 in the preceding cell 1102.

As an example, assume that the coefficient $\sigma_0$ stored in memory element 1134A is non-zero. A non-zero coefficient of σ(x) means that errors have been detected. As shown in FIG. 3, the delay 320 prevents the syndromes $S_0$ to $S_{15}$ from reaching the error transform calculator 314 until the coefficients of the standard error locator polynomial σ(x) have been loaded into the memory elements 1134. After these coefficients of σ(x) are loaded and the multiplexors are configured by the zero detectors 1132 and the AND gate path 1158, the first syndrome $S_0$ reaches the input 1106. At this time, the control circuit 1124 provides a high logic level to control inputs 1114 of the multiplexors 1104. Because the input 1116A is coupled to a high logic level, the multiplexor 1104A couples the input 1108A to the output 1118A. Thus, in the cell 1102A, the first syndrome $S_0$ is applied to the input of the memory element 1122A through the multiplexor 1104A. This first syndrome is loaded into the first memory element 1122A when that memory element is clocked by a clock circuit (not shown). In the succeeding cells 1102B to 1102H, however, multiplexors 1104B to 1104H couple their respective inputs 1110B to 1110H to their respective outputs 1118B to 1118H. Accordingly, the memory elements 1122B to 1122H receive data from the memory elements 1122 in the respective preceding cells 1102A to 1102G through the respective multiplexors 1104B to 1104H. In other words, the syndrome $S_0$ applied to their inputs 1108 is ignored.

The memory element 1122A provides the error transform $E_0$ to its output automatically after $E_0$ is clocked into the memory element 1122A. Again, syndromes $S_0$ through $S_{15}$ are error transforms $E_0$ through $E_{15}$, respectively. Accordingly, prior to the second clock cycle, $E_0$ will be applied to the input of the memory element 1122B in the cell 1102B from the output of memory element 1122A, and the second error transform $E_1$ is applied to the input of memory element 1122A. The second clock cycle clocks the $E_0$ into the memory element 1122B and $E_1$ into the memory element 1122A. This sequence of operation continues until error transform $E_{15}$ is clocked into memory element 1122A. During this sequence, the data received at the inputs 1112 of each multiplexor 1104 is also ignored. When $E_{15}$ is clocked into memory element 1122A, memory element 1122H contains $E_8$.

After $E_{15}$ is clocked into memory element 1122A, the shift control circuit 1124 pulls the inputs 1114 to a logic low level. Control circuit 1124 knows how many error transforms are being clocked in. Because the cells 1102B to 1102H which succeed the leading non-zero coefficient cell 1102A have a low logic level at their inputs 1116, their operation is unchanged by this transition. In particular, they continue to receive data from the preceding cell 1102 through their respective inputs 1110. The multiplexor 1104A in the leading non-zero coefficient cell 1102A, however, now couples the feedback input 1112A to the output 1118A. Thus, the data from the feedback input 1112A is now applied to the input of the memory element 1122A. As a result of the calculations performed by the multipliers 1130 and the adders 1136, this data is the error transform $E_{16}$. The next clock cycle will clock $E_{16}$ into the memory element 1122A. Memory elements 1122B to 1122H will now contain error transforms $E_{15}$ to $E_9$, respectively. The data applied to the input 1112A resulting from the calculations by multipliers 1130 and adders 1136 will be $E_{17}$. The next clock cycle will clock $E_{17}$ into memory element 1122A and $E_{16}$ into memory element 1122B, generating $E_{18}$ at the input 1112A. This process continues until $E_{254}$ is clocked into memory element 1122H of the last cell 1102H.

Each data byte that is stored in memory element 1122H is provided to the output 1120H and is passed by multiplexor 1154 to output 1156. Each of these bytes is provided by the output 1156 to the input 1202 of the inverse error transform calculator 316 of FIG. 12. After $E_{254}$ is provided out of output 1156, control circuit 1146 configures multiplexor 1154 to pass zero bytes out of output 1156. Because in the present example the multiplexor 1104A does not accept data from the input 1112A until the error transform $E_8$ is latched into memory element 1122H, error transforms $E_0$ through $E_7$ are passed to the inverse error transform calculator 316 (FIG. 12), but are not used to calculate the unknown error transforms $E_{16}$ through $E_{254}$ in the calculator 314 (FIG. 11A). Trigger circuit 1100 of FIG. 11B, discussed below, signals the inverse error transform calculator 316 when the first error transform $E_0$ is present at the input 1202.

To demonstrate how the error transform calculator configures itself differently if the leading non-zero coefficient of the standard error locator polynomial σ(x) is not in the memory element 1134A, assume that the leading non-zero coefficient of σ(x) is in the memory element 1134C. In other words, $σ_0$ and $σ_1$ are zero. Again, the coefficients of σ(x) are loaded into the memory elements 1134 and the multiplexors 1104 are configured by the zero detectors 1132 and the AND gate path 1158 before the first error transform $E_0$ reaches the input 1106. Like the previous example, the control circuit 1124 provides a high logic level to control inputs 1114 of the multiplexors 1104. Also like the previous example, the input 1116A is coupled to a high logic level, causing the multiplexor 1104A to couple the input 1108A to the output 1118A. Unlike the previous example, however, the outputs of the zero detectors 1132A and 1132B are both one because memory elements 1134A and 1134B, respectively, contain zero data. Accordingly, a logic one is applied at the control inputs 1116B and 1116C. Thus, multiplexors 1104B and 1104C are also configured to couple their inputs 1108B and 1108C to their outputs 1118B and 1118C, respectively. Because the memory element 1134C contains the leading non-zero coefficient of σ(x), the output of zero detector 1132C is zero. As a result, the inputs 1116D to 1116H all receive a zero logic level, configuring multiplexors 1104D to 1104H to couple their input 1110 to their output 1118.

When the error transform $E_0$ is received at the input 1106, it will be applied to the inputs of the memory elements 1122A, 1122B and 1122C through the multiplexors 1104A, 1104B and 1104C, respectively. $E_0$ is loaded into each of the memory elements 1122A, 1122B and 1122C when these memory elements are clocked by a clock circuit (not shown). In the succeeding cells 1102D to 1102H, however, multiplexors 1104D to 1104H couple their respective inputs 1110D to 1110H to their respective outputs 1118D to 1118H. Accordingly, the memory elements 1122D to 1122H receive data from the memory elements 1122 in the respective preceding cells 1102C to 1102G through the respective multiplexors 1104D to 1104H. Accordingly, the error transform $E_0$ applied to the inputs 1108D to 1108H is ignored.

The memory element 1122C provides the error transform $E_0$ to its output 1120C automatically after $E_0$ is clocked into the memory element 1122C. Accordingly, prior to the second clock cycle, the transform $E_0$ will be applied to the input of the memory element 1122D in the cell 1102D. Memory elements 1122A and 1122B also provide $E_0$ to their respective outputs 1120A and 1120B, but these outputs are ignored by multiplexors 1104B and 1104C, respectively, which are configured to receive their input from inputs 1108B and 1108C, respectively. Before the second clock cycle, the second error transform $E_1$ is applied to the input of memory elements 1122A, 1122B and 1122C. The second clock cycle clocks the transform $E_0$ into the memory element 1122D and transform $E_1$ into the memory elements 1122A, 1122B and 1122C. Again, the transform $E_1$ is output from memory element 1122C and applied to the input of memory element 1122D while the outputs from memory elements 1122A and 1122B are ignored. This sequence of operation continues until error transform $E_{15}$ is clocked into memory elements 1122A, 1122B and 1122C. During this sequence, the data received at the inputs 1112 of each multiplexor 1104 is also ignored. Unlike the previous example, when $E_{15}$ is clocked into memory elements 1122A, 1122B and 1122C memory element 1122H contains $E_{10}$ because the shift path along memory elements 1122 is shorter than in the first example. As described below, the trigger circuit 1100 of FIG. 11B adapts its delay to be shorter in correspondence to the length of the shift path in the calculator 314. Accordingly, even with the shorter shift path, inverse error transform calculator 316 (FIG. 12) is signalled when the error transform $E_0$ is present at its input 1202.

After $E_{15}$ is clocked into memory elements 1122A, 1122B and 1122C, the shift control circuit pulls the inputs 1114 to a low logic level. Because the cells 1102D to 1102H which succeed the leading non-zero coefficient cell 1102C have a low logic level at their inputs 1116, their operation is unchanged by this transition. They continue to receive data from the preceding cell 1102 through their respective inputs 1110. The multiplexors 1104A, 1104B and 1104C, however, now couple their feedback inputs 1112A, 1112B and 1112C, respectively, to their outputs 1118A, 1118B and 1118C, respectively. Thus, the data from the feedback inputs 1112A, 1112B and 1112C are now applied to the input of the memory elements 1122A, 1122B and 1122C, respectively. As a result of the calculations performed by the multipliers 1130 and the adders 1136, the data at the input 1112C is the error transform $E_{16}$. The next clock cycle will clock $E_{16}$ into the memory element 1122C. At this point, the data applied to the input 1112C will be $E_{17}$. Accordingly, the next clock cycle will clock $E_{17}$ into memory element 1122C and $E_{16}$ into memory element 1122D. This process continues until $E_{254}$ is clocked into memory element 1122H of the last cell 1102H. As this cycle proceeds, the data at the inputs 1112A and 1112B is unknown. It will be clocked into memory elements 1122A and 1122B, respectively, but it will not affect the calculation because multiplexor 1104C ignores data at its input 1110C.

Similar to the previous example, each data byte that is stored in memory element 1122H is provided to the output 1120H and is passed by multiplexor 1154 to output 1156. Each of these bytes is provided by the output 1156 to the input 1202 of the inverse error transform calculator 316 of FIG. 12. Because in the present example the multiplexor 1104C does not accept data from the input 1112C until the error transform $E_{10}$ is latched into memory element 1122H, error transforms $E_0$ through $E_9$ are passed to the inverse error transform calculator 316 (FIG. 12), but are not used to calculate the unknown error transforms $E_{16}$ through $E_{254}$. The operation of error transform calculator 314 changes in the same manner when different memory elements 1134 contain the leading non-zero coefficient of the standard error locator polynomial.

Figure 11B:
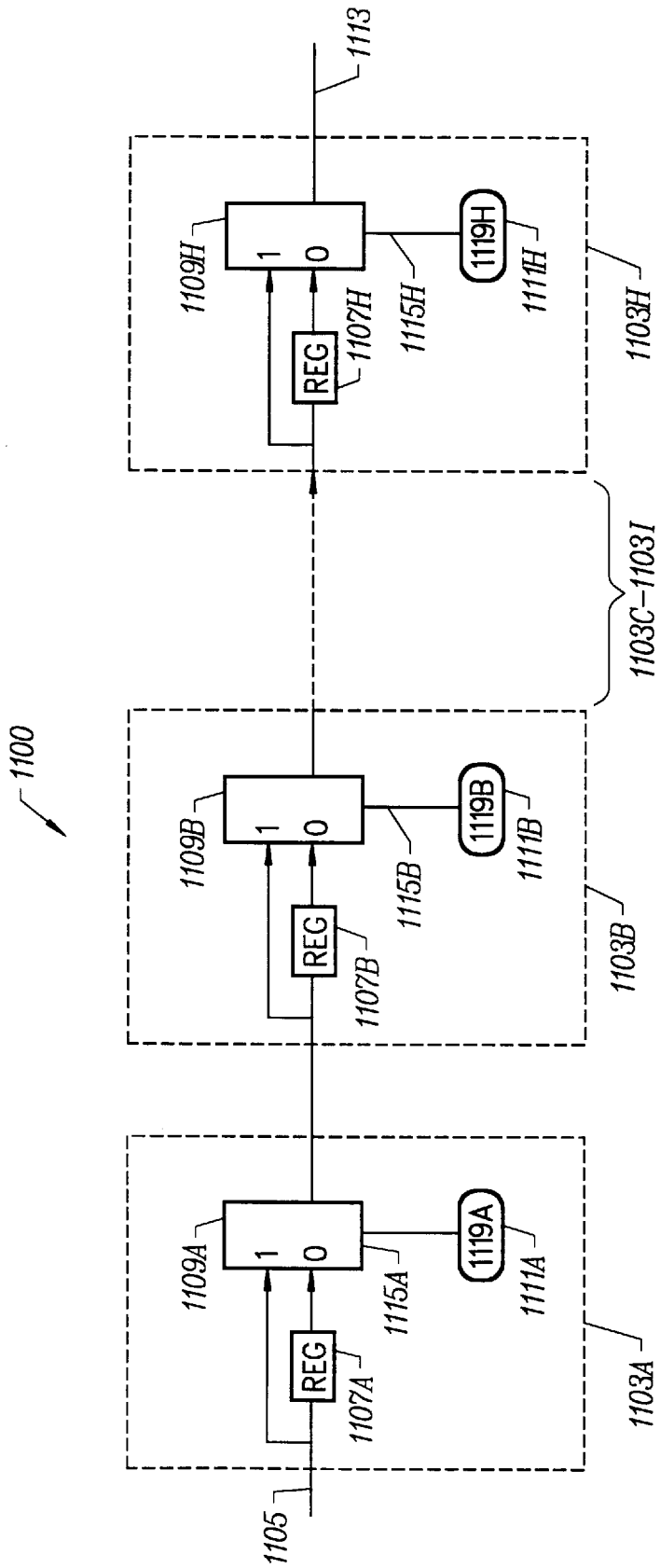
FIG. 11B illustrates the trigger circuit associated with the error transform calculator 314 of FIG. 11A.
Figure 12:
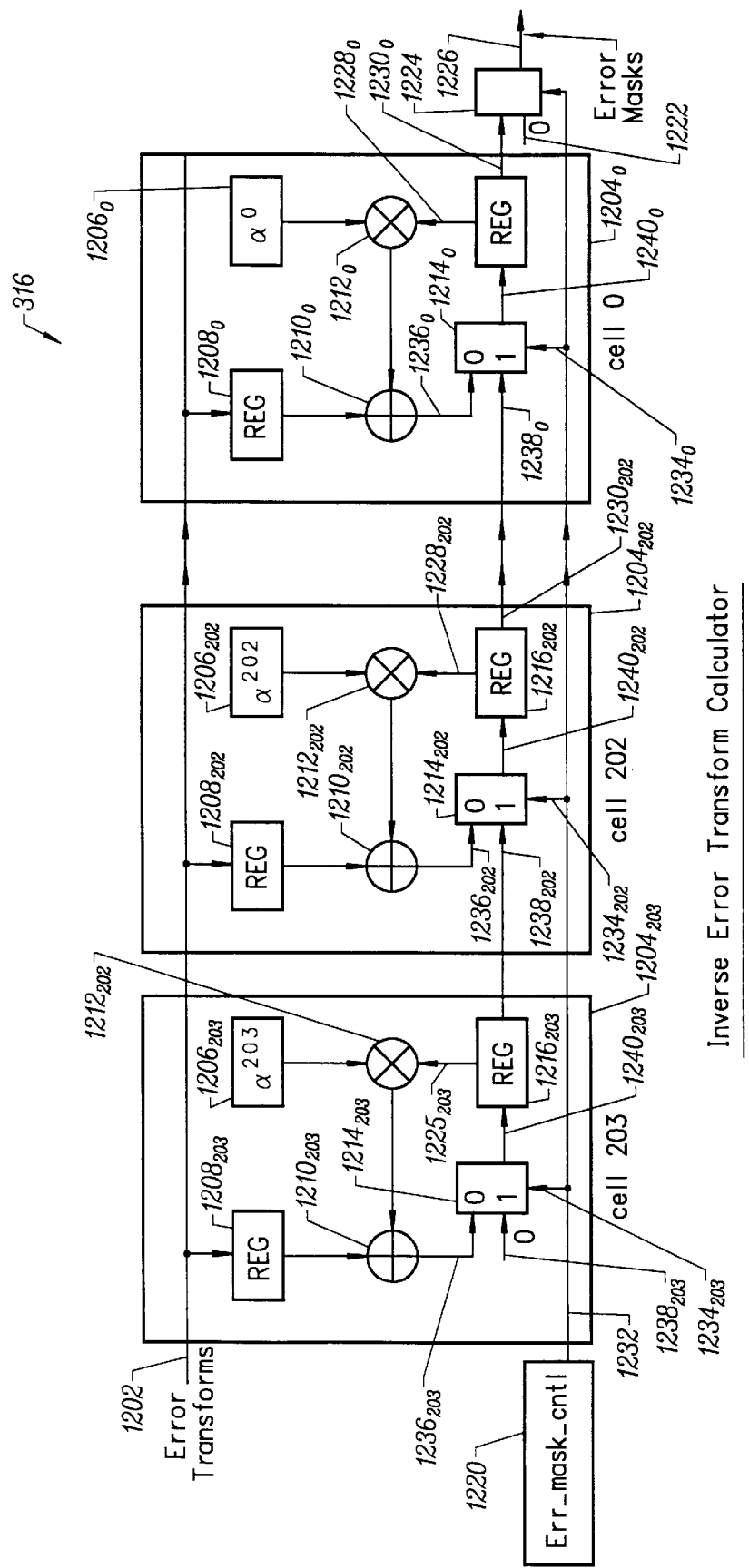
FIG. 12 illustrates the inverse error transform calculator used by the decoder of FIG. 3.

FIG. 11B is a variable delay trigger circuit 1100 that is used in conjunction with the error transform calculator 314. In particular, this trigger circuit 1100 provides a variable delay that corresponds to the delay associated with the configuration of the error transform calculator 314 by the AND gate path 1158. This variable delay trigger circuit 1100 is used to pass the trigger signal output by the standard error locator polynomial calculator 312 from output 1012 (FIG. 10) to the control circuit 1220 of the inverse error transform calculator 316 (FIG. 12). The delay by the trigger circuit 1100 adapts such that the inverse error transform calculator 316 (FIG. 12) is signalled when the error transform $E_0$ is present at the input 1202.

The trigger circuit 1100 includes cells 1103 (i.e. 1103A–1103H). In the present embodiment, all of these cells include the same hardware elements. In particular, each cell 1103 includes a memory register 1107 (i.e. 1107A–1107H) and a multiplexor 1109 (i.e. 1109A–1109H). The control input 1115 (i.e. 1115A–1115H) of each multiplexor 1109 is coupled to the AND gate path 1158 of FIG. 11A through the outputs 1119 of the respective AND gates (as shown in FIG. 11B). These couplings are represented by the connectors 1111 (i.e. 1111A–1111H). Connectors 1111 refer to the location of the connection into the AND gate path of FIG. 11A. In particular looking at FIGS. 11A and 11B, each control input 1115 is coupled to the output 1119 (i.e. 1119A–1119H) of the AND gate 1128 in the corresponding cell. Thus, the output 1119A from the cell 1102A is coupled to the control input 1115A in the cell 1103A; the output 1119B from the cell 1102B is coupled to the control input 1115B in the cell 1103B; and so on. Thus, when the memory element 1134A in cell 1102A of calculator 314 (FIG. 11A) contains a zero coefficient, for example, the memory element 1107A in the trigger circuit 1100 (FIG. 11B) is bypassed because the shift path in calculator 314 (FIG. 11A) through which the syndromes are shifted from input 1106 to output 1156 will not include memory element 1122A. Under these circumstances, the output of AND gate 1128A (FIG. 11A) provides a first control signal (high logic level in the present embodiment) to the input of the multiplexor 1109A (FIG. 11B) so that the timing provided by the trigger circuit 1100 corresponds to the timing of the calculator 314. Similarly, when the memory elements 1134A and 1134B in cell 1102B of calculator 314 (FIG. 11A) contain a zero coefficient, the memory elements 1107A and 1107B in the trigger circuit 1100 (FIG. 11B) are bypassed because the shift path in calculator 314 (FIG. 11A) from input 1106 to output 1156 through which the syndromes are shifted will not include memory elements 1122A and 1122B. Under these circumstances, the output of the AND gates 1128A and 1128B provide a first control signal (high logic level in the present embodiment) to the control inputs of the multiplexors 1109A and 1109B.

If the memory element 1134A in calculator 314 contains a non-zero coefficient, however, the memory element 1122A (FIG. 11A) will be included in the shift path of the calculator 314 through which the syndromes are shifted. Accordingly, memory element 1107A (FIG. 11B) should be included in the trigger circuit 1100 shift path so that the timing of the trigger circuit 1100 correctly corresponds to the timing of the error transform calculator 314. Under these circumstances, the AND gate 1128A will output a second control signal (low logic level in the present embodiment) that will cause the multiplexor 1109A to pass the data from the memory element 1107A. This second control signal results because the output of the zero detector 1132A will be a low logic level when non-zero data is present in memory element 1134A. Because the output of AND gate 1128A is a low logic level, the output of all succeeding AND gates 1128 will also be a low logic level. Accordingly, all succeeding trigger circuit cells 1103 will pass data from the memory elements 1107. Thus, all succeeding memory elements 1107 will contribute to the delay of the trigger circuit 1100. Such a delay corresponds to the delay resulting from the error transform calculator 314 as configured by the AND gate path 1158.

If memory element 1134A had contained a zero coefficient and memory element 1134B had contained the first non-zero coefficient of the standard error locator polynomial, memory elements 1107B through 1107H but not 1107A would be included in the trigger circuit 1100 shift path so that the delay caused by trigger circuit 1100 would correspond to the delay of the shift path in calculator 314 (FIG. 11A) from input 1106 to output 1156. Similarly, if memory element 1134C of the calculator 314 (FIG. 11A) contained the first non-zero coefficient, then memory elements 1107C through 1107H but not 1107A and 110B would be included in the shift path of the trigger circuit 1100. Thus, in general trigger circuit 1100 includes the memory elements 1107 in its shift path starting with the cell 1103 associated with the cell 1102 that contains the first non-zero coefficient of the standard error locator polynomial and including the memory elements 1107 of any cells 1103 succeeding the first non-zero coefficient cell. Trigger circuit 1100 does not include in its shift path the memory elements 1107 in any cells 1103 preceding the first non-zero coefficient cell. Alternate embodiments of the invention may use varying numbers of cells to form the appropriate shift paths. Feedback loops could also be used.

Inverse Error Transform Calculator

FIG. 12 illustrates the inverse error transform calculator 316 used by the present embodiment. While N−1=254 in the present embodiment, the inverse error transform polynomial need only calculate inverse error transforms $e_0$ to $e_{203}$ because of the use of the shortened (204, 188) RS code. The present embodiment need not calculate the transforms $e_{204}$ to $e_{254}$ because they relate to the unused data bytes described earlier. The present embodiment does not need to detect and correct errors in these unused data bytes. Alternate embodiments could be designed to detect and correct errors in these additional data bytes if desired.

Because the present embodiment need only calculate $e_0$ to $e_{203}$, memory elements 1206 in the inverse error transform calculator 316 store only $\alpha^n$ for $0 \leq n \leq 203$. Inverse error transform calculator 316 calculates inverse error transforms using the equation $$e_n = \alpha^n \sum_{k=0}^{N-1} E_k \alpha^{n(N-k-1)}$$

for $0 \leq n \leq N-1$ where $E_k$ is the coefficient of the degree k term of the error transform polynomial E(x). In the present embodiment, $$e_n = \alpha^n \sum_{k=0}^{254} E_k \alpha^{n(N-k-1)}$$

for $0 \leq n \leq 203$ even though N−1=254 because of the use of the shortened Reed Solomon code.

The inverse error transform calculator 316 includes 204 cells $1204_0$ to $1204_{203}$. Each cell 1204 includes a memory element 1206 (i.e. memory elements $1206_0$ to $1206_{203}$), a memory element 1208 (i.e. $1208_0$ to $1208_{203}$), a memory element 1216 (i.e. $1216_0$ to $1216_{203}$), a modulo two adder 1210 (i.e. $1210_0$ to $1210_{203}$), a Galois field multiplier 1212 (i.e. $1212_0$ to $1212_{203}$) and a multiplexor 1214 (i.e. $1214_0$ to $1214_{203}$). The calculator 316 also includes an error transform input 1202, an inverse error transform output 1226 and a control line 1232. Memory elements 1206, 1208 and 1216 are 8 bit registers that provide the data that they are storing to their outputs. When these memory elements are clocked by a clock signal (not shown), they store the data present at their respective inputs. All of the bus lines in calculator 316 are 8 bit wide bus lines, except the control line 1232, which is a one bit line. The control circuit 1220 provides control signals to the inverse error transform calculator 316 using control line 1232.

The control circuit 1220 provides a first control signal and a second control signal on control line 1232. The control line 1232 is coupled to a control input 1234 of each multiplexor 1214. In response to the first control signal, the multiplexors 1214 couple their input 1238 to their output 1240. In response to the second control signal, the multiplexors 1214 couple their input 1236 to their output 1240. In the present embodiment, the first control signal is a logic 1 and the second control signal is a logic 0.

The error transform input 1202 is coupled to the input of all of the memory elements 1208. This input 1202 provides the error transforms calculated by the error transform calculator 314 to the memory elements 1208. The outputs of the memory elements 1208 are coupled to a first input of the modulo two adder 1210 in the same cell. Memory elements 1206 store decreasing powers of $\alpha$ starting with $\alpha^{203}$ in cell 1204$_{203}$ and ending with $\alpha^0$ or 1 in cell 1204$_0$. Memory elements 1206 are 8 bit registers. They may be of the type that accepts clocked data from an input, or some kind of ROM, for example. The outputs of memory elements 1206 are coupled to a first input of the multiplier 1212 in the same cell. The second input to the multiplier 1212 is coupled to the output 1228 of memory element 1216 in the same cell. The output of the multiplier 1212 is coupled to the second input of the adder 1210 in the same cell. The output of the adder 1210 is coupled to the input 1236 of the multiplexor 1214 in the same cell. The output 1240 of the multiplexor 1214 is coupled to the input of the memory element 1216 in the same cell. In each preceding cell, the output 1230 of the memory element 1216 is coupled to the input 1238 of the multiplexor 1214 in the succeeding cell. In the last cell 1204$_0$, the output 1230$_0$ of memory element 1216$_0$ is coupled to a first input to the multiplexor 1224. A zero data input 1222 is coupled to an input of the multiplexor 1224. A zero data input 1218 is coupled to the input 1238$_{203}$ of multiplexor 1214$_{203}$.

Prior to receiving the first error transform at input 1202, the memory element 1216 of each cell is initiallized to zero. During the normal course of operation, the memory elements 1216 are automatically initiallized when the evaluated inverse error transform coefficients are shifted out of memory elements 1216. At this time, the control circuit 1220 configures the multiplexors 1214 to couple their zero input 1218 to their output 1240 so that zero values are shifted into memory elements 1216 when the inverse error transform coefficients are shifted out.

After initialization, the control circuit 1220 applies the first control signal to line 1232, configuring the multiplexors 1214 to couple their inputs 1236 to their respective outputs 1240 and configuring multiplexor 1224 to couple the zero valued input 1222 to the output 1226. Output 1156 of FIG. 11A is coupled to input 1202 of FIG. 12.

The error transforms from the output 1156 of the error transform calculator 314 are received at the input after the calculator 316 is initialized in this manner. The trigger circuit 1100 informs the calculator 316 when the first error transform $E_0$ is provided at the input 1202. At this point, a first clock cycle stores the first error transform $E_0$ in the memory elements 1208. The sum of the data stored in memory element 1208 and the output of multiplier 1212 is applied to the input of the memory element 1216 from the output of adder 1210. The output of multiplier 1212 is the product of the power of $\alpha$ stored in memory element 1206 and the data stored in memory element 1216. After this first clock cycle, the data in memory element 1216 is still zero. Accordingly, the output of adders 1210 is $E_0$. The second error transform is then applied to the input of memory element 1208.

The second clock cycle stores $E_0$ (i.e. the sum present at the input of memory element 1216) in memory element 1216 and stores the second error transform $E_1$ in memory element 1208. The sum of the data stored in memory element 1208 and the output of multiplier 1212 is again applied to the input of the memory element 1216. This sum is $E_1+E_0\alpha^n$ where n is the power of $\alpha$ stored in the memory element 1206 of the particular cell. The output of multiplier 1212 is the product of the power of $\alpha$ stored in memory element 1206 and the data stored in memory element 1216. At this point, the data stored in memory element 1216 is $E_0$. After the next clock cycle the sum $E_2+E_1\alpha^n+E_0\alpha^{2(n)}$ is applied to the input of memory element 1216$_n$. The cells 1204 are generating multiple powers of $\alpha$. The calculator 316 is clocked 255 times so that all of $E_0$ through $E_{254}$ are summed into memory elements 1216. On the 256th clock, a data zero value is stored in memory elements 1208 from the output 1156. At this point, the calculator 316 is clocked one additional time (i.e. the 257th time). Because memory elements 1208 contain a zero, the data values stored in memory elements 1216 are multiplied by their respective $\alpha^n$ stored in the respective memory elements 1206. After this final clocking, memory element 1216$_0$ contains $e_0$, memory element 1216$_1$ contains $e_1$, memory element 1216$_2$ contains $e_2$, memory element 1216$_3$ contains $e_3$ and memory elements 1216$_4$ through 1216$_{203}$ contains $e_4$ through $e_{203}$, respectively.

The present embodiment uses the relation $$e_n = \alpha^n \sum_{k=0}^{254} E_k \alpha^{n(N-k-1)} \tag{22}$$

for $0 \leq n \leq 203$ to calculate the inverse error transforms. The present embodiment has been able to use this relation to eliminate a buffer that might otherwise have increased the chip area required by the decoder 202. In particular, the inverse error transform polynomial e(x) can be calculated from the error transform polynomial E(x) using the relation $$e_n = \alpha^n \sum_{k=0}^{N-1} E_k \alpha^{-nk} \tag{23}$$

for $0 \leq n \leq N-1$. Please see, for example, Shao, H. et al., *A VLSI Design of a Pipeline Reed-Solomon Decoder*, IEEE Transactions on Computers, Vol. C-34, No. 5, May 1985 page 401, equation (21). This equation (23) could be calculated using a calculator such as calculator 316 that relies upon a recursive approach to calculate $\alpha^{-nk}$ where $0 \leq n \leq N-1$. In particular, memory elements 1206 could store the constants $\alpha^{-n}$ instead of the constants $\alpha^n$ described above. The "k" exponent could be calculated using recursive multiplications, as is done in the calculator 316 as is also described above. Unfortunately, to calculate equation (23) in this manner using calculator 316 where memory elements 1206 store $\alpha^{-n}$, $E_{254}$ would have to be provided to input 1202 first, followed in order by error transforms $E_{253}$, $E_{252}$, and $E_{251}$ through $E_0$. This order would be required because equation (23) requires that $E_{254}$ be multiplied by $\alpha^{-254n}$. In the contemplated calculator the "254" portion of the exponent is generated using recursive multiplications. Accordingly, if $E_0$ entered the calculator input 1202 first, $E_0$ would be multiplied by $\alpha^{-254n}$ which would not provide the correct result.

As we have described with respect to FIG. 11, the error transforms are output from the error transform calculator 314 output 1156 in the order $E_0$ through $E_{254}$. A buffer could be used to reverse the order of the error transforms applied to the input 1202 (i.e. to apply $E_{254}$ first). Such a buffer would sacrifice speed and require extra space on a chip. In particular, such a buffer would likely require at least 255 cycles to store the 255 error transforms and an additional 255 cycles to access them after storage. In the present embodiment, such a buffer would require 255 eight bit registers. This embodiment has combined the use of the derived equation (22) and the sequence in which error transforms are output from calculator 314 to eliminate the need for such a buffer. The approach used by the present embodiment adds only one additional clock cycle (i.e. the 257th clock cycle) to the minimum number of cycles required to generate the inverse error.

The following illustrates the derivation of this equation. In particular, both sides of equation (23) are multiplied by $(\alpha^n)^{N-1}$ to produce $$(\alpha^n)^{N-1} e_n = \sum_{k=0}^{N-1} E_k \alpha^{n(N-1-k)}$$

for $0 \leq n \leq N-1$. Next, $(\alpha^n)^{N-1} e_n = (\alpha^{Nn-n}) e_n$. Due to the cyclic nature of Reed-Solomon codes, however, we know that $(\alpha^N) = 1$. Thus, $(\alpha^n)^{N-1} e_n = (\alpha^{Nn-n}) e_n = (1 * \alpha^{-n}) e_n$. In other words, $$\alpha^{-n} e_n = \sum_{k=0}^{N-1} E_k \alpha^{n(N-1-k)}$$

for $0 \leq n \leq N-1$. Multiplying both sides by $\alpha^n$ produces $$e_n = \alpha^n \sum_{k=0}^{N-1} E_k \alpha^{n(N-1-k)} \qquad (24)$$

for $0 \leq n \leq N-1$ which is the equation used by calculator 316 to calculate $e_n$.

As calculator 316 demonstrates, it is calculating $$\sum_{k=0}^{254} E_k \alpha^{n(254-k)}$$

for $0 \leq n \leq 203$, again due to the shortened RS code. In particular, using cell 203 as an example, $E_0$ initially is clocked into memory element $1216_{203}$. In the next clock cycle, memory element $1216_{203}$ will contain $E_0 \alpha^{203} + E_1$. In the next clock cycle, memory element $1216_{203}$ will contain $E_0 \alpha^{203(2)} + E_1 \alpha^{203} + E_2$. This process continues until memory element $1216_{203}$ is clocked to contain $E_0 \alpha^{203(254)} + E_1 \alpha^{203(253)} + E_2 \alpha^{203(252)} + \ldots + E_{254} \alpha^{203(0)}$. In a similar manner, the calculator 316 operates so that each of the memory elements $1216_{202}$ through $1216_0$ will contain a respective summation $$\sum_{k=0}^{254} E_k \alpha^{n(254-k)}$$

for the values of n from 202 to 0, respectively. In the same clock cycle that the final sum is stored in each of the memory elements 1216, zeros are stored in memory elements 1208. The calculator 316 is then clocked one additional time to multiply by $\alpha^n$ the series $$\sum_{k=0}^{254} E_k \alpha^{n(254-k)}$$

for $0 \leq n \leq 203$ as stored in memory elements 1216. As a result, the memory elements 1216 will contain $e_{203}$ in cell $1204_{203}$, $e_{202}$ in cell $1204_{202}$, and so on down to $e_0$ in cell $1204_0$ as shown in equation (24).

After the inverse error transforms $e_0$ through $e_{203}$ are calculated, they are clocked out of output 1226 and applied to a first input of the modulo two adder 306 illustrated in FIG. 3. The second input to the modulo two adder is the received data stream $r(x) = r_0 x^{203} + r_1 x^{202} + \ldots + r_{203} x^0$. The modulo two adder adds $e_{203}$ to $r_0$ to produce $t_0$, $e_{202}$ to $r_1$ to produce $t_1$ and $e_{201}$ through $e_0$ to $r_2$ through $r_{203}$ to produce $t_2$ through $t_{203}$. Again, $t_0$ through $t_{203}$ provide the transmitted data stream. This transmitted data stream is then provided to an input of converter 318 where it is converted in a manner known in the art to the pre-encoded data stream $I(x)$.

Galois Field Multiplier

Figure 13:
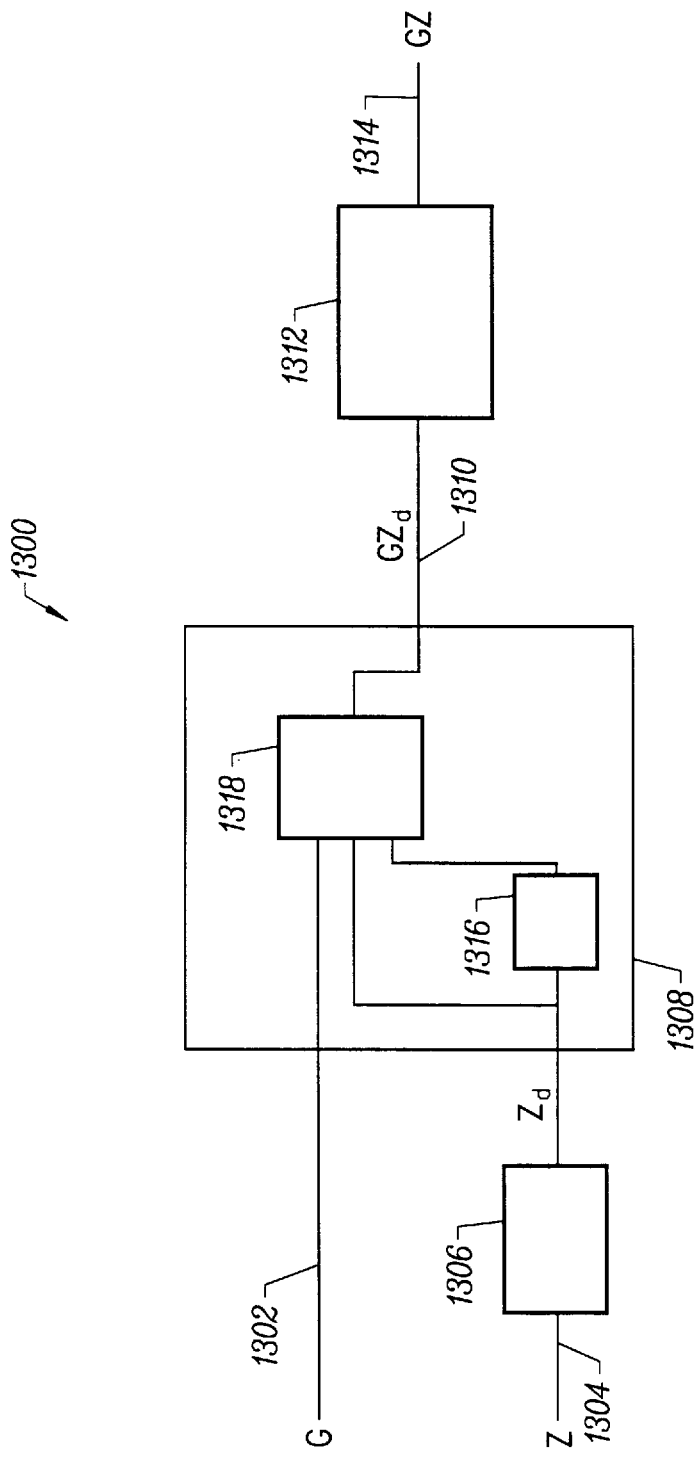
FIG. 13 is an embodiment of a Galois field multiplier that can be used in embodiments of the present invention.

The present embodiment of the invention uses the Galois field multiplier 1300 shown in FIG. 13 to accomplish Galois field multiplications. This multiplier 1300 enables computation of a Galois field product in less than one clock cycle. Other Galois field multipliers could be used in embodiments of the invention by making any appropriate timing adjustments to the decoder circuits. The Galois field multiplier 1300 can be used to perform Galois field multiplication in applications other than the decoder circuits disclosed herein.

In general, embodiments of this multiplier can be used to multiply within a Galois field a first m bit word with a second m bit word. The number m is the degree of a field generator polynomial of the Galois field $GF(2^m)$. In the present embodiment m is 8. Multiplier 1300 uses a normal basis and a dual basis of the Galois field $GF(2^8)$ to accomplish the Galois field multiplication. Galois fields have a normal basis $\{\alpha^k\}$ for $0 \leq k \leq m-1$ and a dual basis $\{\lambda_k\}$ for $0 \leq k \leq m-1$. Again, $\alpha$ is a root of the field generator polynomial. For a discussion of the mathematics used by Galois field multipliers, please see Hsu et al, *The VLSI Implementation of a Reed-Solomon Encoder Using Berlekamp's Bit-Serial Multiplier Algorithm*, IEEE Transactions on Computers, Vol. C-33, No. 10, October 1984 and Berlekamp, *Bit-Serial Reed-Solomon Encoders*, IEEE Transactions on Information Theory, Vol. IT-28, No. 6, November 1982 both of which are hereby incorporated herein by this reference.

Multiplier 1300 includes inputs 1302 and 1304, a normal to dual basis converter circuit 1306, a multiplier circuit 1308 having an output 1310 and a dual to normal basis converter circuit 1312 having an output 1314. The present multiplier 1300 is designed to work with 8 bit words. The bus lines in FIG. 13 are 8 bit bus lines. Alternate embodiments, however, are not limited to any particular word size.

In FIG. 13, an m bit word G is input into the input 1302, and an m bit word Z is input into the input 1304. Each of these words G and Z can be represented using the normal basis $\{\alpha^k\}$ for $0 \leq k \leq m-1$ and the dual basis $\{\lambda_k\}$ for $0 \leq k \leq m-1$ of the Galois field $GF(2^m)$. For example, the word G has the normal basis representation $G = Gbit_{m-1} \alpha^{m-1} + Gbit_{m-2} \alpha^{m-2} + \ldots + Gbit_0 \alpha^0$ in the Galois field $GF(2^m)$. The shorthand notation $\{G_{m-1} \ldots G_0\}$ shall be used to refer to this normal basis representation. In this shorthand, $G_{m-1} = Gbit_{m-1} \alpha^{m-1}$, $G_{m-2} = Gbit_{m-2} \alpha^{m-2}$, $\ldots$ $G_0 = Gbit_0 \alpha^0$ where $Gbit_x$ refers to the bit in the x position of the word G and where bit zero is the bit in the least significant bit position. Thus, where m=8, the word G might be the byte Gbit$_7$ Gbit$_6$ Gbit$_5$ Gbit$_4$ Gbit$_3$ Gbit$_2$ Gbit$_1$ Gbit$_0$, for example. This word G can be expressed using the normal basis representation as G=Gbit$_7\alpha^7$+Gbit$_6\alpha^6$+ . . . +Gbit$_0\alpha^0$. From this normal basis representation, it can be seen that G$_7$=Gbit$_7\alpha^7$, G$_6$=Gbit$_6\alpha^6$, . . . G$_0$=Gbit$_0\alpha^0$.

The word G can also be represented in the dual basis. Again, when m=8, the word G is the byte Gbit$_7$ Gbit$_6$ Gbit$_5$ Gbit$_4$ Gbit$_3$ Gbit$_2$ Gbit$_1$ Gbit$_0$, for example. The word G has a corresponding word G$_d$ that represents the dual basis representation of the word G. When m=8, the word G$_d$ is the byte G$_d$bit$_7$ G$_d$bit$_6$ G$_d$bit$_5$ G$_d$bit$_4$ G$_d$bit$_3$ G$_d$bit$_2$ G$_d$bit$_1$ G$_d$bit$_0$, for example. Using this word G$_d$, the word G can be expressed using the dual basis representation G=G$_d$bit$_{m-1}\lambda_{m-1}$+G$_d$bit$_{m-2}\lambda_{m-2}$+ . . . +G$_d$bit$_0\lambda_0$. The shorthand notation $\{G_{dm-1} \ldots G_{d0}\}$ shall be used to refer to this dual basis representation. From this representation, it can be seen that G$_{dm-1}$=G$_d$bit$_{m-1}\lambda_{m-1}$ G$_{dm-2}$=G$_d$bit$_{m-2}\lambda_{m-2}$ . . . G$_{d0}$=G$_d$bit$_0\lambda_0$ where G$_d$bit$_x$ refers to the bit in the x position of the word G$_d$ and where bit zero is the bit in the least significant bit position. Thus, G$_{d7}$=G$_d$bit$_7\lambda_7$, G$_{d6}$=G$_d$bit$_6\lambda_6$ and so forth. The $\lambda$ values used in the dual basis polynomial are elements of the dual basis. These $\lambda$ values should not be confused with the earlier $\lambda$ elements used in the context of the error locator polynomial and the $\lambda$-$\mu$ calculator. The present $\lambda$ values are unrelated to the earlier $\lambda$ elements. In the present embodiment, the dual basis that is used is the dual basis related to the field generator polynomial p(x)= $x^8+x^4+x^3+x^2+1$ from the ETS 300 429 specification.

In the multiplier 1300, the m bit word G is input directly to the multiplier circuit 1308 using the input 1302. The normal to dual basis converter circuit 1306 receives any m bit word that corresponds to a normal basis representation of the any m bit word (e.g. the word Z corresponds to the normal basis representation of Z which is Zbit$_{m-1}\alpha^{m-1}$+ Zbit$_{m-2}\alpha^{m-2}$+ . . . +Zbit$_0\alpha^0$). It converts the any m bit normal basis word into an m bit dual basis word (e.g. it converts the normal basis word Z into the dual basis word Z$_d$ where Z$_d$ corresponds to the dual basis representation of Z which is Z$_d$bit$_{m-1}\lambda_{m-1}$+Z$_d$bit$_{m-2}\lambda_{m-2}$+ . . . +Z$_d$bit$_0\lambda_0$). Thus, in the present embodiment, the m bit word Z that is input into the input 1304 is converted by the normal to dual basis converter circuit 1306 to the dual basis word Z$_d$ which corresponds to the dual basis representation $\{Z_{d0} \ldots Z_{dm-1}\}$ of the word Z. When m=8, the word Z$_d$ is the byte Z$_d$bit$_7$ Z$_d$bit$_6$ Z$_d$bit$_5$ Z$_d$bit$_4$ Z$_d$bit$_3$ Z$_d$bit$_2$ Z$_d$bit$_1$ Z$_d$bit$_0$, for example. Again, the expression $\{Z_{dm-1} \ldots Z_{d0}\}$ is a shorthand representation of the polynomial $$Z=Z_d\text{bit}_{m-1}\lambda_{m-1}+Z_d\text{bit}_{m-2}\lambda_{m-2}+ \ldots +Z_d\text{bit}_0\lambda_0 \quad (25)$$

where Z$_d$bit$_x$ refers to the bit in the x position of the dual basis word Z$_d$. In this dual basis representation, Z$_{d0}$=Z$_d$bit$_0\lambda_0$, Z$_{d1}$=Z$_d$bit$_1\lambda_1$, . . . Z$_{dm-1}$=Zbit$_{m-1}\lambda_{m-1}$. After conversion, the dual basis word Z$_d$ is input into the multiplier circuit 1308. The elements of the dual basis representation $\{Z_{d0} \ldots Z_{dm-1}\}$ shall be referred to generically and/or collectively as Z$_{dk}$.

The multiplier circuit 1308 is adapted to generate from the normal basis word G and from the dual basis word Z$_d$ a dual basis product GZ$_d$ which is the byte GZ$_d$bit$_7$ GZ$_d$bit$_6$ GZ$_d$bit$_5$ GZ$_d$bit$_4$ GZ$_d$bit$_3$ GZ$_d$bit$_2$ GZ$_d$bit$_1$ GZ$_d$bit$_0$. This dual basis product GZ$_d$ can be generated by multiplying a binary mapping vector by each of m "dual basis vectors" where the m dual basis vectors have the form $\{Z_d\text{bit}_{0+p} \ldots Z_d\text{bit}_{m-1+p}\}$. Each of the m "dual basis vectors" $\{Z_d\text{bit}_{0+p} \ldots Z_d\text{bit}_{m-1+p}\}$ has elements determined by one value of p as p varies across $0 \leq p \leq m-1$. In particular, the m "dual basis vectors" are defined by the m values of p from 0 to m-1. Thus, in the present embodiment a first dual basis vector (for p=0) has the elements $\{Z_d\text{bit}_0 \ldots Z_d\text{bit}_{m-1}\}$. A second dual basis vector (for p=1) has the elements $\{Z_d\text{bit}_1 \ldots Z_d\text{bit}_m\}$, for example. The m$^{th}$ dual basis vector (for p=m-1) has the elements $\{Z_d\text{bit}_{m-1} \ldots Z_d\text{bit}_{2m-2}\}$. Again, the terms Z$_d$bit$_0$ . . . Z$_d$bit$_{m-1}$ are bits of the word Z$_d$. The terms Z$_d$bit$_m$ . . . Z$_d$bit$_{2m-2}$ are not bits of the word Z$_d$, however, but are "additional" bits determined from the bits Z$_d$bit$_0$ . . . Z$_d$bit$_{m-1}$. In embodiments of the present invention, the values for at most m-1 "additional vector" bits (e.g. Z$_d$bit$_m$ . . . Z$_d$bit$_{2m-2}$) will be determined to define the m vectors. Where m=8, at most seven additional bits will be determined to define 8 vectors. The term "dual basis vectors" is used for descriptive convenience. It includes any vectors that accomplish the function described herein. Each multiplication of the binary mapping vector by one of the dual basis vectors produces a bit of the dual basis product GZ$_d$.

To determine the "additional vector" bits of the dual basis vectors, the second dual basis vector is generated from the first dual basis vector by substituting the byte Y where Y=$\alpha$ Z$_d$ into the first dual basis vector. Thus, Z$_d$bit$_0$ is replaced with Ybit$_0$, Z$_d$bit$_1$ is replaced with Ybit$_1$ and so on. This substitution is shown in FIG. 16A. In particular, the first dual basis vector (vector 0) is numbered 1604$_0$. Substituting the byte Y into the first vector 1604$_0$ produces the vector 1614$_1$. Using the relation 1606 (Y=$\alpha$Z$_d$), the "Ybit" elements of the vector 1614$_1$ can be expressed in terms of the known bits of the word Z$_d$. In particular, the equations 1608 of FIG. 16A demonstrate that Ybit$_0$ equals Z$_d$bit$_1$, Ybit$_1$ equals Z$_d$bit$_2$ . . . and Ybit$_6$ equals Z$_d$bit$_7$. As shown in equations 1608, Ybit$_7$ is equal to what has been labelled Z$_d$bit$_8$. Z$_d$bit$_8$ is equal to Tr($\alpha^8$Z$_d$). It can be determined using finite field arithmetic that $\alpha^8=\alpha^0+\alpha^2+\alpha^3+\alpha^4$. This equivalence can be seen from the mapping shown in FIGS. 15A and 15B which is discussed below. Thus, Z$_d$bit$_8$ can be expressed in terms of the bits of the word Z$_d$ as Z$_d$bit$_8$=Tr($\alpha^8$Z$_d$)=Tr(($\alpha^0+\alpha^2+\alpha^3+\alpha^4$)Z$_d$)=Z$_d$bit$_0$+Z$_d$bit$_2$+Z$_d$bit$_3$+Z$_d$bit$_4$. Accordingly, all of the elements of the second dual basis vector 1604$_1$ can be expressed in terms of the bits of the word Z$_d$. In the present embodiment, the relation between the bits of the word Z$_d$ and Z$_d$bit$_8$ has been identified prior to run time of the circuit and even prior to design of the circuit. This relation enables a fast circuit design. Alternate embodiments need not identify these mappings prior to run time. The mappings between the bits of the word Z$_d$ and each of the bits $\{Z_d\text{bit}_{m-1} \ldots Z_d\text{bit}_{2m-2}\}$ are individual mappings that in the present embodiment are implemented in parallel. Alternate embodiments may implement less than all of these mappings in parallel with each other.

The third dual basis vector 1604$_2$ is determined from the first dual basis vector 1604$_0$ in a similar manner. In particular, to generate the vector 1604$_2$ the byte Y is substituted into vector 1604$_0$ to produce the vector 1614$_2$. When generating the vector 1604$_2$, however, the relation 1610 (y=$\alpha^2$Z$_d$) is used. The equations 1612 demonstrate the expression of each of the Ybit elements of vector 1614$_2$ in terms of the bits of the word Z$_d$ when using the relation 1610. In this case, Ybit$_6$=Z$_d$bit$_8$. Because Z$_d$bit$_8$ was expressed in terms of the bits of the word Z$_d$ with respect to vector 1614$_1$, that relation need not be rederived. As shown in equations 1608, Ybit$_7$ is equal to what has been labelled Z$_d$bit$_9$. Thus, to express the elements of vector 1614$_2$ in terms of the bits of the word Z$_d$, only one new relation needs to be evaluated. In particular, Z$_d$bit$_9$ is equal to Tr($\alpha^9$Z$_d$). It can be determined using finite field arithmetic that $\alpha^9=\alpha^1+$ $\alpha^3+\alpha^4+\alpha^5$. This equivalence can be seen from the mapping shown in FIGS. 15A and 15B which is discussed below. Thus, similar to $Z_d\text{bit}_8$, $Z_d\text{bit}_9$ can be expressed in terms of the bits of the word $Z_d$ as $Z_d\text{bit}_9=\text{Tr}(\alpha^9 Z_d)=\text{Tr}(\alpha^1+\alpha^3+\alpha^4+\alpha^5)Z_d)=Z_d\text{bit}_1+Z_d\text{bit}_3+Z_d\text{bit}_4+Z_d\text{bit}_5$. Thus, all of the elements of the third dual basis vector $1604_2$ can be expressed in terms of the bits of the word $Z_d$. Similar to the expression of $Z_d\text{bit}_8$, the relation between the bits of the word $Z_d$ and $Z_d\text{bit}_9$ has been identified prior to run time of the circuit and even prior to design of the circuit. This relation enables a fast circuit design.

The remaining dual basis vectors are shown in FIG. 16B. These vectors are generated in a similar manner to the vectors $1604_1$ and $1604_2$, except that for each of the vectors $1604_p$, the relation $Y=\alpha^p Z_d$ is used. Thus, vector $1604_3$ is generated using the relation $Y=\alpha^3 Z_d$, vector $1604_4$ is generated using the relation $Y=\alpha^4 Z_d$ and so on. Because the elements $Z_d\text{bit}_8$ and $Z_d\text{bit}_9$ have been expressed in terms of the bits of the word $Z_d$ when generating vectors $1604_1$ and $1604_2$, these elements need not be reevaluated. Thus, to express the remaining vectors $1604_3$ to $1604_7$ in terms of the bits of the word $Z_d$, relations between the bits of the word $Z_d$ and elements $Z_d\text{bit}_{10}$, $Z_d\text{bit}_{11}$, $Z_d\text{bit}_{12}$, $Z_d\text{bit}_{13}$ and $Z_d\text{bit}_{14}$ are evaluated. These relations (also called individual mappings) are generated in the same manner described with reference to vectors $1604_1$ and $1604_2$. The results of these evaluations is shown in FIG. 16B.

In the present embodiment, the binary mapping vector has elements that are the bits of the word G. In the present embodiment, the binary mapping vector is a "1 row by 8 column" vector that contains the least significant bit of the word G in the first column. Subsequent columns contain the increasingly significant bits of the word G up to the most significant bit of the word G in the last column. Thus, in the present embodiment, the binary mapping vector is a 1 by 8 vector having elements {$\text{Gbit}_0$ $\text{Gbit}_1$ $\text{Gbit}_2$ $\text{Gbit}_3$ $\text{Gbit}_4$ $\text{Gbit}_5$ $\text{Gbit}_6$ $\text{Gbit}_7$}.

Figure 16C:
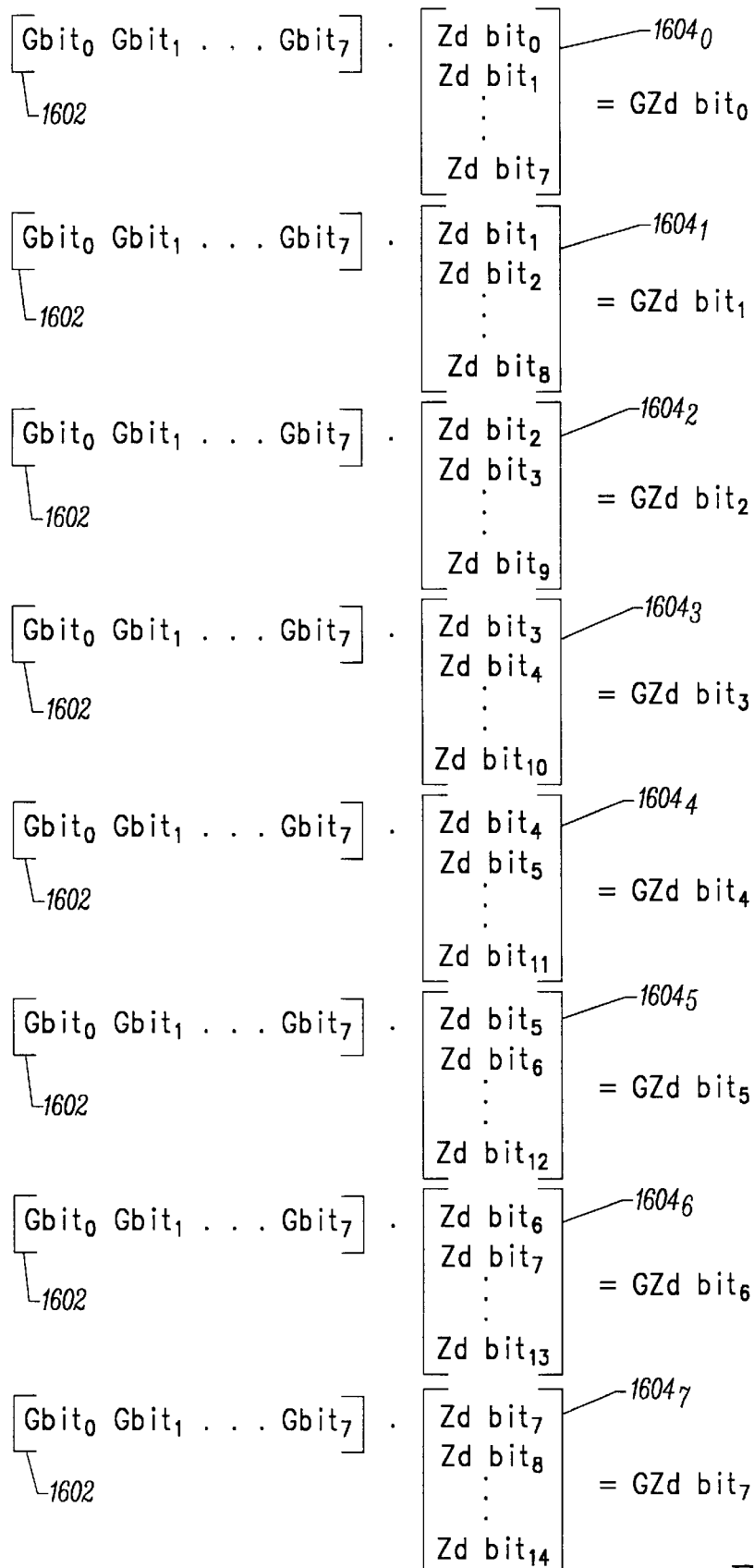
FIG. 16C illustrates vector multiplications used to generate bits of the dual basis product $GZ_d$.

In the present embodiment, the multiplier circuit 1308 generates the m bits of the dual basis product $GZ_d$ by multiplying the "1×m" binary mapping vector by each of the individual "m×1" dual basis vectors {$Z_d\text{bit}_{0+p}$ . . . $Z_d\text{bit}_{m-1+p}$} for each of the values of p as p varies across $0 \leq p \leq m-1$. These multiplications are illustrated in FIG. 16C. Mod(2) arithmetic is used during the multiplication process. Multiplication of the word G by the dual basis vector {$Z_d\text{bit}_{0+p}$ . . . $Z_d\text{bit}_{m-1+p}$} for p=0 generates the bit zero of the product $GZ_d$ or $GZ_d\text{bit}_0$. Similarly, multiplication of the word G by the dual basis vector {$Z_d\text{bit}_{0+p}$ . . . $Z_d\text{bit}_{m-1+p}$} for p=1 generates $GZ_d\text{bit}_1$. Multiplication of the word G by the individual dual basis vectors for the remaining values of p up to m−1 generates the remaining bits of the product $GZ_d$ or the bits $GZ_d\text{bit}_p$. For a further discussion of the mathematics underlying the binary mapping vector and the m dual basis vectors {$Z_d\text{bit}_{0+p}$ . . . $Z_d\text{bit}_{m-1+p}$}, please see Hsu et al, *The VLSI Implementation of a Reed-Solomon Encoder Using Berlekamp's Bit-Serial Multiplier Algorithm*, IEEE Transactions on Computers, Vol. C-33, No. 10, October 1984 and Berlekamp, *Bit-Serial Reed-Solomon Encoders*, IEEE Transactions on Information Theory, Vol. IT-28, No. 6, November 1982. While this multiplication is described in terms of vectors, the multiplication is intended to encompass alternate approaches that accomplish the same result. Thus, all of the dual basis vectors may be combined into a large 8 by 8 dual basis matrix and the binary mapping vector is multiplied by this matrix. In fact, such an approach still multiplies the identified vectors. Similarly, the multiplied bits may not be labelled or grouped as vectors. Even if handled on an individual basis, however, multiplying the individual bits as is done in the vector multiplication is considered as performing the multiplication of the identified vectors.

Once the multiplier circuit 1308 generates the dual basis product $GZ_d$, the dual basis product is provided to a dual to normal basis converter circuit 1312 using the output 1310. In the present embodiment, the dual to normal basis converter circuit 1312 converts any 8 bit word that corresponds to a dual basis representation into an 8 bit word that corresponds to the normal basis representation. The dual to normal basis converter circuit 1312 can be adapted to handle m bit words for different values of m. In the present embodiment, this circuit 1312 is used to convert the dual basis product $GZ_d$ into the normal basis product GZ in the Galois field $GF(2^8)$.

The designs of the normal to dual basis converter circuit 1306, of the multiplier circuit 1308 and of the dual to normal basis converter circuit 1312 enable the Galois field multiplier 1300 to produce the normal basis product GZ in under one clock cycle from the time that the multiplier G and the multiplicand Z are applied to the inputs 1302 and 1304, respectively. The multiplier 1300 could be adapted to provide the normal basis product in less than any number of clock cycles (e.g. less than any one of 8, 7, 6, 5, 4, 3, 2, 1 clock cycles). Typically in devices doing Reed-Solomon calculations in an actual application, shorter delays are better. The multiplier 1300 advantageously enables the normal basis product GZ to be generated in less than the m clock cycles that might be required by a conventional serial multiplier.

FIGS. 14A–14F are functional diagrams of an embodiment of the normal to dual basis converter circuit 1306. These figures illustrate that the input from input 1304 and the output to multiplier circuit 1308 are 8 bit buses. The separate FIGS. 14A–14F have been used for ease of illustration to illustrate the mappings from the input pins to the output pins of the converter circuit 1306. The bits of the word Z are input to the inputs 1402. The bits of the word $Z_d$ are output from the outputs 1404.

The normal to dual basis converter circuit 1306 implements a generalized normal to dual basis mapping that can be determined prior to the run-time of the circuit 1306. Alternate embodiments could determine the mapping after the circuit is powered up. In the present embodiment, this normal to dual basis mapping is hardwired in the circuit 1306. In alternate embodiments, configurable logic such as programmable logic arrays or field programmable gate arrays could be used rather than hard wiring to implement the circuit 1306. The normal to dual basis mapping can be determined using the trace function which can be defined as $tr(x)=x+x^{2^1}+x^{2^2}+ \ldots x^{2^{m-1}}$ where $\text{Tr}(\alpha^j \lambda_i)=1$ if i=j, and $\text{Tr}(\alpha^j \lambda_i)=0$ if i≠j. The word Z that is provided to input 1304 of FIG. 13 is used to illustrate the derivation of the generalized normal to dual basis mapping for m=8. Generalized normal to dual basis mappings can be determined in a similar manner for different values of m.

In particular, in the present embodiment where m=8, the word Z is the byte $\text{Zbit}_7$ $\text{Zbit}_6$ $\text{Zbit}_5$ $\text{Zbit}_4$ $\text{Zbit}_3$ $\text{Zbit}_2$ $\text{Zbit}_1$ $\text{Zbit}_0$ where each of the terms $\text{Zbit}_x=0$ or 1 depending on the value of the word Z. Expressed using the normal basis $$Z=\text{Zbit}_7\alpha^7+\text{Zbit}_6\alpha^6+\text{Zbit}_5\alpha^5+ \ldots +\text{Zbit}_0\alpha_0. \quad (26)$$

It can be shown that the trace function also has the property that for any byte Z, $\text{Tr}(Z\alpha^k)=Z_d\text{bit}_k$. Please see Hsu et al, *The VLSI Implementation of a Reed-Solomon Encoder Using Berlekamp's Bit-Serial Multiplier Algorithm*, IEEE Transactions on Computers, Vol. C-33, No. 10, October 1984. Using the equation $Tr(Z\alpha^k)=Z_d bit_k$, a reference mapping can be determined between the normal basis and the dual basis. This reference mapping can be used to express each of the normal basis elements (e.g. $\alpha^7, \alpha^6, \ldots \alpha^0$) in equation (26) in terms of dual basis elements (e.g. $\lambda_7, \lambda_6, \ldots \lambda_0$). FIGS. 15A and 15B provide an example of such a reference mapping 1500 for the present embodiment which uses the Galois field $GF(2^8)$.

FIGS. 15A and 15B illustrate in the reference mapping 1500 a power of $\alpha$ column 1502, a normal basis column 1504 and a dual basis column 1506. The rows numbered 0 to 255 in the power of $\alpha$ column 1502 indicate the power of $\alpha$ to which each row corresponds. For example, row 1508 corresponds to $\alpha^{49}$. The mapping between a particular power of $\alpha$ in column 1502 and its normal basis representation in column 1504 is determined using finite field arithmetic. Thus, the normal basis representation for $\alpha^{49}$ is determined using finite field arithmetic to express $\alpha^{49}$ as a combination of powers of a where the powers are m−1 or less. The normal basis representation for $\alpha^{49}$ is shown in column 1504 in the same row as the 49 in column 1502.

The mapping between a particular power of $\alpha$ and its dual basis representation in column 1506 is determined by substituting the particular power of $\alpha$ in the equation $Tr(Z\alpha^k) = Z_d bit_k$ as the element Z. The dual basis representation of $\alpha^{49}$ can be determined, for example, by evaluating $Tr(\alpha^{49} *\alpha^k) = Z_d bit_k$ where $Z_d bit_k$ is the $k^{th}$ bit of the dual basis equivalent of $\alpha^{49}$. Varying k from 0 to m−1 produces the 0 to m−1 position bits of the dual basis equivalent of $\alpha^{49}$. This dual basis equivalent is shown in column 1506 in the row having a 49 in the power of $\alpha$ column 1502. This dual basis equivalent is also the dual basis equivalent of the normal basis representation of $\alpha^{49}$ shown in column 1504. Accordingly, the reference mapping 1500 enables conversion between a power of $\alpha$, its normal basis representation and its dual basis representation. As shown in rows 1510, 1512, 1514, 1516, 1518, 1520, 1522 and 1524 of FIGS. 15A and 15B, the dual basis consists of a set of m linearly independent vectors having a one in only one dimension.

Thus, in the Galois field $GF(2^m)$, each power of $\alpha$ having a power of m or more can be expressed in the normal basis representation as a sum of the normal basis elements (i.e. powers of $\alpha$ having powers from 0 to m−1). Expressing a power of $\alpha$ where the power of $\alpha$ is m or greater using the normal basis elements (powers of a from 0 to m−1) is illustrated in the normal basis column 1504. In particular, each of the 0 bit to 7 bit columns in the normal basis column 1504 corresponds to a power of $\alpha$ in the normal basis. For example, the 0 bit column correponds to $\alpha^0$, the 1 bit column corresponds to $\alpha^1, \ldots$ the 7 bit column corresponds to $\alpha^7$. The normal basis column illustrates which elements in the normal basis should be summed to generate the power of a indicated in the power of a column 1502. Thus, row 1508, which has a one in the 2 bit, 3 bit and 7 bit columns, indicates that $\alpha^{49}=\alpha^2+\alpha^3+\alpha^7$.

Similarly, the dual basis column 1506 illustrates which elements of the dual basis should be summed to generate the power of $\alpha$ indicated in the power of $\alpha$ column 1502. In particular, column 1508 of row 49, having a one in the 4 bit and 6 bit columns of the dual basis column 1506 indicates that $\alpha^{49}=\lambda_4+\lambda_6$.

The reference mapping 1500 can also be used to determine which dual basis elements should be summed to produce a normal basis element. For example, row 1510 corresponds to $\alpha^0$. From the dual basis column 1506 in this row 1520 which has a one in the 5 bit column, it is clear that $\alpha^0=\lambda_5$. From the row 1512, it is clear that $\alpha^1=\lambda_4$. Similarly, it can be determined from the rows that have powers of $\alpha$ from 2 to 7 in the power of $\alpha$ column 1502 that $\alpha^2=\lambda_3+\lambda_7$, $\alpha^3=\lambda_2+\lambda_6+\lambda_7$, $\alpha^4=\lambda_1+\lambda_5+\lambda_6+\lambda_7$, $\alpha^5=\lambda_0+\lambda_4+\lambda_5+\lambda_6$, $\alpha^6=\lambda_3+\lambda_4+\lambda_5$ and $\alpha^7=\lambda_2+\lambda_3+\lambda_4$. These relations are used to produce the generalized normal to dual basis mapping.

Thus, substituting these values of the normal basis elements in terms of the dual basis elements into equation (26) produces the equation $$Z = Zbit_7(\lambda_2 + \lambda_3 + \lambda_4) + Zbit_6(\lambda_3 + \lambda_4 + \lambda_5) + \quad (27)$$
$$Zbit_5(\lambda_0 + \lambda_4 + \lambda_5 + \lambda_6) + Zbit_4(\lambda_1 + \lambda_5 + \lambda_6 + \lambda_7) + Zbit_3(\lambda_2 + \lambda_6 + \lambda_7) +$$
$$Zbit_2(\lambda_3 + \lambda_7) + Zbit_1(\lambda_4) + Zbit_0(\lambda_5).$$

Factoring out each of the dual basis elements produces the equation $$Z = \lambda_0(Zbit_5) + \lambda_1(Zbit_4) + \lambda_2(Zbit_3 + Zbit_7) + \quad (28)$$
$$\lambda_3(Zbit_2 + Zbit_6 + Zbit_7) + \lambda_4(Zbit_1 + Zbit_5 + Zbit_6 + Zbit_7) +$$
$$\lambda_5(Zbit_0 + Zbit_4 + Zbit_5 + Zbit_6) + \lambda_6(Zbit_3 + Zbit_4 + Zbit_5) +$$
$$\lambda_7(Zbit_2 + Zbit_3 + Zbit_4).$$

Comparing equation (28) to equation (25) (with m=8 substituted in equation (25)), it can be determined that $Z_d bit_0 = Zbit_5$;
$Z_d bit_1 = Zbit_4$;
$Z_d bit_2 = Zbit_3 + Zbit_7$
$Z_d bit_3 = Zbit_2 + Zbit_6 + Zbit_7$;
$Z_d bit_4 = Zbit_1 + Zbit_5 + Zbit_6 + Zbit_7$;
$Z_d bit_5 = Zbit_0 + Zbit_4 + Zbit_5 + Zbit_6$;
$Z_d bit_6 = Zbit_3 + Zbit_4 + Zbit_5$; and
$Z_d bit_7 = Zbit_2 + Zbit_3 + Zbit_4$ where each "+" sign represents mod(2) addition or an Exclusive OR. In other words, the bits of the word $Z_d$ can be determined from the bits of the word Z. These equations together form the normal to dual basis mapping. Each of the equations can be considered to be an individual mapping in the overall normal to dual basis mapping. In the present embodiment, this normal to dual basis mapping is determined prior to run time, although alternate embodiments need not do so. While the present embodiment has determined mappings between a normal and dual basis for the Galois field $GF(2^8)$, this technique can be generalized to devise a normal to dual basis converter for the Galois field $GF(2^m)$ for any m. Such a normal to dual basis converter circuit can be implemented to generate from any normal basis m bit word in the Galois field $GF(2^m)$ the corresponding dual basis word.

Figure 14A:
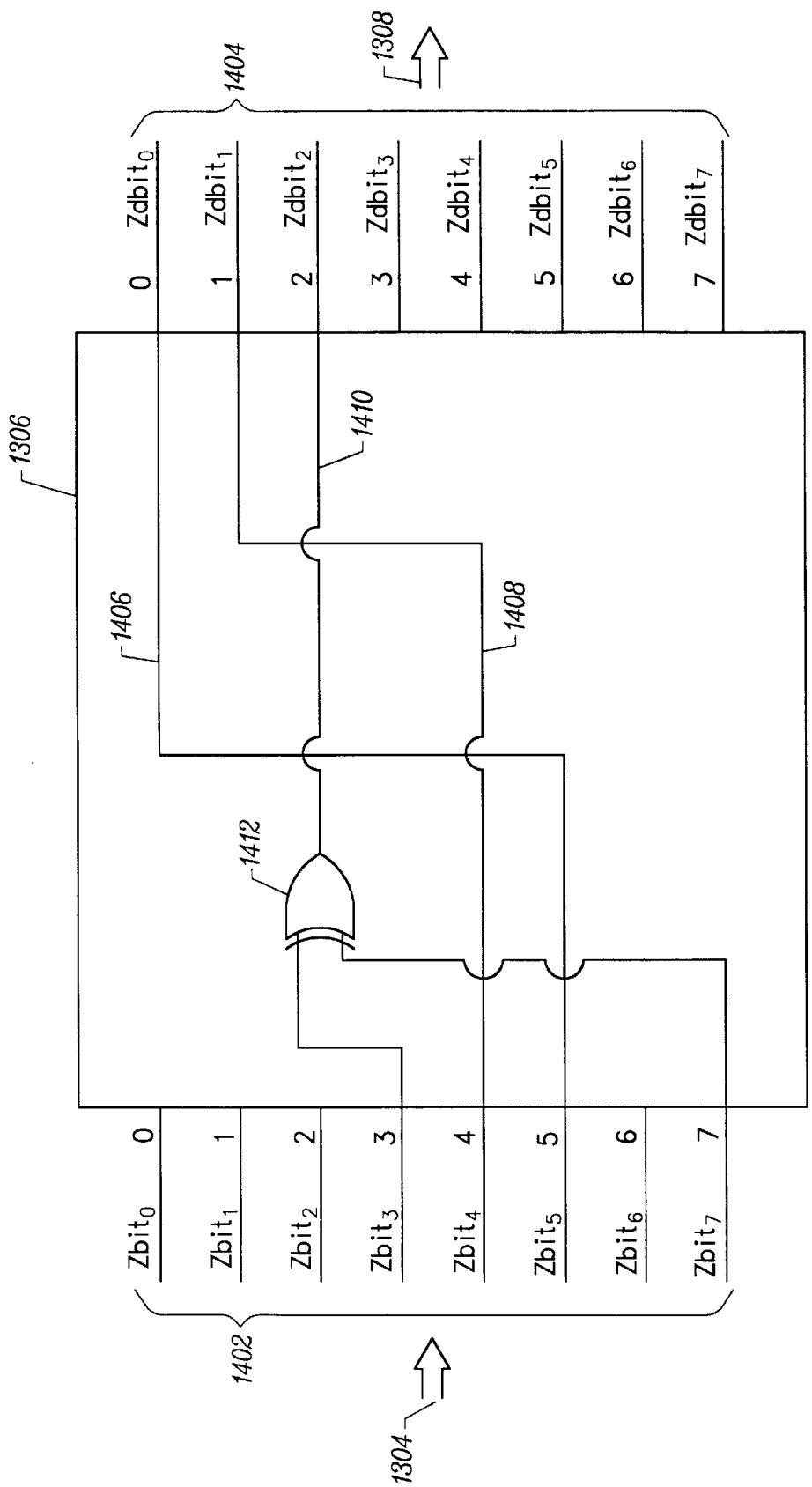
FIGS. 14A–14F illustrate functional diagrams of a normal to dual basis converter that may be used in the Galois field multiplier of FIG. 13.
Figure 14B:
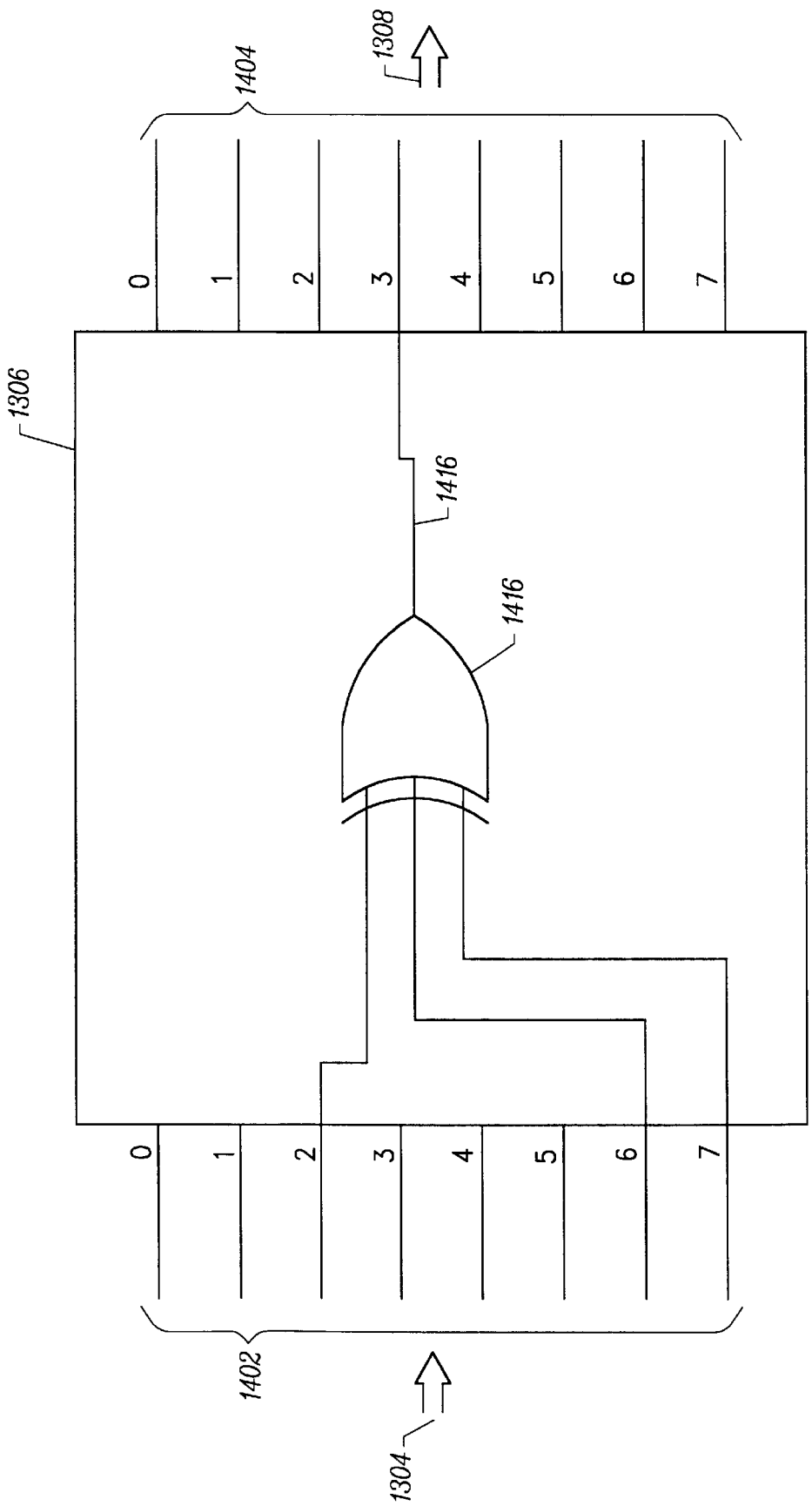
Figure 14C:
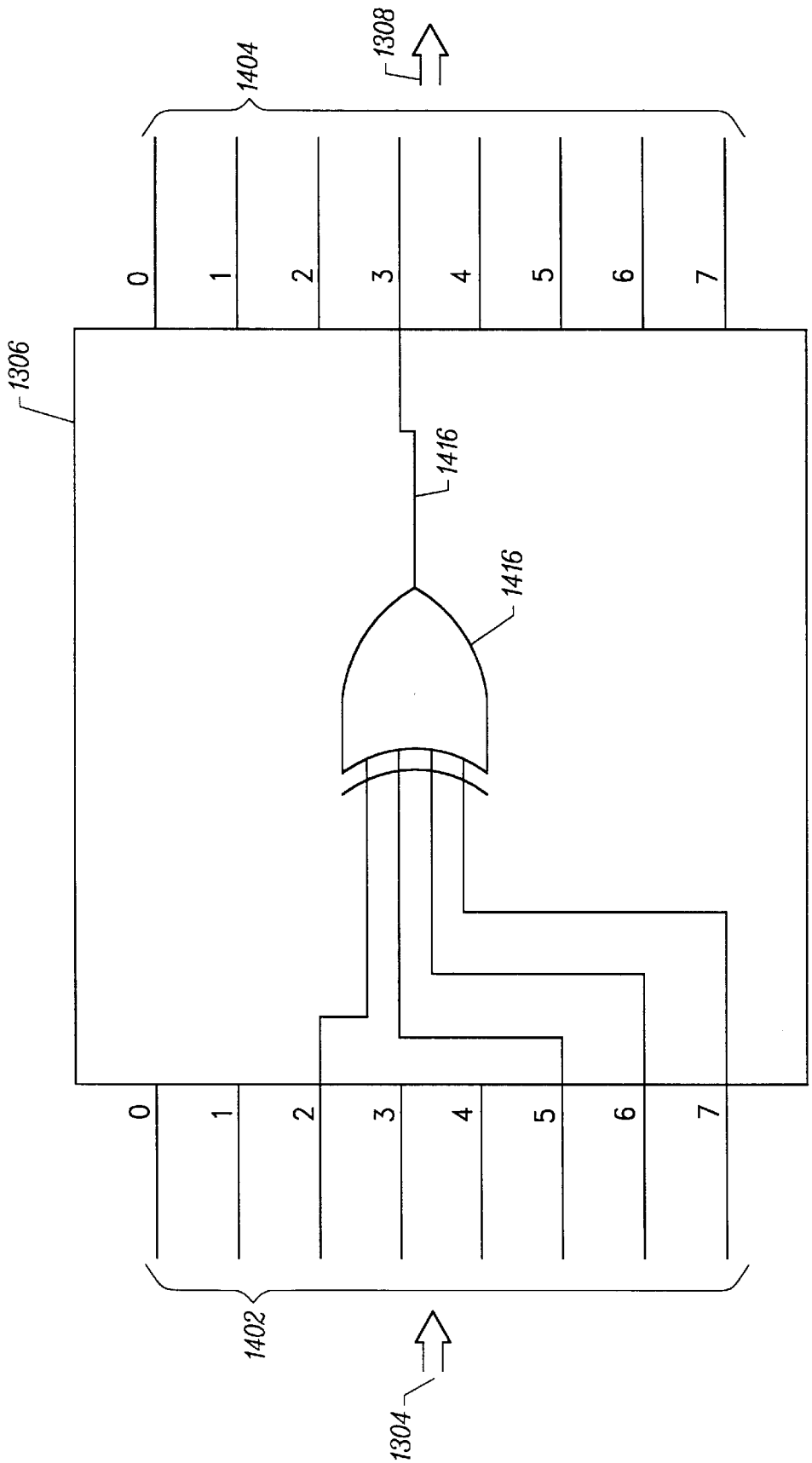
Figure 14D:
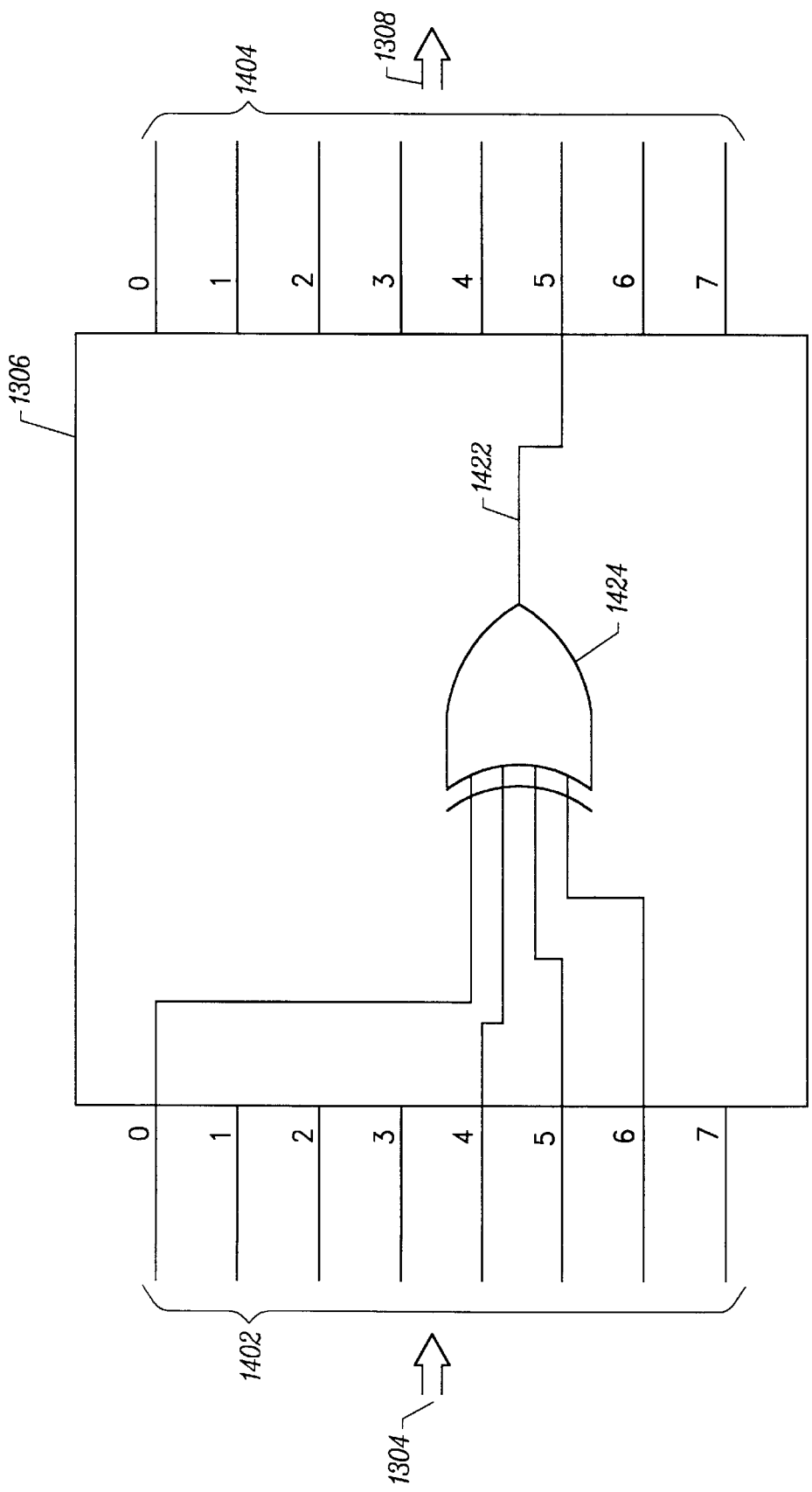
Figure 14E:
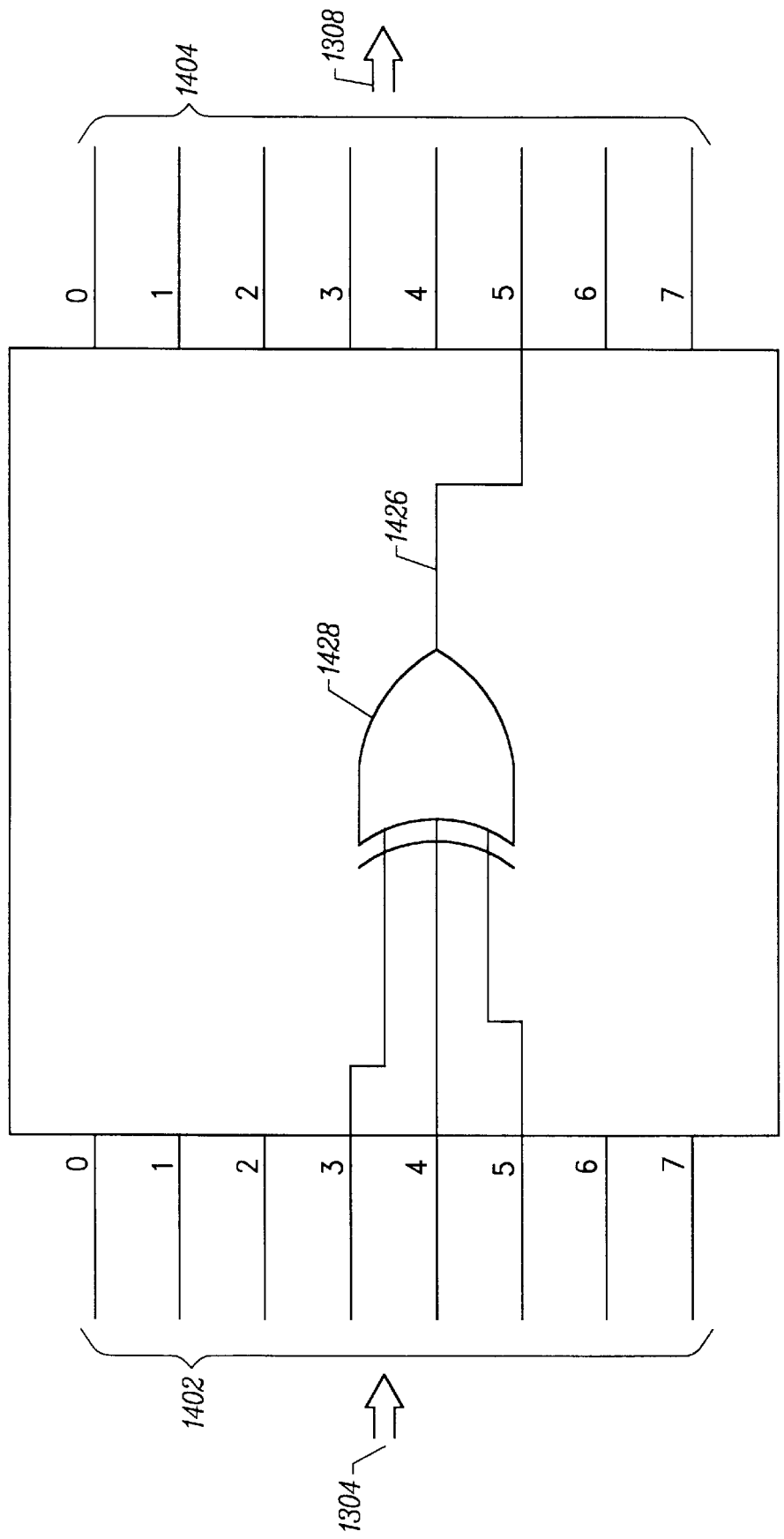
Figure 14F:
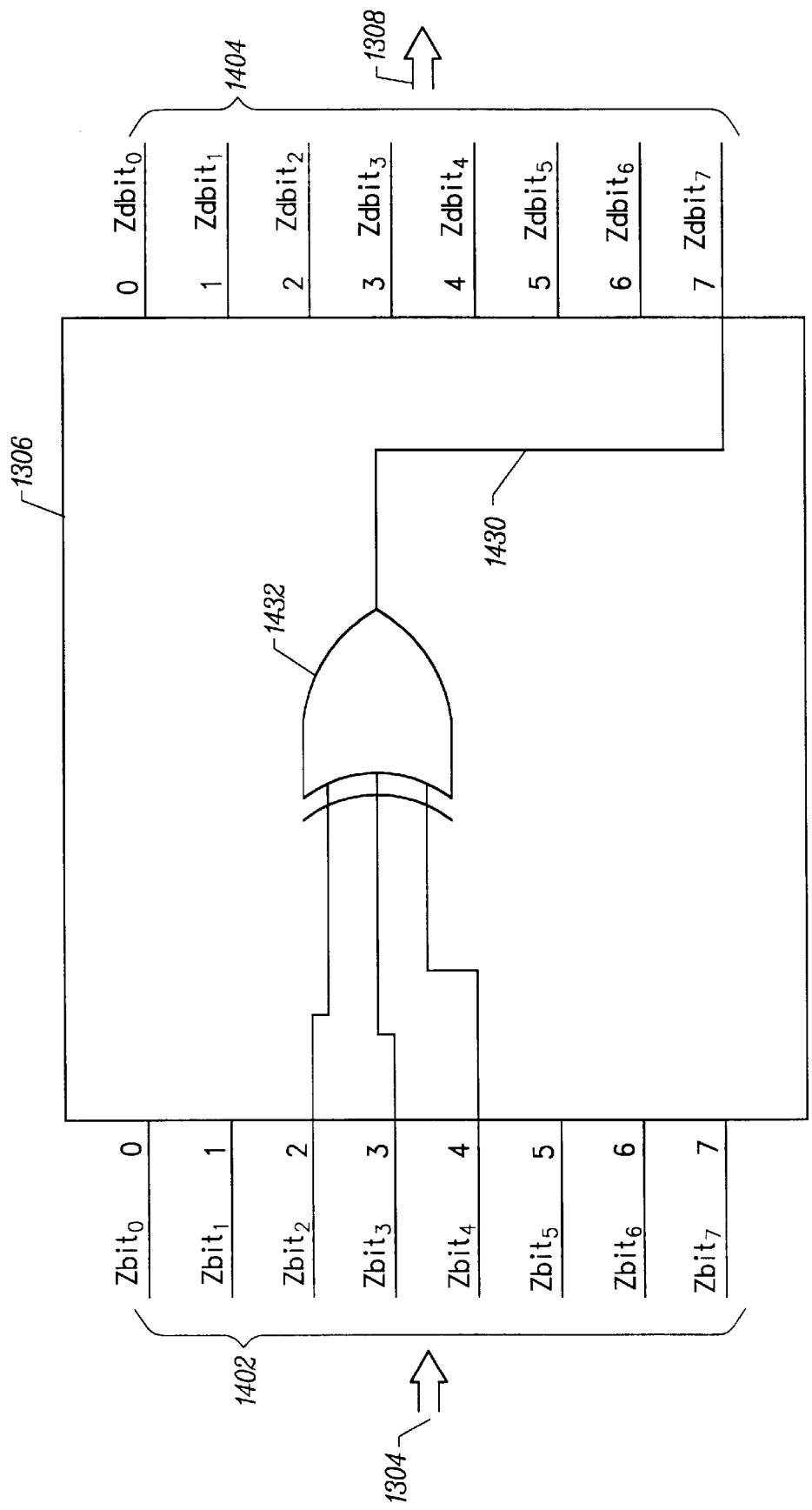

In the present embodiment, the normal to dual basis converter circuit implements all of the individual mappings in parallel. For example, in FIG. 14A, the path 1406 implements the individual mapping $Z_d bit_0 = Zbit_5$. The path 1408 implements the individual mapping $Z_d bit_1 = Zbit_4$. The path 1410, which includes the two input Exclusive OR 1412, implements the individual mapping $Z_d bit_2 = Zbit_3 + Zbit_7$. FIG. 14B illustrates the path 1414, which includes the three input Exclusive OR 1416, implementing the individual mapping $Z_d bit_3 = Zbit_2 + Zbit_6 + Zbit_7$. FIG. 14C illustrates the path 1418, which includes the four input Exclusive OR 1420, implementing the individual mapping $Z_d bit_4 = Zbit_1 + Zbit_5 + Zbit_6 + Zbit_7$. FIG. 14D illustrates the path 1422, which includes the four input Exclusive OR 1424, implementing the individual mapping $Z_d bit_5 = Zbit_0 + Zbit_4 + Zbit_5 + Zbit_6$. FIG. 14E illustrates the path 1426, which includes the three input Exclusive OR 1428, implementing the individual mapping $Z_d\text{bit}_6=Z\text{bit}_3+Z\text{bit}_4+Z\text{bit}_5$. FIG. 14F illustrates the path 1430, which includes the three input Exclusive OR 1432, implementing the individual mapping $Z_d\text{bit}_7=Z\text{bit}_2+Z\text{bit}_3+Z\text{bit}_4$. Implementing these paths and/or mappings in parallel results in a normal to dual basis converter circuit that has a maximum delay that corresponds to the delay of a four input Exclusive OR, such as Exclusive OR 1424, for example. Alternate embodiments of the invention could implement all of these paths 1406, 1408, 1410, 1414, 1418, 1422, 1426 and 1430 in series or could implement some of the paths in series and some of the paths in parallel. Implementing all of the paths in parallel, however, typically will provide the greatest speed. Embodiments of the invention could also implement the mappings using circuits logically equivalent to those illustrated in FIGS. 14A–14F. For example, a five input Exclusive OR might be implemented as a plurality of Exclusive OR circuits or some other logically equivalent circuit.

Referring back to FIG. 13, the multiplier circuit 1308 will now be described in more detail. This circuit 1308 contains generator circuit 1316 and vector multiplier circuit 1318. The generator circuit 1316 receives the bits of the word $Z_d$ and generates the "additional vector bits" of the dual basis vectors $Z_d\text{bit}_m \ldots Z_d\text{bit}_{2m-2}$ (e.g. $Z_d\text{bit}_8, Z_d\text{bit}_9 \ldots Z_d\text{bit}_{14}$ of FIGS. 16A and 16B). The bits of the words G and $Z_d$ are supplied to the vector multiplier 1318. The "additional vector" bits $Z_d\text{bit}_m \ldots Z_d\text{bit}_{2m-2}$ also are supplied from the output of generator circuit 1316 to the vector multiplier 1318. Vector multiplier 1318 executes the multiplications shown in FIG. 16C to generate the product $GZ_d$. In particular, as shown in FIG. 16C, the binary mapping vector 1602 is multiplied individually with each of the dual basis vectors 1604$_p$ for p varying from 0 to m−1. Each individual multiplication produces the respective bits $GZ_d\text{bit}_p$ of the dual basis product $GZ_d$.

Similar to the normal to dual basis converter circuit 1306, the generator circuit 1316 uses exclusive OR gates to accomplish the mod(2) arithmetic that generates the elements $Z_d\text{bit}_8, Z_d\text{bit}_9 \ldots Z_d\text{bit}_{14}$. As demonstrated in the discussion with reference to FIGS. 16A and 16B, the following individual mappings between the bits of the word $Z_d$ and the additional vector bits are true:

$$Z_d\text{bit}_8=Z_d\text{bit}_0+Z_d\text{bit}_2+Z_d\text{bit}_3+Z_d\text{bit}_4, \quad (29)$$

$$Z_d\text{bit}_9=Z_d\text{bit}_1+Z_d\text{bit}_3+Z_d\text{bit}_4+Z_d\text{bit}_5, \quad (30)$$

$$Z_d\text{bit}_{10}=Z_d\text{bit}_2+Z_d\text{bit}_4+Z_d\text{bit}_5+Z_d\text{bit}_6, \quad (31)$$

$$Z_d\text{bit}_{11}=Z_d\text{bit}_3+Z_d\text{bit}_5+Z_d\text{bit}_6+Z_d\text{bit}_7, \quad (32)$$

$$Z_d\text{bit}_{12}=Z_d\text{bit}_0+Z_d\text{bit}_2+Z_d\text{bit}_3+Z_d\text{bit}_6+Z_d\text{bit}_7, \quad (33)$$

$$Z_d\text{bit}_{13}=Z_d\text{bit}_0+Z_d\text{bit}_1+Z_d\text{bit}_2+Z_d\text{bit}_7, \quad (34)$$

$$Z_d\text{bit}_{14}=Z_d\text{bit}_0+Z_d\text{bit}_1+Z_d\text{bit}_4. \quad (35)$$

In the present embodiment, equations (29)–(35) are implemented in generator circuit 1316 in the same manner as the individual mappings are implemented in the normal to dual basis converter circuit 1306 (discussed above) and in the dual to normal basis converter circuit 1312 (discussed below). Again, each "+" sign is mod(2) arithmetic. Thus, each of equations (29)–(32) and (34) is implemented using a four input exclusive OR gate, equation (33) is implemented using a five input exclusive OR gate, and equation (35) is implemented using a three input exclusive OR gate. Again, equivalent logic may be used in alternate embodiments.

Figure 18:
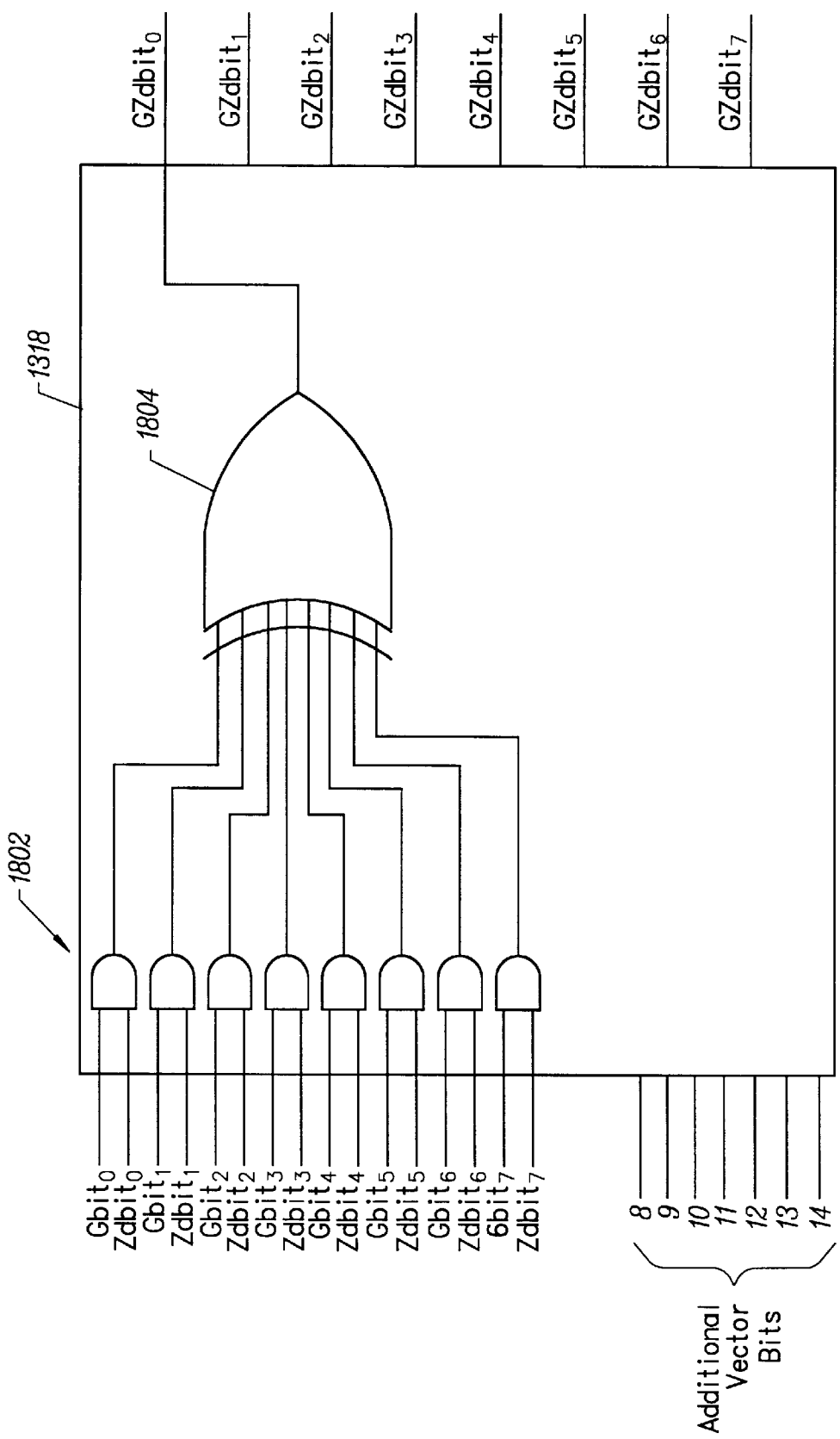
FIG. 18 illustrates an example of a circuit used to implement a vector multiplier circuit of an embodiment of the present invention.

With reference again to FIG. 13, the vector multiplier 1318 uses AND gates to implement the multiplications and uses exclusive OR gates to implement the mod(2) additions required in the vector multiplication shown in FIG. 16C. Thus, as shown in FIG. 16C, the binary mapping vector 1602 is multiplied by the dual basis vector 1604$_0$. This multiplication requires that the equation $$GZ_d\text{bit}_0=(G\text{bit}_0*Z_d\text{bit}_0)+(G\text{bit}_1*Z_d\text{bit}_1)+(G\text{bit}_2*Z_d\text{bit}_2)+\\(G\text{bit}_3*Z_d\text{bit}_3)+(G\text{bit}_4*Z_d\text{bit}_4)+(G\text{bit}_5*Z_d\text{bit}_5)+(G\text{bit}_6*Z_d\text{bit}_6)+\\(G\text{bit}_7*Z_d\text{bit}_7).$$

be implemented. This equation is implemented in vector multiplier circuit 1318 as shown in FIG. 18. Each of the products of this equation (shown in parentheses) is produced by providing the appropriate multiplicand and multiplier bits to the inputs of one of the two input AND gates 1802. The resulting eight products are mod(2) added together by providing the products to the inputs of the eight input exclusive OR gate 1804. The output of the 8 input exclusive OR gate provides the bit $GZ_d\text{bit}_0$ of the dual basis product $GZ_d$. Again, alternate logically equivalent gate configurations could be used (e.g. the two input AND gates could be replaced by a NAND gate and an inverter; the eight input exclusive OR gate could be replaced by a plurality of two input exclusive OR gates). The remaining bits $GZ_d\text{bit}_1$ to $GZ_d\text{bit}_7$ are generated by performing the remaining vector multiplications illustrated in FIG. 16C and implementing the vector multiplications in the same manner using two input AND gates and eight input exclusive OR gates. Thus, the bit $GZ_d\text{bit}_1$ is generated by implementing the equation $$GZ_d\text{bit}_1=(G\text{bit}_0*Z_d\text{bit}_1)+(G\text{bit}_1*Z_d\text{bit}_2)+(G\text{bit}_2*Z_d\text{bit}_3)+\\(G\text{bit}_3*Z_d\text{bit}_4)+(G\text{bit}_4*Z_d\text{bit}_5)+(G\text{bit}_5 Z_d\text{bit}_6)+(G\text{bit}_6*Z_d\text{bit}_7)+\\(G\text{bit}_7*Z_d\text{bit}_8).$$

where $Z_d\text{bit}_8=Z_d\text{bit}_0+Z_d\text{bit}_2+Z_d\text{bit}_3+Z_d\text{bit}_4$. This equation may be implemented by using AND gates to form the products and an exclusive OR gate to perform the mod(2) additions as described with respect to $GZ_d\text{bit}_0$ (not shown). The remaining equations to derive bits $GZ_d\text{bit}_2 \ldots GZ_d\text{bit}_7$ are similar and are illustrated in FIG. 16C by the vector multiplications. These equations may be implemented in the same manner (not shown). The resulting bits $GZ_d\text{bit}_0, GZ_d\text{bit}_1 \ldots GZ_d\text{bit}_7$ of the dual basis product $GZ_d$ are output from the vector multiplier circuit 1318 and provided to the ouput of the multiplier circuit 1308. Again, these individual mappings and/or circuit paths may all be implemented in parallel, all be implemented in series, or some implemented in parallel and some in series.

FIGS. 17A–G illustrate the dual to normal basis converter circuit 1312 which receives the dual basis product $GZ_d$ from the multiplier circuit 1308. This circuit 1312 is implemented in a similar manner to the normal to dual basis converter circuit 1306. In particular, the dual to normal basis converter circuit 1312 implements a generalized dual to normal basis mapping that can be determined prior to run-time. In the present embodiment, this dual to normal basis mapping is hardwired in the circuit 1312. In alternate embodiments, configurable logic such as programmable logic arrays or field programmable gate arrays could be used rather than hard wiring to implement the circuit 1312. Again, the multiple FIGS. 17A–G are used for ease of illustration to illustrate the mappings from the input pins to the output pins of the converter circuit 1312. The bits of the word $GZ_d$ are input to the inputs 1702. The bits of the word GZ are output from the outputs 1704.

Similar to the normal to dual basis mapping, the dual to normal basis mapping can be determined from the mapping

1500 of FIGS. 15A and 15B. The product $GZ_d$ is used to illustrate the derivation of the dual to normal basis mapping.

In particular, in the present embodiment where m=8, the product $GZ_d$ is the byte $GZ_d bit_7$ $GZ_d bit_6$ $GZ_d bit_5$ $GZ_d bit_4$ $GZ_d bit_3$ $GZ_d bit_2$ $GZ_d bit_1$ $GZ_{bit0}$ where each of the terms $GZ_d bit_x=0$ or 1 depending on the value of the word $GZ_d$. Expressed using the dual basis $$GZ_d = GZ_d bit_7 \lambda_7 + GZ_d bit_6 \lambda_6 + GZ_d bit_5 \lambda_5 + \ldots + GZ_d bit_0 \lambda_0. \quad (36)$$

Using mapping 1500 in a similar manner to that described earlier, the dual basis elements can be expressed in terms of the normal basis elements. In particular, from row 1514 in FIG. 15B, it is seen that $\lambda_0 = \alpha^0 + \alpha^2 + \alpha^3 + \alpha^5 + \alpha^7$. From row 1516 it can be seen that $\lambda_1 = \alpha^3 + \alpha^4 + \alpha^6 + \alpha^7$. From row 1518 in FIG. 15A it can be seen that $\lambda_2 = \alpha^0 + \alpha^6 + \alpha^7$. From row 1520 it can be seen that $\lambda_3 = \alpha^0 + \alpha^1 + \alpha^6$. From rows 1512 and 1510, respectively, we have shown that $\lambda_4 = \alpha^1$ and $\lambda_5 = \alpha^0$. From row 1524 in FIG. 15B it can be see that $\lambda_6 = \alpha^1 + \alpha^2 + \alpha^3 + \alpha^7$. From row 1522 it can be seen that $\lambda_7 = \alpha^0 + \alpha^1 + \alpha^2 + \alpha^6$. Substituting these equations into equation (36) produces the equation $$\begin{aligned}
GZ_d = &\ GZ_d bit_7(\alpha^0 + \alpha^1 + \alpha^2 + \alpha^6) + \\
&\ GZ_d bit_6(\alpha^1 + \alpha^2 + \alpha^3 + \alpha^7) + GZ_d bit_5 \alpha^0 + GZ_d bit_4 \alpha^1 + \\
&\ GZ_d bit_3(\alpha^0 + \alpha^1 + \alpha^6) + GZ_d bit_2(\alpha^0 + \alpha^6 + \alpha^7) \\
&\ GZ_d bit_1(\alpha^3 + \alpha^4 + \alpha^6 + \alpha^7) + GZ_d bit_0(\alpha^0 + \alpha^2 + \alpha^3 + \alpha^5 + \alpha^7).
\end{aligned} \quad (37)$$

Factoring out the normal basis elements produces the equation $$\begin{aligned}
GZ_d = &\ \alpha^0(GZ_d bit_0 + GZ_d bit_2 + GZ_d bit_3 + GZ_d bit_5 + GZ_d bit_7) + \\
&\ \alpha^1(GZ_d bit_3 + GZ_d bit_4 + GZ_d bit_6 + GZ_d bit_7) + \\
&\ \alpha^2(GZ_d bit_0 + GZ_d bit_6 + GZ_d bit_7) + \\
&\ \alpha^3(GZ_d bit_0 + GZ_d bit_1 + GZ_d bit_6) + \alpha^4(GZ_d bit_1) + \alpha^5(GZ_d bit_0) + \\
&\ \alpha^6(GZ_d bit_1 + GZ_d bit_2 + GZ_d bit_3 + GZ_d bit_7) + \\
&\ \alpha^7(GZ_d bit_0 + GZ_d bit_1 + GZ_d bit_2 + GZ_d bit_6).
\end{aligned} \quad (38)$$

Comparing equation (38) to the normal basis representation of the product GZ (i.e. $GZ = \alpha^0(GZbit_0) + \alpha^1(GZbit_1) + \alpha^2(GZbit_2) + \alpha^3(GZbit_3) + \alpha^4(GZbit_4) + \alpha^5(GZbit_5) + \alpha^6(GZbit_6) + \alpha^7(GZbit_7)$) it can be seen that $$GZbit_0 = GZ_d bit_0 + GZ_d bit_2 + GZ_d bit_3 + GZ_d bit_5 + GZ_d bit_7; \quad (39)$$

$$GZbit_1 = GZ_d bit_3 + GZ_d bit_4 + GZ_d bit_6 + GZ_d bit_7; \quad (40)$$

$$GZbit_2 = GZ_d bit_0 + GZ_d bit_6 + GZ_d bit_7; \quad (41)$$

$$GZbit_3 = GZ_d bit_0 + GZ_d bit_1 + GZ_d bit_6; \quad (42)$$

$$GZbit_4 = GZ_d bit_1; \quad (43)$$

$$GZbit_5 = GZ_d bit_0; \quad (44)$$

$$GZbit_6 = GZ_d bit_1 + GZ_d bit_2 + GZ_d bit_3 + GZ_d bit_7; \quad (45)$$

$$GZbit_7 = GZ_d bit_0 + GZ_d bit_1 + GZ_d bit_2 + GZ_d bit_6 \quad (46)$$

where each "+" sign represents mod(2) addition or an Exclusive OR. In other words, the bits of the word GZ can be determined from the bits of the word $GZ_d$. Equations (39) to (46) illustrate the dual to normal basis mapping. Each of these equations is an individual mapping in the overall dual to normal basis mapping. In the present embodiment, the dual to normal basis mapping is determined prior to run time although alternate embodiments need not do so. While the present embodiment has determined mappings between a dual and normal basis for the Galois field $GF(2^8)$, this technique can be generalized to devise a dual to normal basis converter for the Galois field $GF(2^m)$ for any m. Such a dual to normal basis converter circuit can be implemented to generate from any dual basis m bit word in the Galois field $GF(2^m)$ the corresponding normal basis word.

Figure 17A:
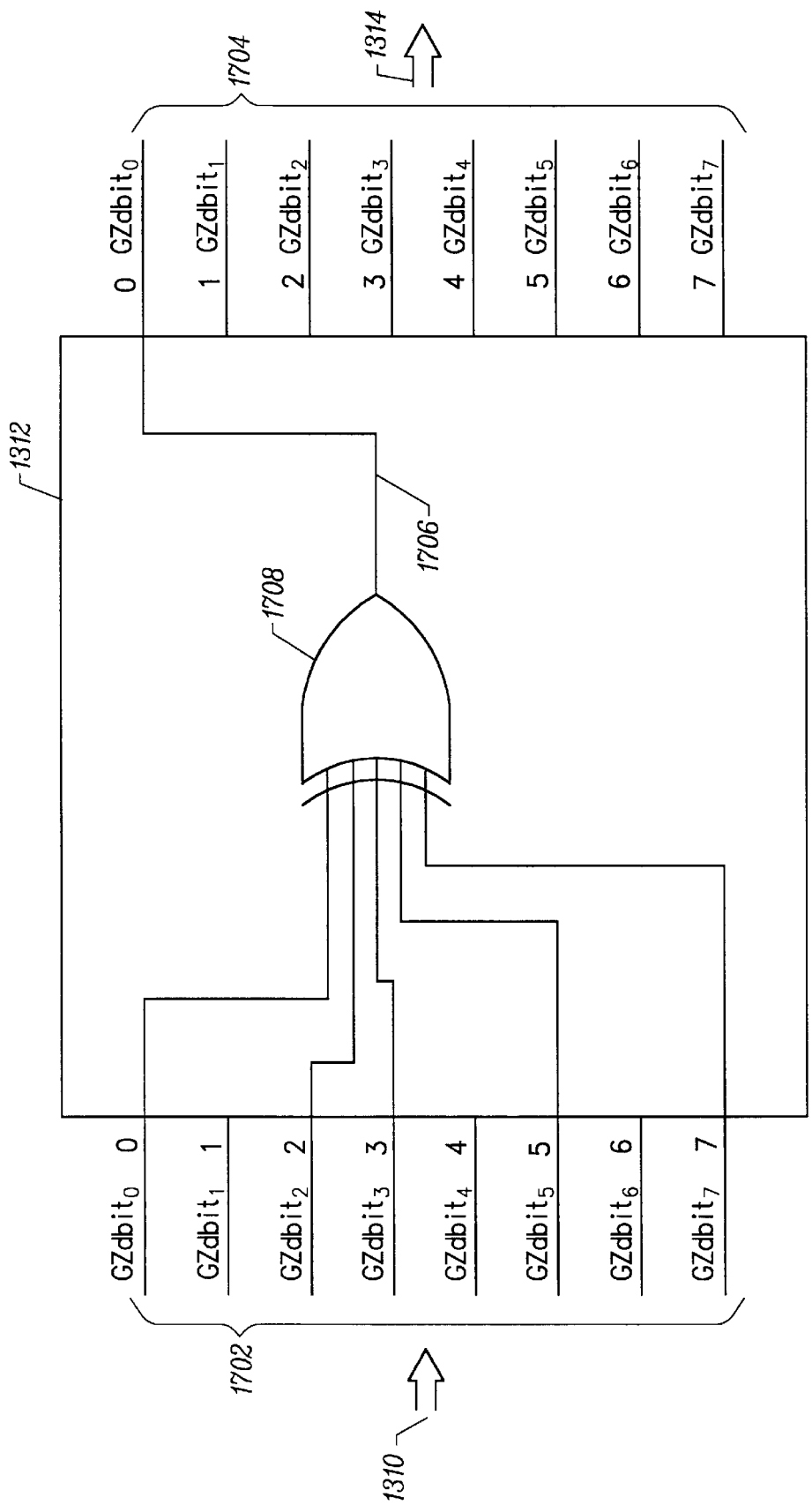
FIGS. 17A–17G illustrate functional diagrams of a dual to normal basis converter that may be used in the Galois field multiplier of FIG. 13.
Figure 17B:
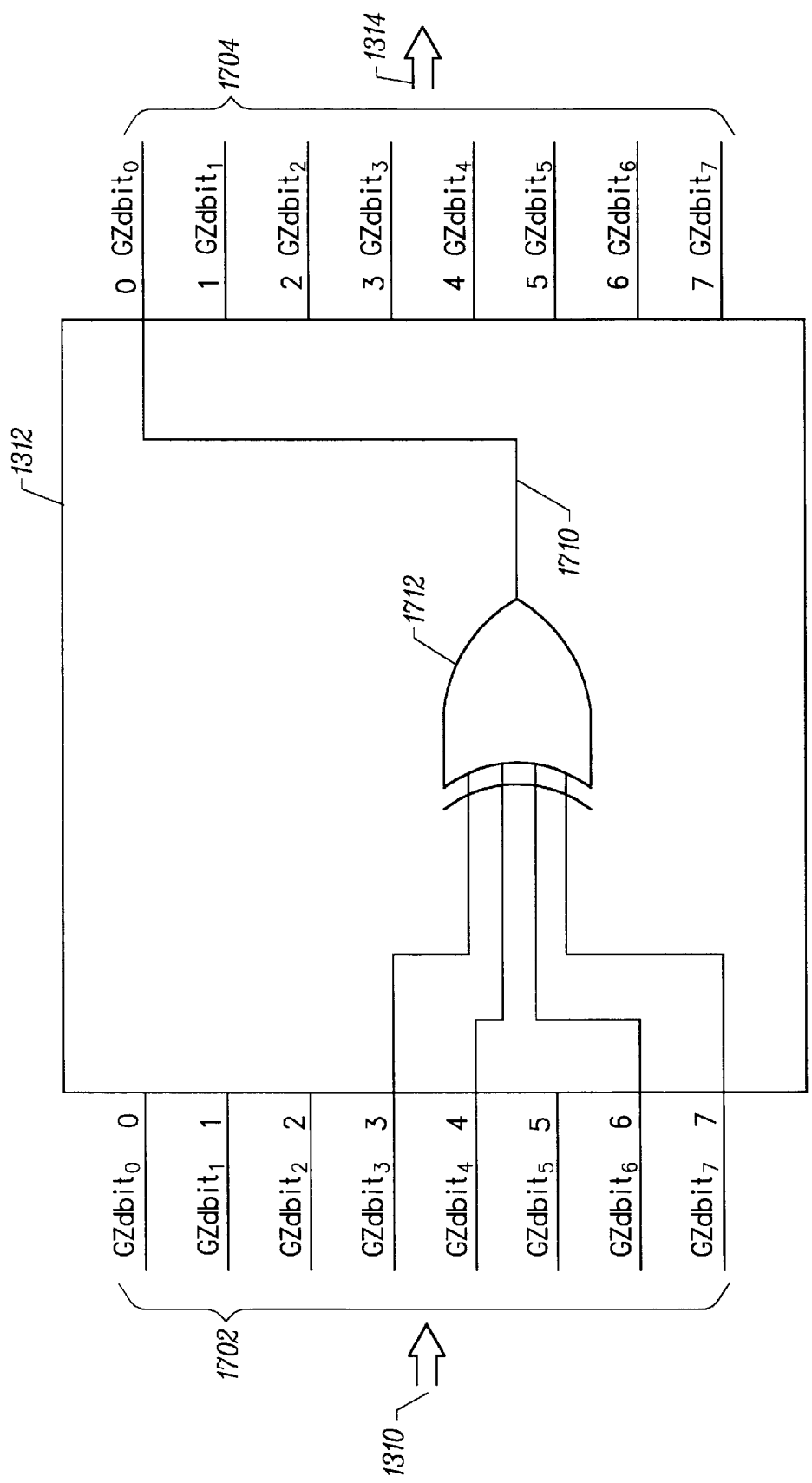
Figure 17C:
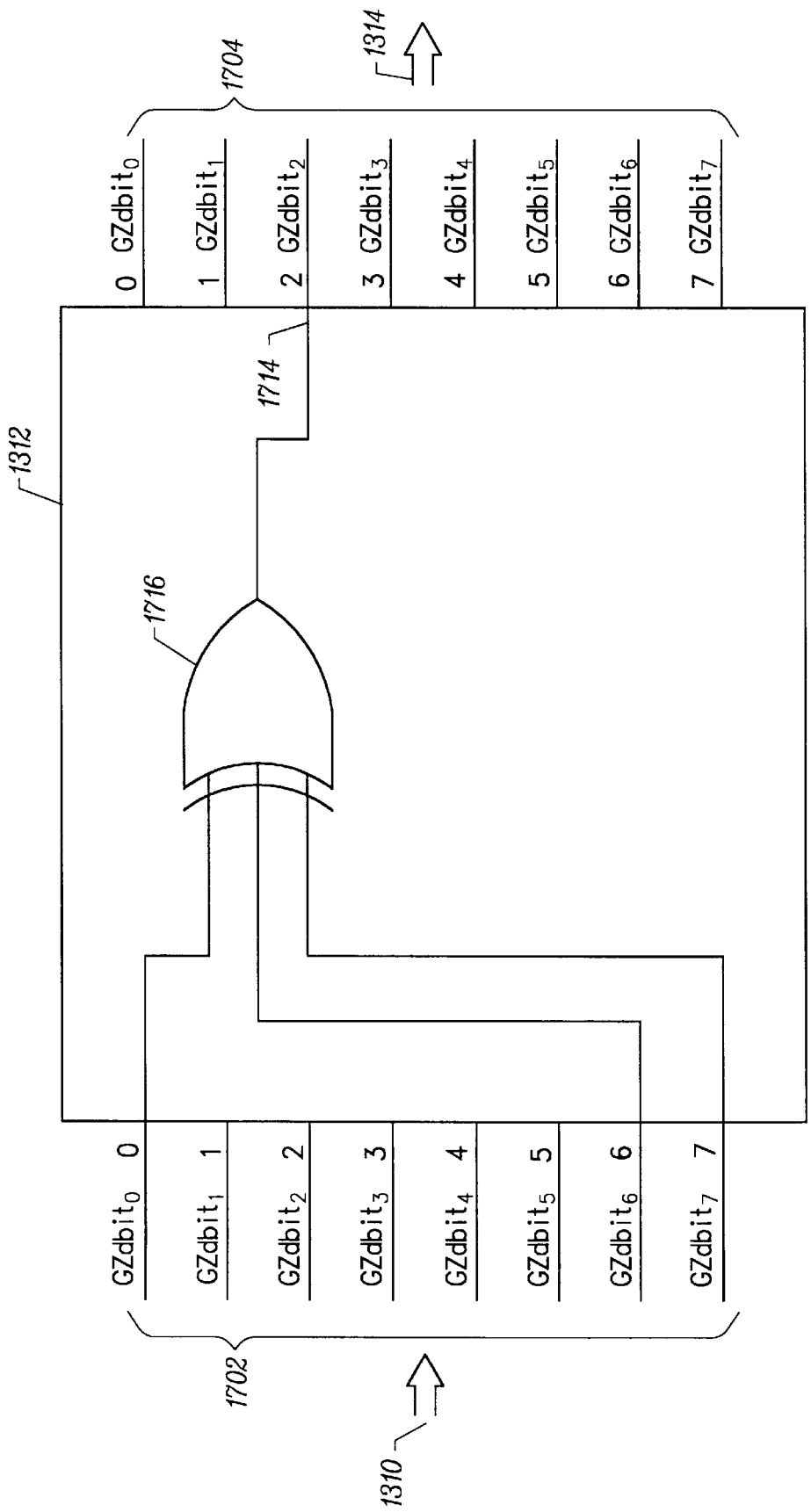
Figure 17D:
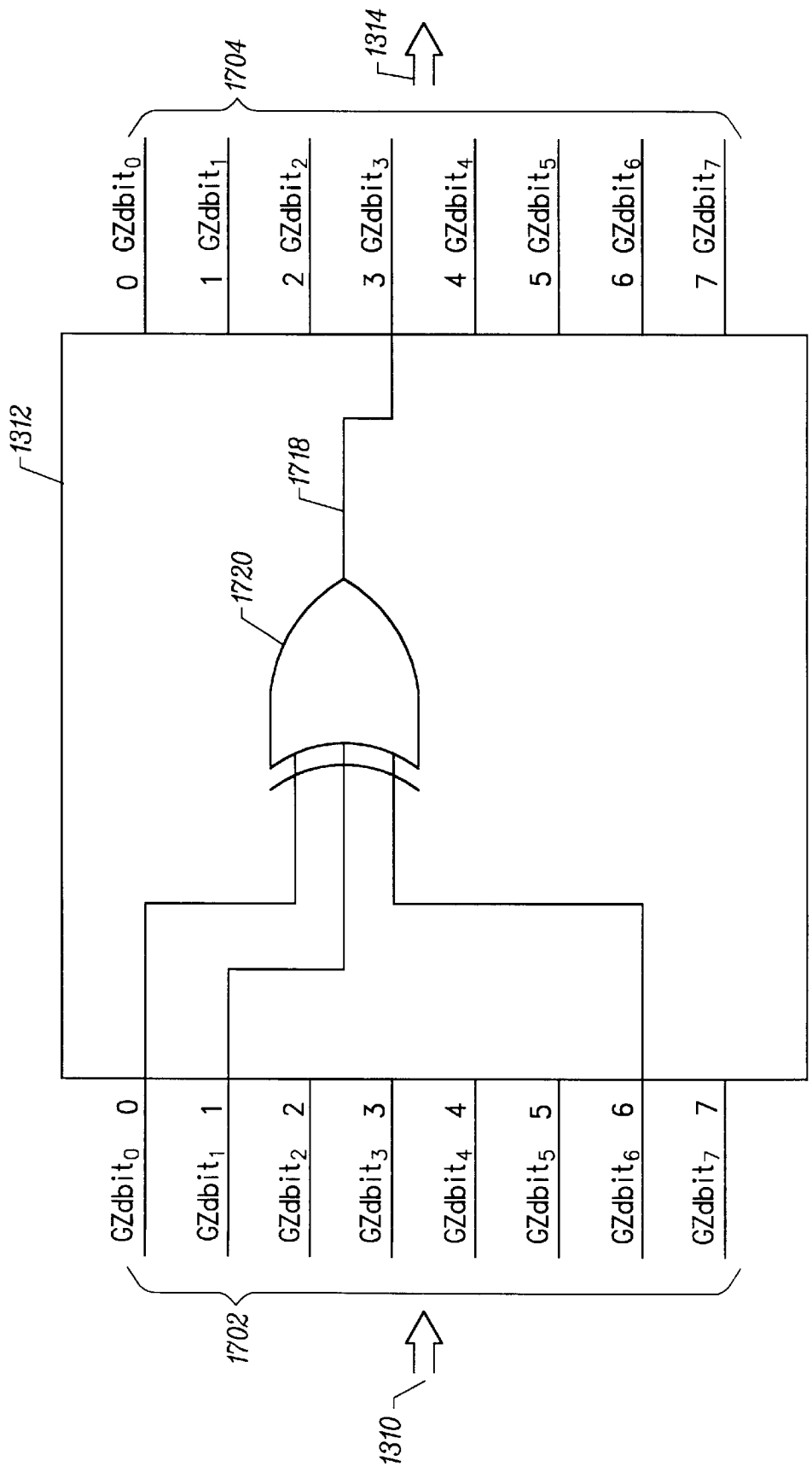
Figure 17E:
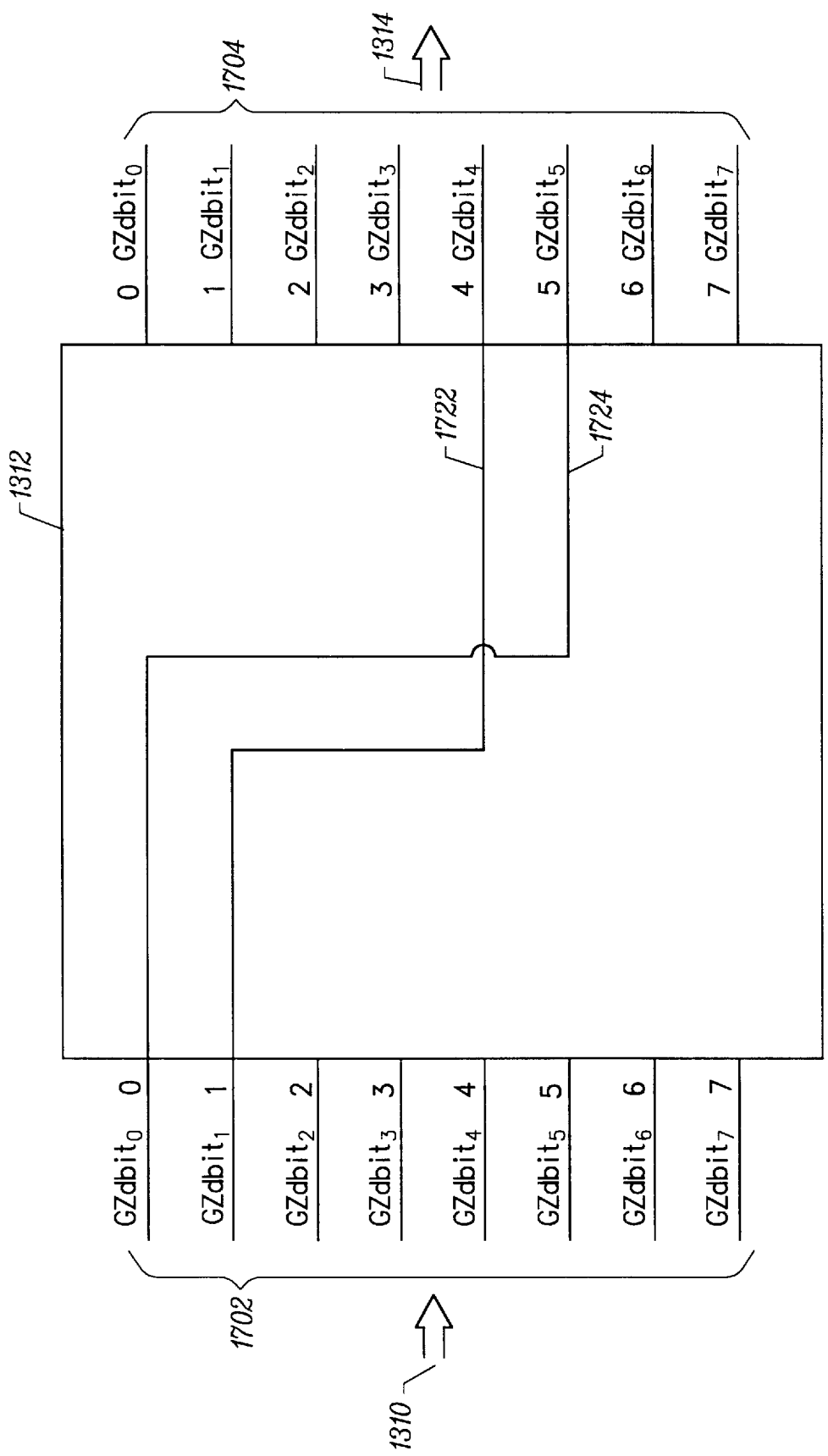
Figure 17F:
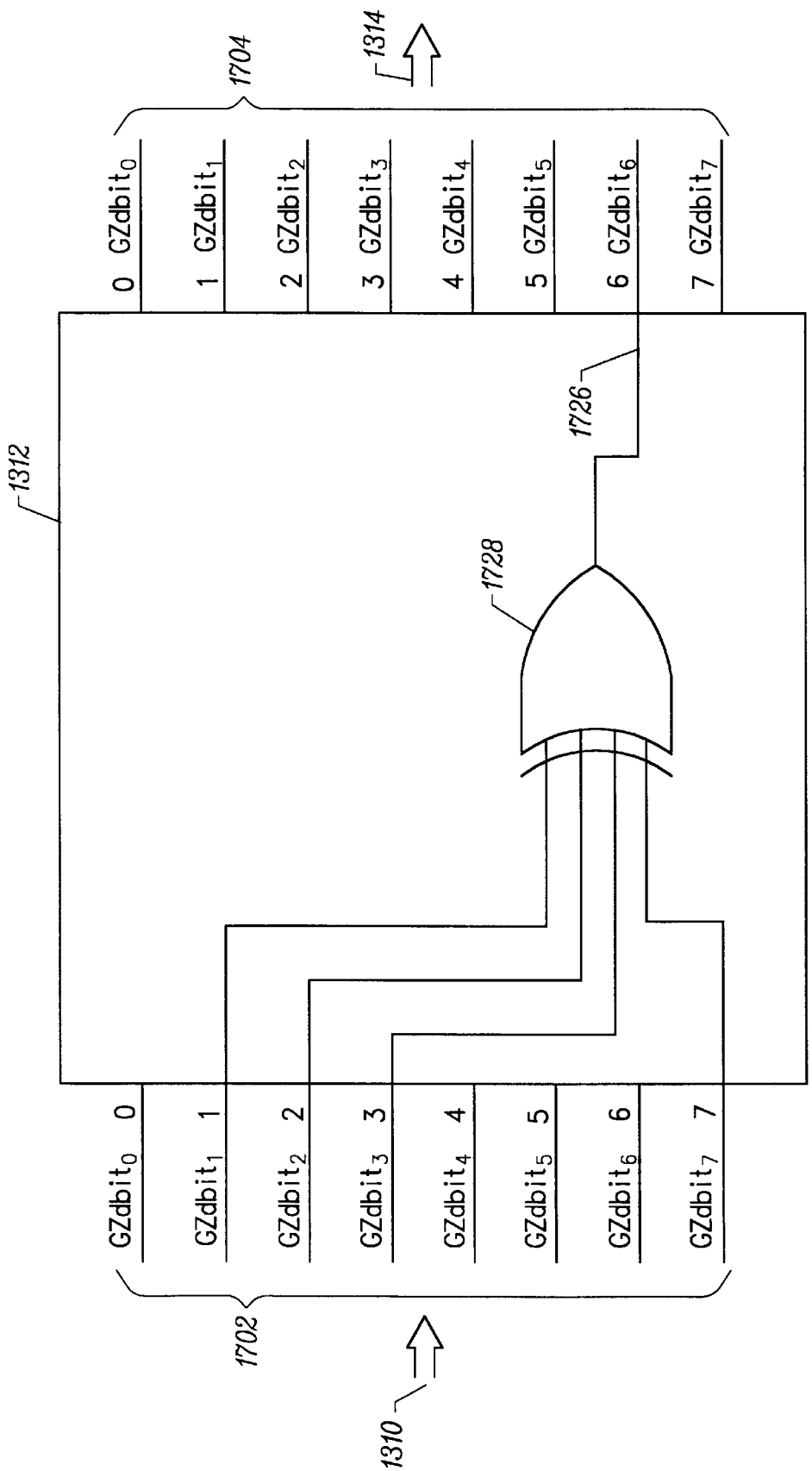
Figure 17G:
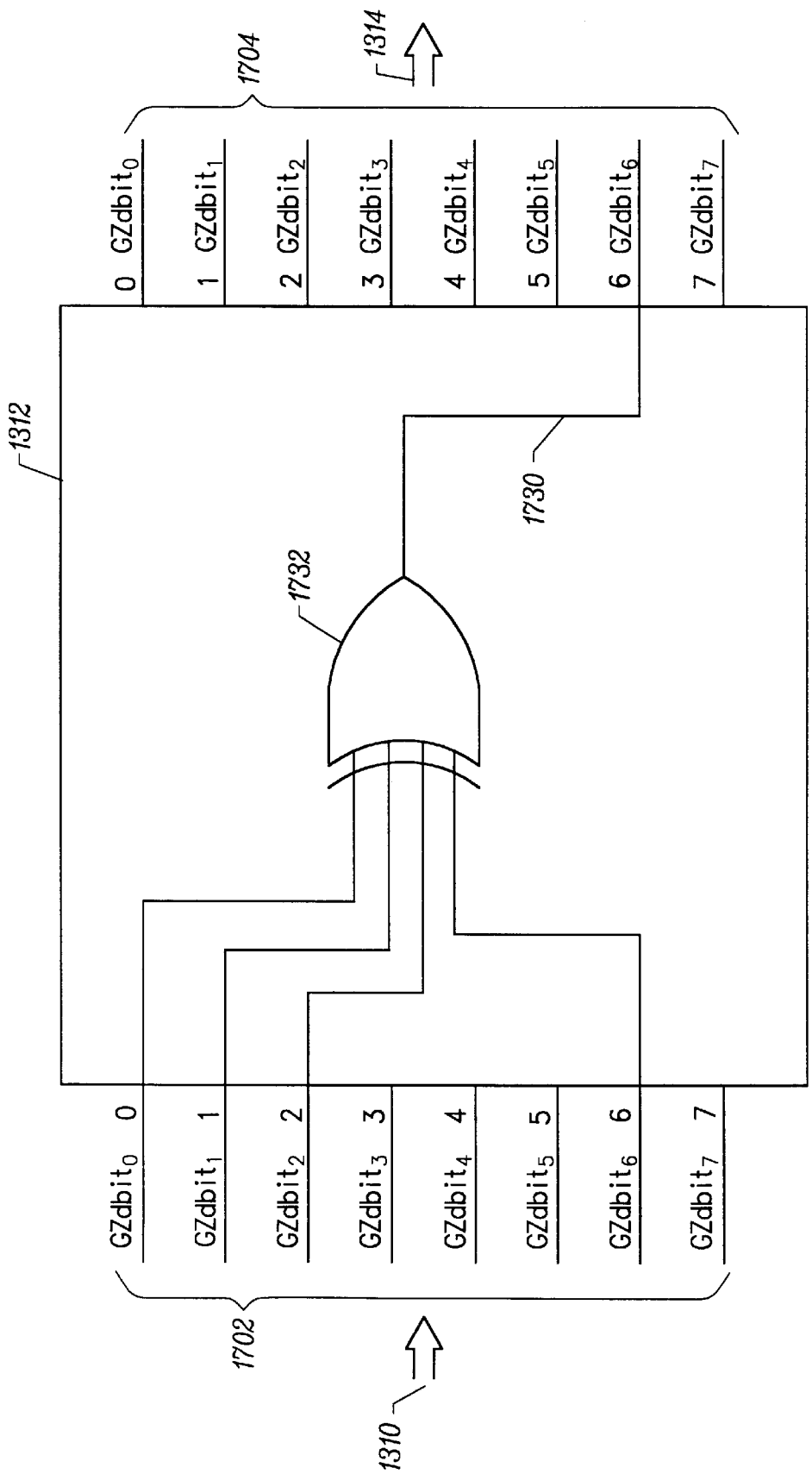

In the present embodiment, the dual to normal basis converter circuit 1312 implements all of the individual mappings in parallel. For example, in FIG. 17A, the path 1706, which includes the five input Exclusive OR 1708, implements the equation (39). In FIG. 17B, the path 1710, which includes the four input Exclusive OR 1712, implements the equation (40). In FIG. 17C, the path 1714, which includes the three input Exclusive OR 1716, implements the equation (41). In FIG. 17D, the path 1718, which includes the three input Exclusive OR 1720, implements the equation (42). In FIG. 17E the paths 1722 and 1724 implement the equations (43) and (44), respectively. In FIG. 17F, the path 1726, which includes the four input Exclusive OR 1728, implements the equation (45). In FIG. 17G, the path 1730, which includes the four input Exclusive OR 1732, implements the equation (46). Implementing these paths in parallel enables construction of a dual to normal basis converter circuit that has a maximum delay that corresponds to the delay of a five input Exclusive OR, such as Exclusive OR 1708, for example. Alternate embodiments of the invention could implement all of these paths 1706, 1710, 1714, 1718, 1722, 1724, 1726 and 1730 in series or could implement some of the paths in series and some of the paths in parallel. Implementing all of the paths in parallel, however, typically will provide the greatest speed. Embodiments of the invention could also implement the mappings using circuits that are logically equivalent to the illustrated circuits. For example, a five input Exclusive OR might be implemented as a plurality of Exclusive OR circuits or some other logically equivalent circuit.

The bits output on the outputs 1704 of FIGS. 17A–17G provide the word GZ which is the normal basis product GZ. While the Galois field multiplier has been disclosed in the context of a Reed-Solomon decoder, it is not limited to use in the context of a Reed-Solomon decoder. For example, it could be used in a Reed-Solomon encoder or in other applications that involve Galois field multiplication.

While Applicant has described the invention in terms of specific embodiments, the invention is not limited to or by the disclosed embodiments. The Applicant's invention may be applied beyond the particular systems mentioned as examples in this specification. Although a variety of circuits have been described in this specifications, embodiments of the invention need not use all of the circuits described herein. For example, even within the multiplier 1300, embodiments of the invention may use only one of the normal to dual basis converter, the multiplier circuit, the generator circuit, the vector multiplier circuit or the dual to normal basis converter.

What is claimed is:

1. An error transform calculator having a first mode of operation and a second mode of operation, wherein the error transform calculator comprises:

a syndrome input for receiving syndromes;

an error transform output;

a plurality of error transform processing circuits wherein each error transform processing circuit is coupled to the syndrome input, wherein at least one of the error transform processing circuits is coupled to the error transform output, wherein the error transform processing circuits are coupled together to form a series of error transform processing circuits and wherein the error transform processing circuits together are adapted to produce error transforms using coefficients of a standard error locator polynomial;

in each error transform processing circuit a multiplexor wherein the multiplexor has a plurality of multiplexor inputs, a control input and a multiplexor output, wherein the multiplexor is adapted to couple each of the multiplexor inputs to the multiplexor output, wherein the control input of the multiplexor controls which of the multiplexor inputs the multiplexor couples to the multiplexor output and wherein a first of the multiplexor inputs is coupled to the syndrome input such that an input syndrome present at the syndrome input will be applied to the first multiplexor input of the multiplexor of each error tranform processing circuit;

in each error transform processing circuit an input memory element wherein the input memory element has an input and wherein the input of the input memory element is coupled to the multiplexor output of the error transform processing circuit;

a control circuit coupled to the control input of each multiplexor wherein the control circuit is adapted to change the error transform calculator between the first mode of operation and the second mode of operation, wherein the control circuit is adapted to configure the plurality of multiplexors when the error transform calculator is in the first mode of operation such that in a selected one of the error transform processing circuits the first multiplexor input is coupled to the multiplexor output and such that in any error transform processing circuit succeeding the selected error transform processing circuit in the series of error transform processing circuits the first multiplexor input is isolated from the multiplexor output wherein the selected error transform processing circuit is selected with reference to a leading non-zero coefficient of the standard error locator polynomial.

2. The error transform calculator of claim 1, wherein each control input includes a first input and a second input and the control circuit comprises:

a shift control line coupled to the first input of the control input of each multiplexor wherein the shift control line is adapted to change the error transform calculator between the first mode of operation and the second mode of operation.

3. The error transform calculator of claim 2, wherein the plurality of error transform processing circuits include a first error transform processing circuit in the series and a last error transform processing circuit in the series and the control circuit further comprises:

a logic one input coupled to the second input of the control input of the multiplexor of the first error transform processing circuit;

a plurality of AND gates each having a first input, a second input and an AND gate output, wherein the plurality of AND gates are coupled together to form a series of AND gates by coupling each AND gate output to the first input of an immediately succeeding AND gate, wherein the AND gate outputs are also coupled each to the second control input of the multiplexor of one of the error transform processing circuits that succeed the first error transform processing circuit, wherein the logic one input is also coupled to the first input of a first AND gate in the series of AND gates.

4. The error transform calculator of claim 3, wherein an output of the input memory element in the last error transform processing circuit is coupled to the error transform output.

5. The error transform calculator of claim 3, wherein the control circuit further comprises:

a zero detector coupled to the second input of each AND gate wherein the zero detector is adapted to determine which of the coefficients of the standard error locator polynomial is zero and which of the coefficients of the standard error locator polynomial is non-zero and is adapted to provide a zero detector signal to the second input of each AND gate in response to the determination.

6. The error transform calculator of claim 5, wherein the zero detector signal provided to the second input of each AND gate has a first logic level when representing a zero coefficient and a second logic level when representing a non-zero coefficient.

7. The error transform calculator of claim 5, wherein the zero detector comprises:

a plurality of standard error memory elements wherein each standard error memory element stores one of the coefficients of the standard error locator polynomial;

a plurality of zero detector circuits wherein each zero detector circuit is coupled to one of the standard error memory elements, wherein each zero detector circuit is adapted to determine if the coefficient of the standard error locator polynomial stored in the standard error memory element to which the zero detector circuit is coupled is zero or non-zero, wherein an output of each zero detector circuit is coupled to the second input of one of the AND gates such that the zero detector is coupled to the second input of each of the AND gates and such that the zero detector signal can be provided to the second input of each AND gate.

8. The error transform calculator of claim 7, further comprising:

an additional AND gate in addition to the plurality of AND gates wherein the additional AND gate has a first input, a second input and an AND gate output and wherein the AND gate output of a last AND gate in the series of the plurality of AND gates is coupled to the first input of the additional AND gate;

an additional standard error memory element in addition to the plurality of standard error memory elements wherein the additional standard error memory element is included in the zero detector and wherein the additional standard error memory element stores one of the coefficients of the standard error locator polynomial;

an additional zero detector circuit in addition to the plurality of zero detector circuits wherein the additional zero detector circuit is included in the zero detector, wherein the additional zero detector circuit is coupled to the additional standard error memory element wherein the additional zero detector circuit is adapted to determine if the coefficient of the standard error locator polynomial stored in the additional standard error memory element is zero or non-zero and wherein an output of the additional zero detector circuit is coupled to the second input of the additional AND gate such that the zero detector is coupled to the additional AND gate and such that the zero detector provides a zero detector signal to the second input of the additional AND gate.

9. The error transform calculator of claim 1, further comprising:

a logic zero input wherein in the first error transform processing circuit in the series of error transform processing circuits a second of the multiplexor inputs is coupled to the logic zero input;

in each error transform processing circuit succeeding the first error transform processing circuit a second of the multiplexor inputs is coupled to an output of the input memory element of an immediately preceding error transform processing circuit in the series of error transform processing circuits; and wherein the control circuit is adapted to configure the multiplexors when the error transform calculator is in the first mode of operation such that for any error transform processing circuit succeeding the selected error transform processing circuit in the series of error transform processing circuits the second multiplexor input is coupled to the multiplexor output.

10. The error transform calculator of claim 1, wherein the error transform calculator includes a logic zero input and wherein at least one error transform processing circuit further comprises:

a standard error memory element that stores a coefficient of the standard error locator polynomial;

a multiplier having a first input coupled to an output of the input memory element in the at least one error transform processing circuit, the multiplier having a second input coupled to an output of the standard error memory element wherein an output of the multiplier provides a product of data provided to the first and second inputs of the multiplier from the input memory element and from the standard error memory element respectively;

a first adder having a first input, a second input and an output wherein the first input of the first adder is coupled to the output of the multiplier in the at least one error transform processing circuit and wherein a second input of the first adder is coupled to either of a zero input or an output of a second adder wherein the second adder is in an error transform processing circuit other than the at least one error transform processing circuit that includes the first adder; and in the at least one error transform processing circuit the output of the first adder is coupled to a third of the plurality of multiplexor inputs of the multiplexor.

11. The error transform calculator of claim 1, wherein the error transform calculator includes a logic zero input and wherein each error transform processing circuit further comprises:

in each error transform processing circuit a standard error memory element that stores a coefficient of the standard error locator polynomial;

in each error transform processing circuit a multiplier having a first input coupled to an output of the input memory element, the multiplier having a second input coupled to an output of the standard error memory element wherein an output of the multiplier provides a product of data provided to the first and second inputs of the multiplier from the input memory element and from the standard error memory element respectively;

in each error transform processing circuit a first adder having a first input, a second input and an output wherein the first input of the first adder is coupled to the output of the multiplier and wherein a second input of the first adder is coupled to either of a zero input or an output of a second adder wherein the second adder is in another error transform processing circuit; and in each error transform processing circuit the output of the first adder is coupled to a third of the plurality of multiplexor inputs of the multiplexor.

12. The error transform calculator of claim 11 wherein the control circuit is adapted to configure the multiplexors when the error transform calculator is in the second mode of operation such that in the selected error transform processing circuit the third information input of the multiplexor is coupled to the output of the multiplexor and such that in any error transform processing circuit succeeding the selected error transform processing circuit in the series of error transform processing circuits the third information input is isolated from the output of the multiplexor.

13. The error transform calculator of claim 12, wherein each control input includes a first input and a second input and the control circuit comprises:

a shift control line coupled to the first input of the control input of each multiplexor wherein the shift control line is adapted to change the error transform calculator between the first mode of operation and the second mode of operation.

14. The error transform calculator of claim 13, wherein the plurality of error transform processing circuits include a first processing circuit in the series of error transform processing circuits and a last processing circuit in the series of error transform processing circuits and the control circuit further comprises:

a logic one input coupled to the second input of the control input of the multiplexor of the first error transform processing circuit;

a plurality of AND gates each having a first input, a second input and an AND gate output, wherein the plurality of AND gates are coupled together to form a series of AND gates by coupling each AND gate output to the first input of an immediately succeeding AND gate in the series of AND gates, wherein the AND gate outputs are also coupled each to the second control input of the multiplexor of one of the error transform processing circuits that succeed the first error transform processing circuit in the series of error transform processing circuits, wherein the logic one input is also coupled to the first input of a first AND gate in the series of AND gates.

15. The error transform calculator of claim 14, wherein the control circuit further comprises:

a zero detector coupled to the second input of each of the plurality of AND gate wherein the zero detector is adapted to determine which of the coefficients of the standard error locator polynomial is zero and which of the coefficients of the standard error locator polynomial is non-zero and wherein the zero detector is adapted to provide a zero detector signal to the second input of each AND gate in response to the determination.

16. The error transform calculator of claim 15, wherein the zero detector comprises:

a plurality of standard error memory elements wherein each standard error memory element stores a coefficient of the standard error locator polynomial;

a plurality of zero detector circuits wherein each zero detector circuit is coupled to one of the standard error memory elements, wherein each zero detector circuit is adapted to determine if the coefficient of the standard error locator polynomial stored in the standard error memory element to which the zero detector circuit is coupled is zero or non-zero and wherein an output of each zero detector circuit is coupled to the second input of one of the AND gates such that the zero detector is coupled to the second input of each of the AND gates and such that the zero detector signal can be provided to the second input of each AND gate.

17. The error transform calculator of claim 14, further comprising:
a second logic zero input wherein a second of the multiplexor inputs of the first error transform processing circuit is coupled to the second logic zero input;
a second of the multiplexor inputs of each error transform processing circuit succeeding the first error transform processing circuit in the series of error transform processing circuits is coupled to the output of the input memory element in an immediately preceding error transform processing circuit; and
wherein the control circuit is adapted to configure the multiplexors when the error transform calculator is in the first mode of operation such that in any error transform processing circuit succeeding in the series of error transform processing circuits the selected error transform processing circuit, the second multiplexor input is coupled to the multiplexor output.

18. The error transform calculator of claim 1, further comprising:
a plurality of error transform cells wherein the plurality of error transform cells each include one of the plurality of error transform processing circuits, wherein the error transform calculator is adapted for use in an error correction decoder designed to detect "t" number of errors and the plurality of error transform cells include "t" number of cells.

19. The error transform calculator of claim 3, further comprising:
a plurality of error transform cells wherein the plurality of error transform cells each include one of the plurality of error transform processing circuits, wherein each of the plurality of AND gates is included in one of the error transform cells, wherein the error transform calculator is adapted for use in an error correction decoder designed to detect "t" number of errors and the plurality of error transform cells include "t" number of cells.

20. The error transform calculator of claim 7, further comprising:
a plurality of error transform cells wherein the plurality of error transform cells each include one of the plurality of error transform processing circuits, wherein each of the plurality of AND gates is included in one of the error transform cells, wherein each of the plurality of zero detector circuits is included in the error transform cell that includes the AND gate to which the zero detector circuit is coupled, wherein each of the standard error memory elements is included in the error transform cell that includes the zero detector circuit to which the standard error memory element is coupled and wherein the error transform calculator is adapted for use in an error correction decoder designed to detect "t" number of errors and the plurality of error transform cells include "t" number of cells.

21. The error transform calculator of claim 8, further comprising:
a plurality of error transform cells wherein the plurality of error transform cells each include one of the plurality of error transform processing circuits, wherein each of the plurality of AND gates is included in one of the error transform cells, wherein each of the plurality of zero detector circuits is included in the error transform cell that includes the AND gate to which the zero detector circuit is coupled, wherein each of the plurality of standard error memory elements is included in the error transform cell that includes the zero detector circuit to which the standard error memory element is coupled and wherein the error transform calculator is adapted for use in an error correction decoder designed to detect "t" number of errors and the plurality of error transform cells include "t" number of cells;
wherein the plurality of error transform cells includes a last error transform cell and wherein the last error transform cell includes a last error transform processing circuit in the series of error transform processing circuits, the additional AND gate, the additional zero detector circuit and the additional standard error memory element.

22. The error transform calculator of claim 1, further comprising:
a plurality of circuit elements included in at least one error transform processing circuits; and
a plurality of error transform cells;
wherein at least one of the plurality of circuit elements in the at least one error transform processing circuit is included in a first of the plurality of error transform cells and wherein at least one of the plurality of circuit elements in the at least one error transform processing circuit is included in a second of the plurality of error transform cells, wherein the error transform calculator is adapted for use in an error correction decoder designed to detect "t" number of errors and the plurality of error transform cells include "t" number of cells.

23. The error transform calculator of claim 22, wherein all of the components of the at least one error transform processing circuit except a standard error memory element are included in the first error transform processing cell and wherein the standard error memory element is included in the second error transform processing cell.

24. An error transform calculator having a first mode of operation and a second mode of operation, wherein the error transform calculator comprises:
a syndrome input;
an error transform output;
a plurality of error transform processing circuits wherein each error transform processing circuit includes a transform memory element, wherein each error transform processing circuit is coupled to the syndrome input, wherein at least one of the error transform processing circuits is coupled to the error transform output, wherein the error transform processing circuits are coupled together in series such that the transform memory elements are adapted to form a shift path from the syndrome input to the error transform output and wherein the error transform processing circuits together are adapted to produce error transforms using coefficients of a standard error locator polynomial;
a control circuit coupled to the error transform processing circuits wherein the control circuit is adapted to change the error transform calculator between the first mode of operation and the second mode of operation, wherein the control circuit is adapted to configure the error transform processing circuits when the error transform calculator is in the first mode of operation such that the shift path is formed from a selected one of the error transform processing circuits to the error transform output, such that the selected error transform processing circuit couples the syndrome input to the shift path, such that in any error transform processing circuit that precedes and in any error transform processing circuit that succeeds the selected error transform processing circuit the syndrome input is isolated from the shift path and wherein the selected error transform processing circuit is selected with reference to a leading non-zero coefficient of the standard error locator polynomial.

25. The error transform calculator of claim 24, wherein the control circuit comprises:
    a control line coupled to the error transform processing circuits wherein the control line is adapted to configure the error transform processing circuits to change the error transform calculator between the first mode of operation and the second mode of operation.

26. The error transform calculator of claim 25, wherein the control circuit further comprises:
    a plurality of AND gates each having an output wherein the output of each AND gate is coupled to at least one of the error transform processing circuits, wherein the plurality of AND gates include a selection AND gate and wherein the selection AND gate output is coupled to error transform processing circuits succeeding in the series of error transform processing circuits the selected error transform processing circuit; and
    when the error transform calculator is in either of the first mode of operation or the second mode of operation the selection AND gate is adapted to configure error transform processing circuits succeeding the selected error transform processing circuit to form the shift path.

27. The error transform calculator of claim 26, wherein the selection AND gate is coupled directly to the error transform processing circuit immediately succeeding the selected error transform processing circuit and the selection AND gate is coupled through AND gates that are included in the plurality of AND gates to error transform processing circuits succeeding the error transform processing circuit that immediately succeeds the selected error transform processing circuit.

28. The error transform calculator of claim 26, wherein the error transform calculator further comprises:
    a feedback input in the selected error transform processing circuit;
    when the error transform calculator is in the first mode of operation the control line is adapted to configure the selected error transform processing circuit to couple the syndrome input to the shift path; and
    when the error transform calculator is in the second mode of operation the control line is adapted to configure the selected error transform processing circuit to couple the feedback input to the shift path.

29. The error transform calculator of claim 26, wherein the control circuit further comprises:
    a zero detector coupled to each AND gate wherein the zero detector provides an input to each AND gate, wherein each input from the zero detector has a first logic level if an associated coefficient of the standard error locator polynomial is zero and has a second logic level if an associated coefficient of the standard error locator polynomial is non-zero.

30. The error transform calculator of claim 29, wherein the zero detector comprises:
    a plurality of standard error memory elements wherein each standard error memory element stores a coefficient of the standard error locator polynomial; and
    a plurality of zero detector circuits wherein each zero detector circuit is coupled to one of the plurality of standard error memory elements to determine if the coefficient of the standard error locator polynomial stored in the standard error memory element is zero or non-zero and wherein an output of each zero detector circuit is coupled to one of the AND gates such that the zero detector is coupled to each AND gate and such that the input is provided to each AND gate.

31. The error transform calculator of claim 24, wherein the control circuit comprises:
    a plurality of AND gates wherein each AND gate is coupled to one of the error transform processing circuits, wherein the plurality of AND gates are adapted to configure the plurality of error transform processing circuits such that at least one of the transform memory elements of the error transform processing circuits provides the shift path from the syndrome input to the error transform output.

32. The error transform calculator of claim 25, wherein the selected error transform processing circuit comprises:
    a feedback input;
    a standard error memory element;
    a multiplier having a first input coupled to the transform memory element of the selected error transform processing circuit, the multiplier having a second input coupled to the standard error memory element and the multiplier having an output wherein the transform memory element in the selected error transform processing circuit is adapted to store an error transform and to provide the error transform to the first input of the multiplier, wherein the standard error memory element is adapted store a coefficient of the standard error locator polynomial and to provide the stored coefficient of the standard error locator polynomial to the second input of the multiplier, wherein the multiplier is adapted to provide at the output of the multiplier a product of the error transform and the coefficient of the standard error locator polynomial;
    a first input of an adder coupled to the output of the multiplier and a second input of the adder coupled to one of a zero input and an output of an adder in an immediately succeeding error transform processing circuit; and
    an output of the adder coupled to the feedback input.

33. The error transform calculator of claim 32, further comprising:
    a plurality of AND gates each having an output wherein the output of each AND gate is coupled to at least one of the error transform processing circuits, wherein the plurality of AND gates include a selection AND gate and wherein the output of the selection AND gate is coupled to error transform processing circuits succeeding in the series of error transform processing circuits the selected error transform processing circuit; and
    when the error transform calculator is in either of the first mode of operation or the second mode of operation, the selection AND gate is adapted to configure error transform processing circuits succeeding in the series of error transform processing circuits the selected error transform processing circuit to form the shift path.

34. The error transform calculator of claim 33, wherein:
    when the error transform calculator is in the first mode of operation the control line is adapted to configure the selected error transform processing circuit to couple the syndrome input to the shift path; and
    when the error transform calculator is in the second mode of operation the control line is adapted to configure the selected error transform processing circuit to couple the feedback input to the shift path.

* * * * *